(12) United States Patent
Kodira Cariappa et al.

(10) Patent No.: US 12,491,510 B2
(45) Date of Patent: Dec. 9, 2025

(54) FLOW CELLS AND METHODS FOR MAKING THE SAME

(71) Applicant: ILLUMINA, INC., San Diego, CA (US)

(72) Inventors: Brinda Kodira Cariappa, San Diego, CA (US); Wayne N. George, Ilford (GB); Sahngki Hong, San Diego, CA (US); Lewis J. Kraft, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 746 days.

(21) Appl. No.: 17/825,945

(22) Filed: May 26, 2022

(65) Prior Publication Data
US 2022/0379305 A1  Dec. 1, 2022

Related U.S. Application Data

(60) Provisional application No. 63/195,124, filed on May 31, 2021.

(51) Int. Cl.
| | |
|---|---|
| *B01L 3/00* | (2006.01) |
| *C23C 14/14* | (2006.01) |
| *G03F 7/038* | (2006.01) |
| *G03F 7/039* | (2006.01) |
| *G03F 7/11* | (2006.01) |

(52) U.S. Cl.
CPC ... *B01L 3/502707* (2013.01); *B01L 3/502746* (2013.01); *G03F 7/038* (2013.01); *G03F 7/039* (2013.01); *G03F 7/11* (2013.01); *B01L 2200/12* (2013.01); *C23C 14/14* (2013.01)

(58) Field of Classification Search
CPC .... B01L 3/502707; G03F 7/11; G03F 7/0037; G03F 7/2014; G03F 7/0035
See application file for complete search history.

(56) References Cited

U.S. PATENT DOCUMENTS

| | | | |
|---|---|---|---|
| 9,982,294 B2 | 5/2018 | Fabani et al. | |
| 2008/0299495 A1* | 12/2008 | Xi | G03F 7/20 430/314 |

(Continued)

FOREIGN PATENT DOCUMENTS

| | | | |
|---|---|---|---|
| WO | 2017201198 A1 | 11/2017 | |
| WO | WO-2020005503 A1 * | 1/2020 | ......... B01J 19/0046 |

*Primary Examiner* — Jonathan Johnson
*Assistant Examiner* — Alexander N. Lee
(74) *Attorney, Agent, or Firm* — Dieker & Kavanaugh, P.C.

(57) ABSTRACT

In an example of a method for making a flow cell, a metal material is sputtered over a transparent substrate including depressions separated by interstitial regions to form a metal film having a first thickness over the interstitial regions and having a second thickness over the depressions, the second thickness being about 30 nm or less and being at least ⅓ times smaller than the first thickness. A light sensitive material is deposited over the metal film; and the metal film is used to develop the light sensitive material through the transparent substrate to define an altered light sensitive material at a first predetermined region over the transparent substrate. The altered light sensitive material is utilized to generate a functionalized layer at the first predetermined region or at a second predetermined region over the transparent substrate.

20 Claims, 18 Drawing Sheets

Specification includes a Sequence Listing.

(56) References Cited

U.S. PATENT DOCUMENTS

| | | |
|---|---|---|
| 2015/0111256 A1 | 4/2015 | Church et al. |
| 2016/0062239 A1* | 3/2016 | Morgan .................... G03F 7/11 430/322 |
| 2018/0030529 A1 | 2/2018 | Nashtaali et al. |
| 2018/0371535 A1 | 12/2018 | Park et al. |

* cited by examiner

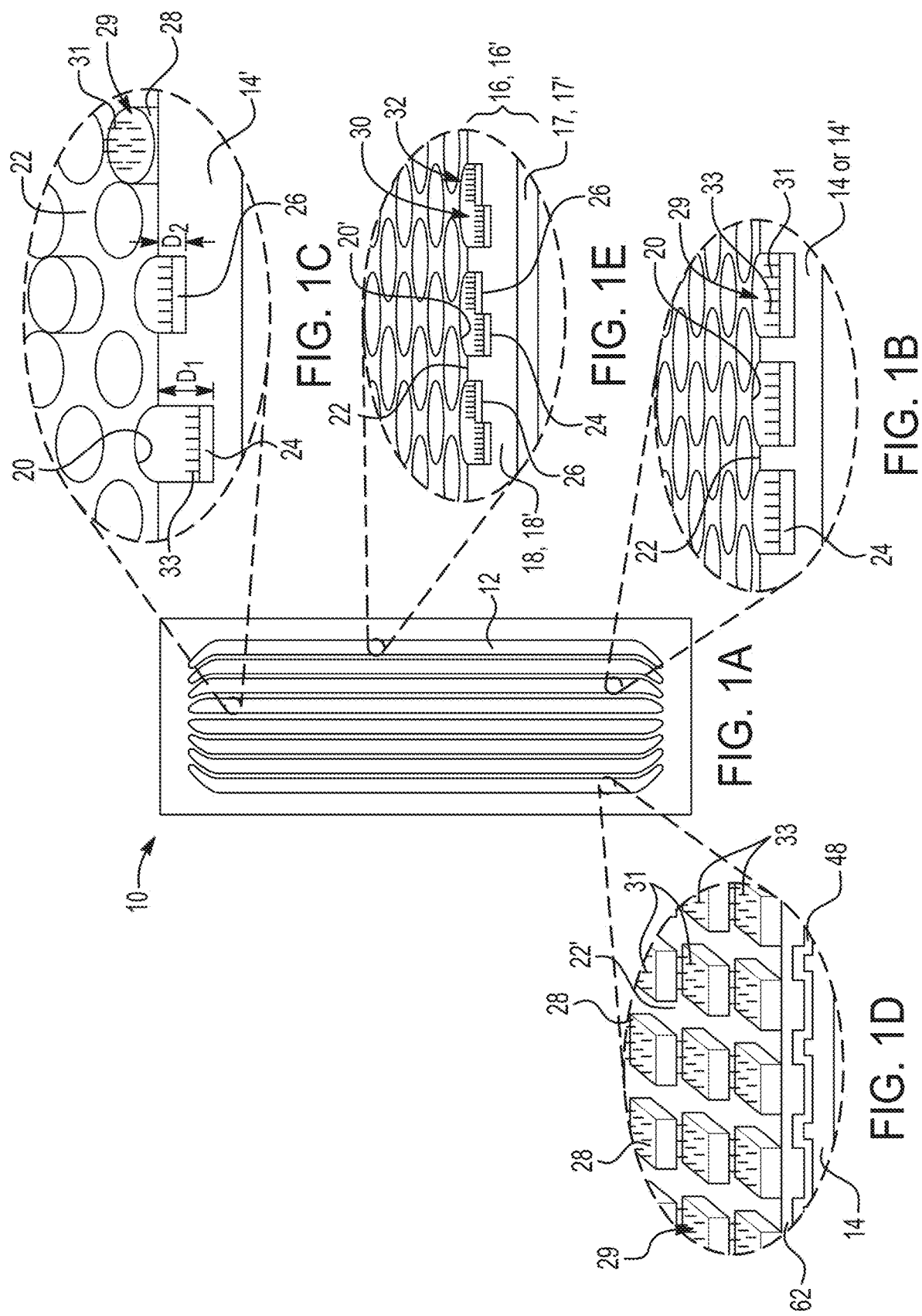

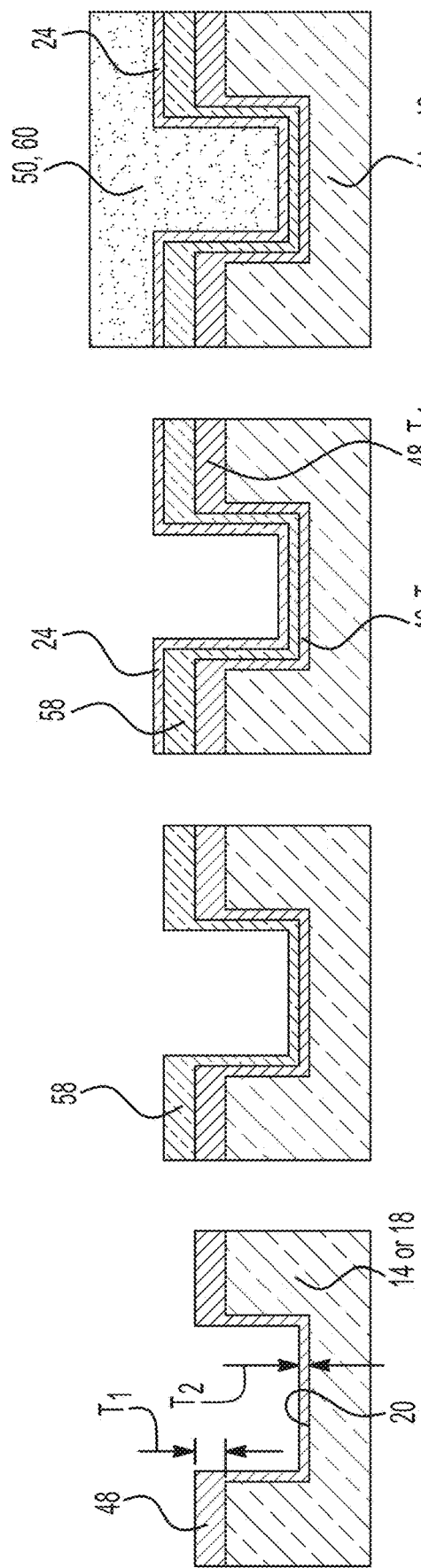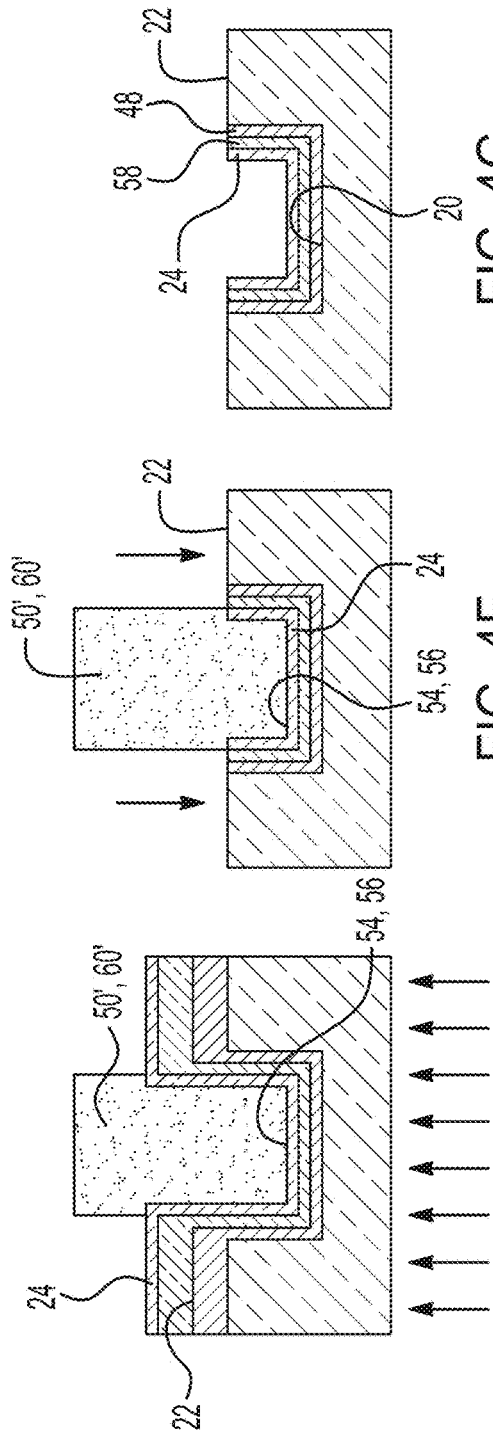

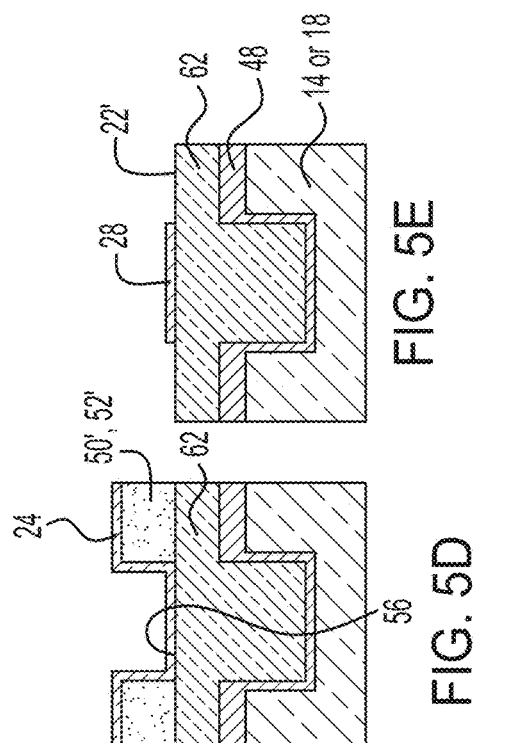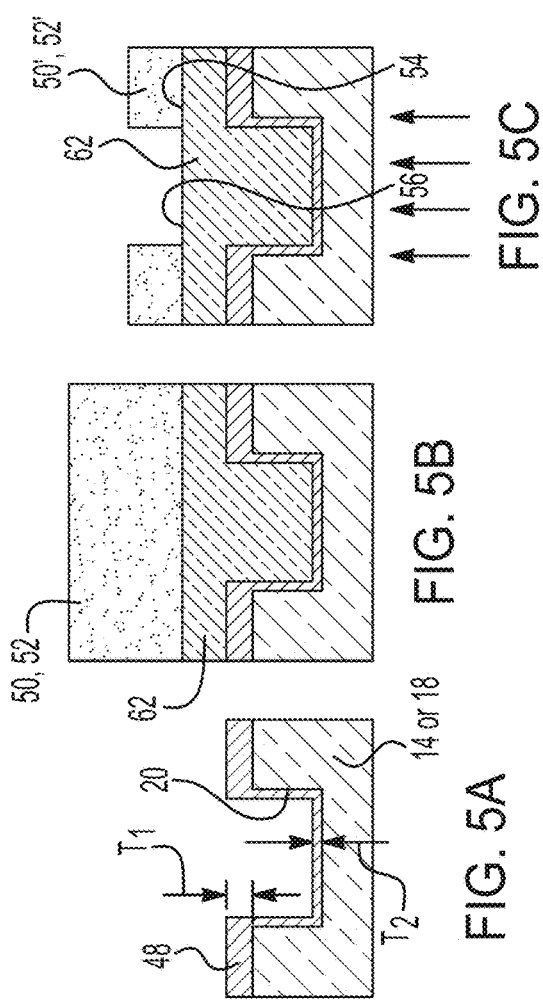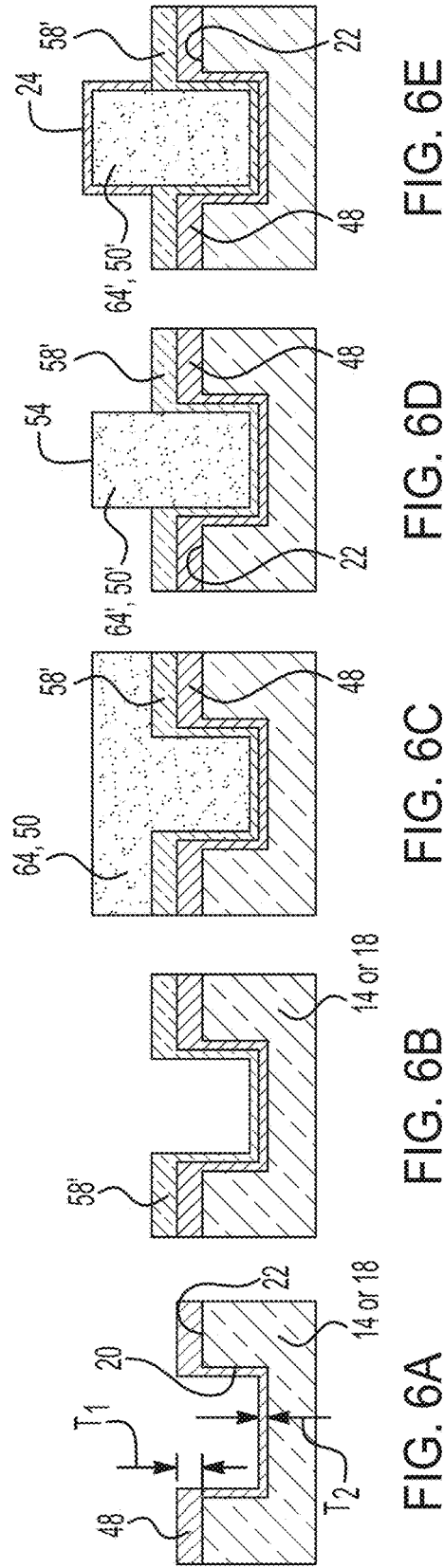

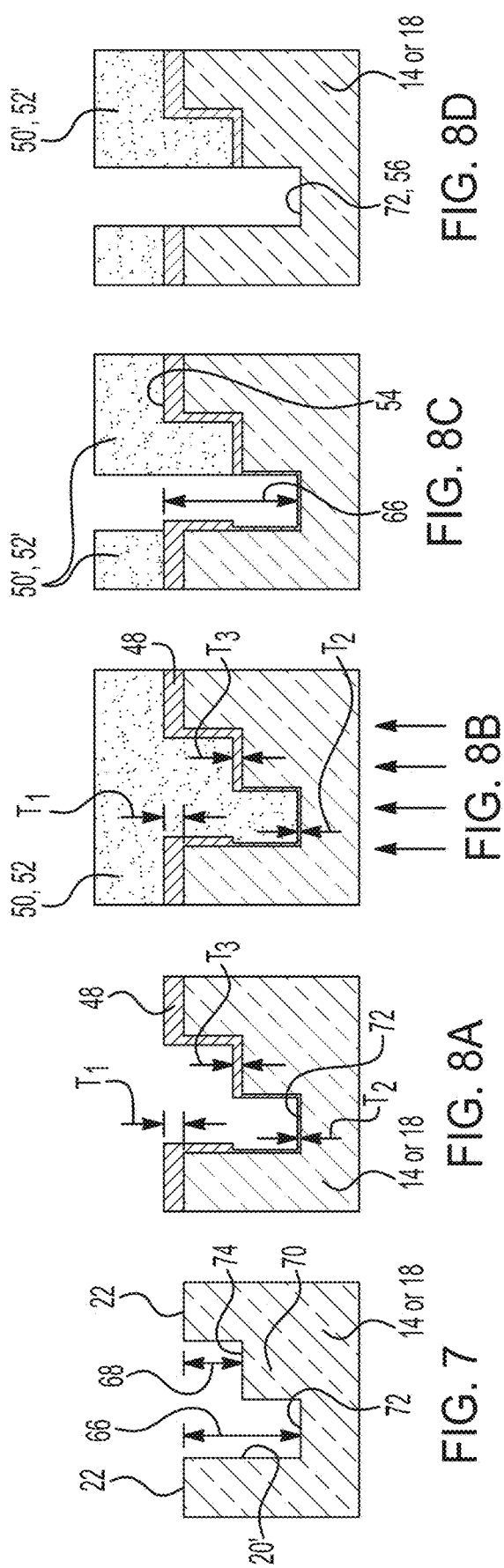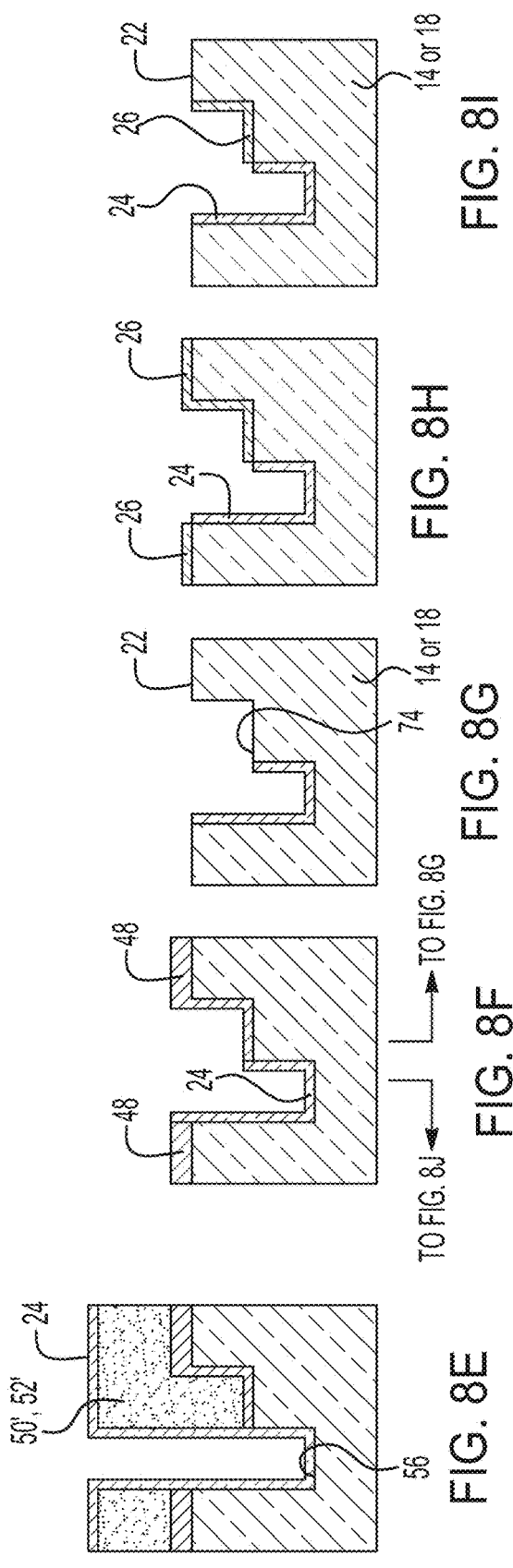

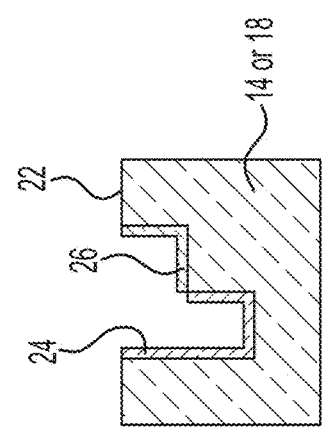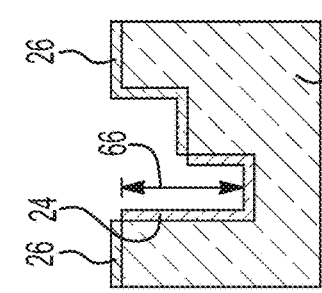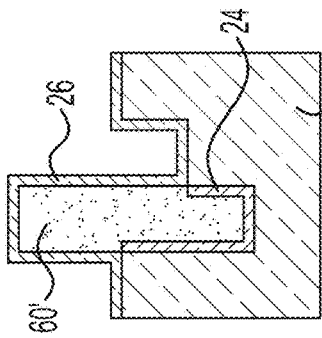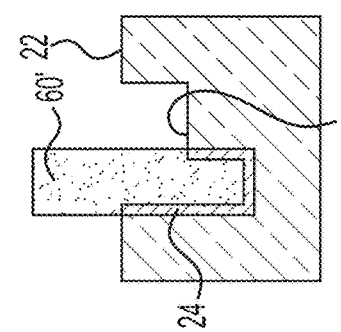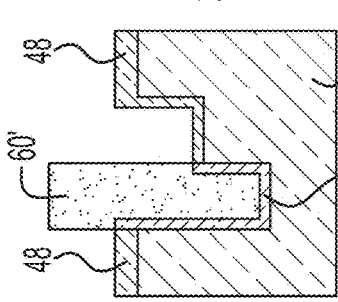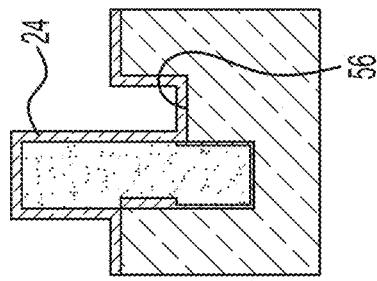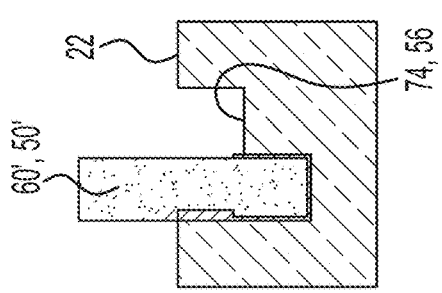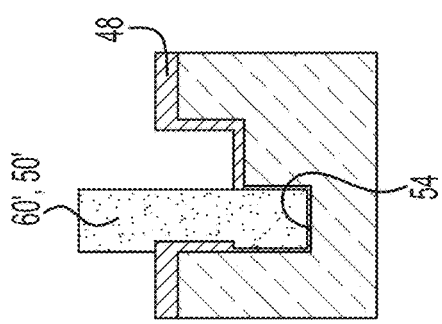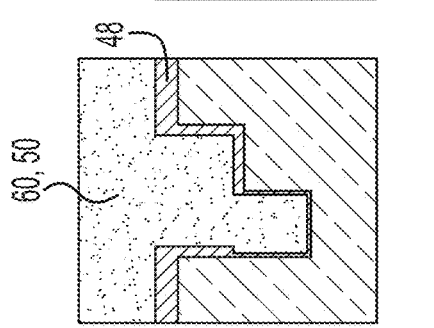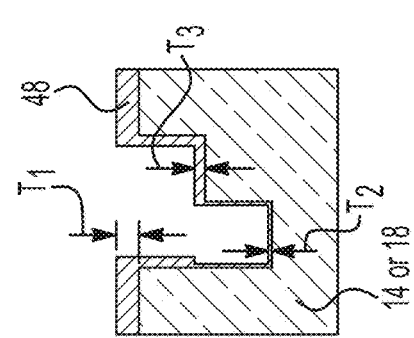

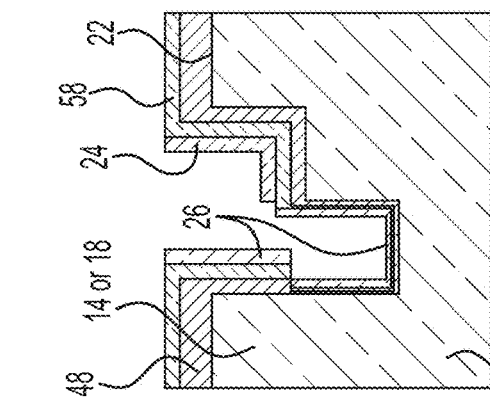
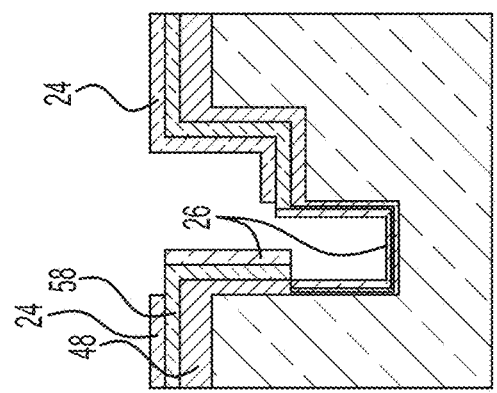
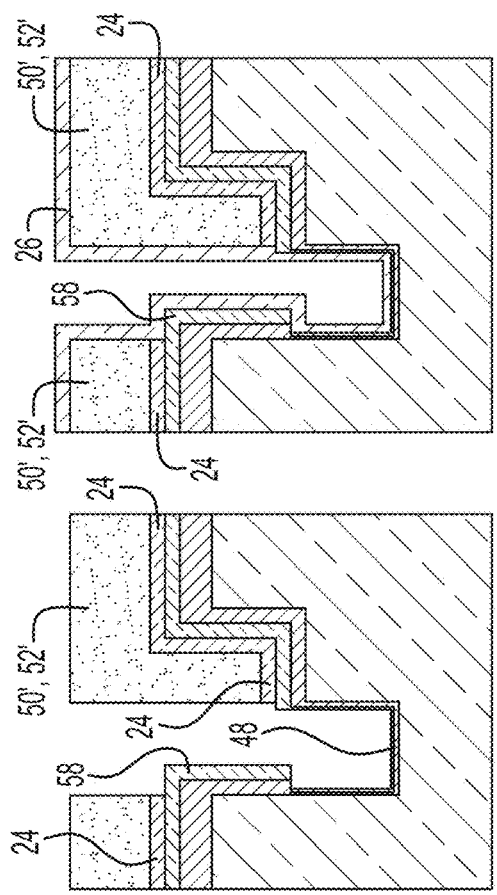
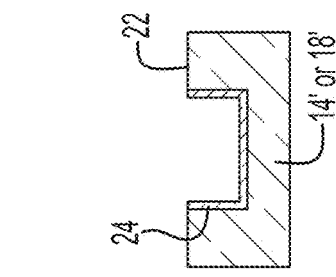
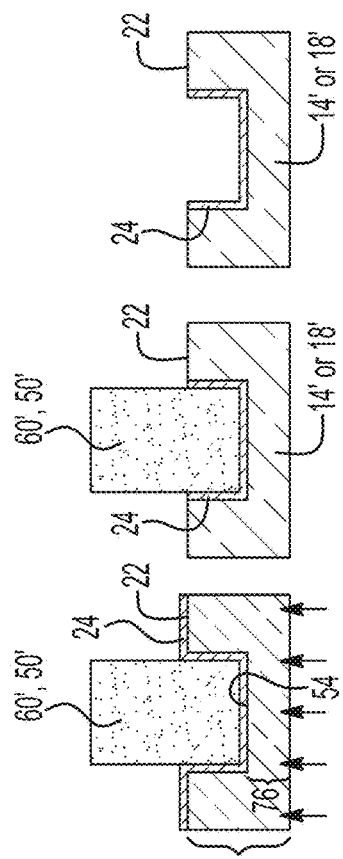

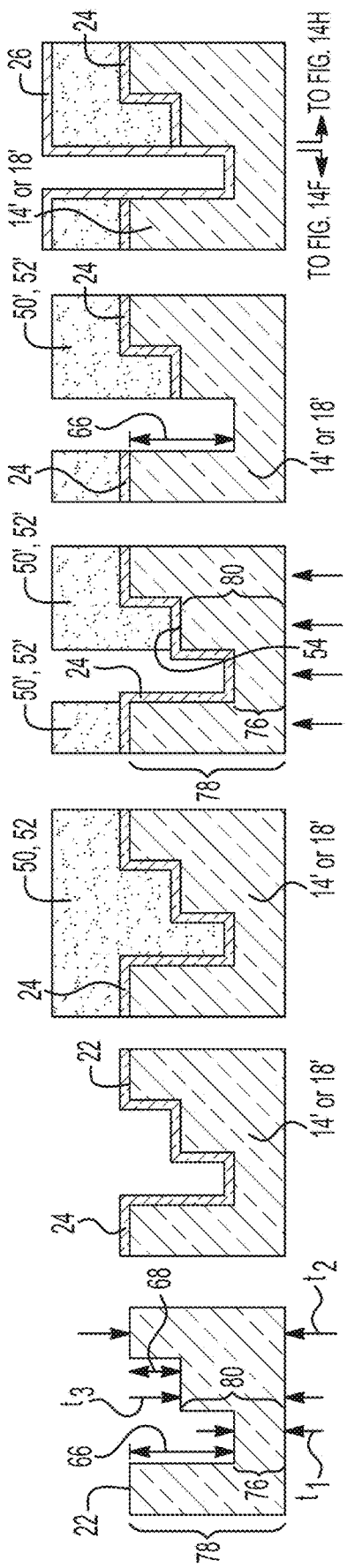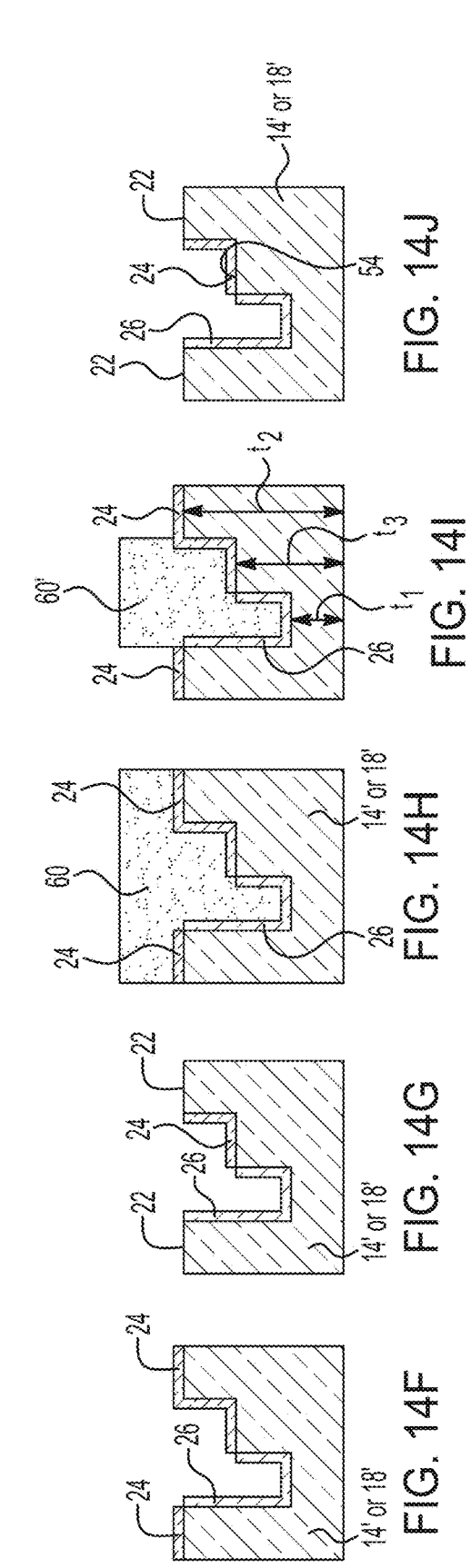

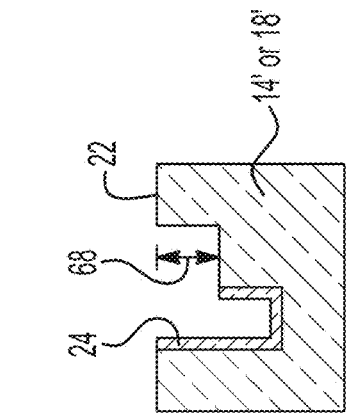
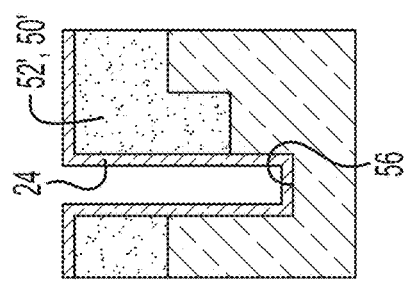
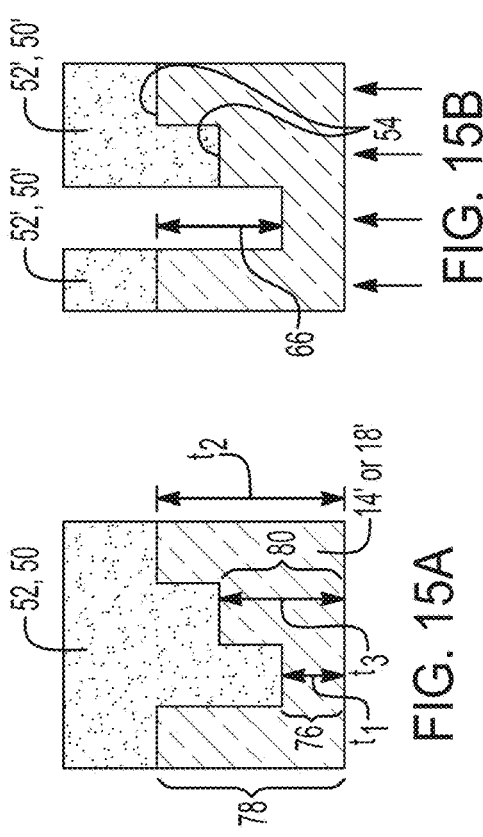
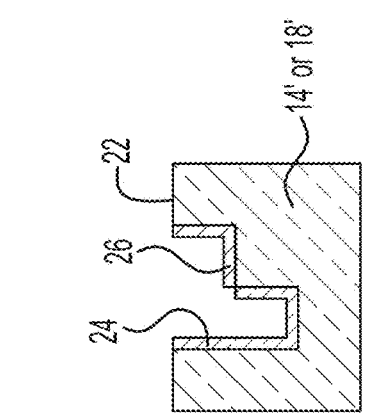
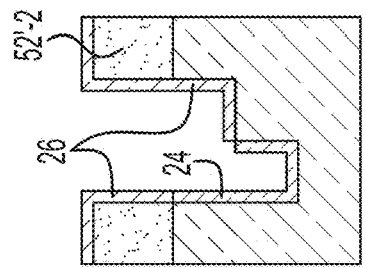
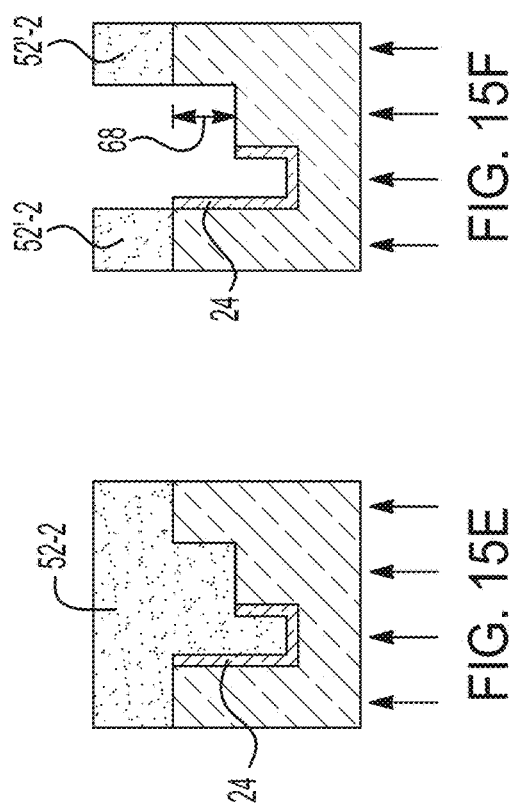

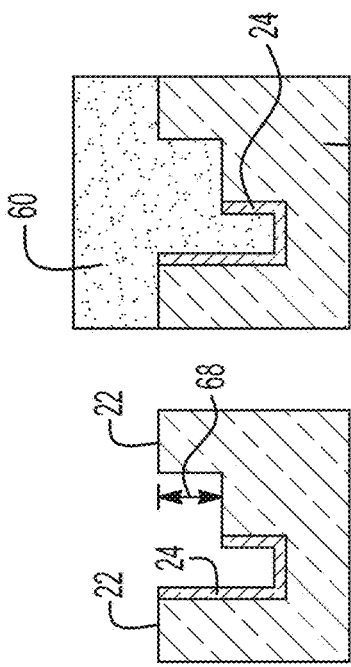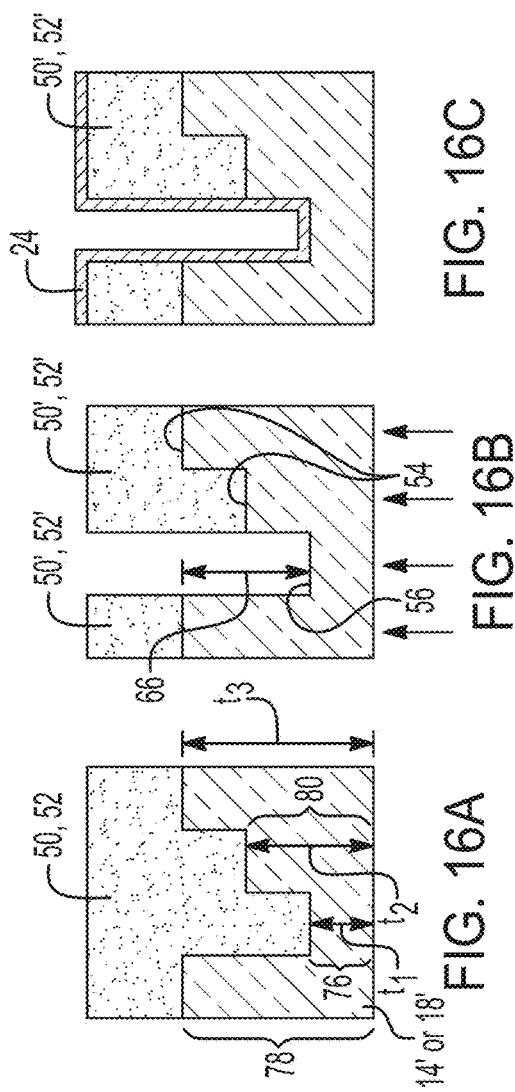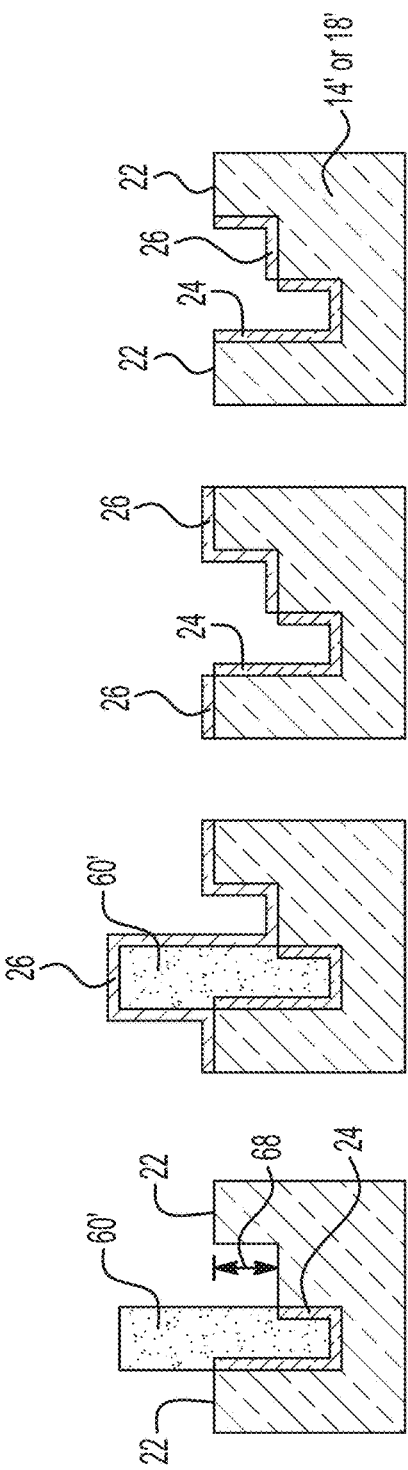

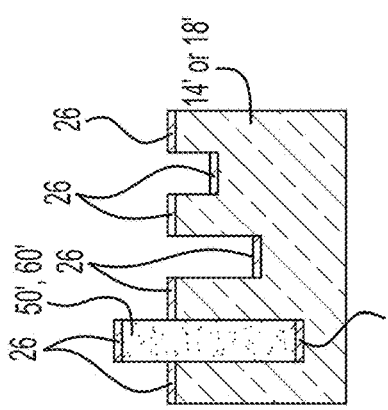
FIG. 17A
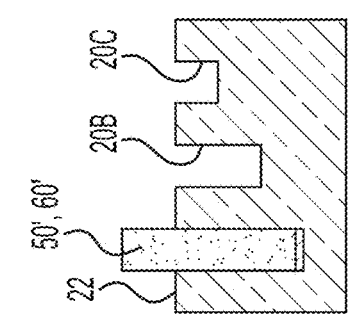
FIG. 17B
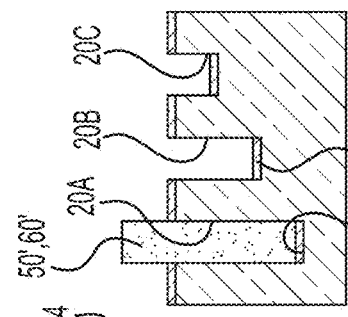
FIG. 17C
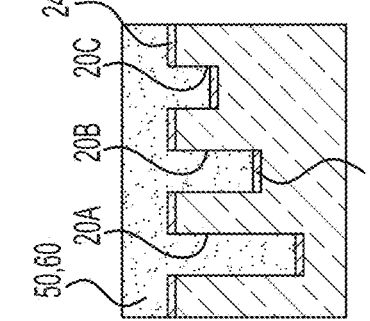
FIG. 17D
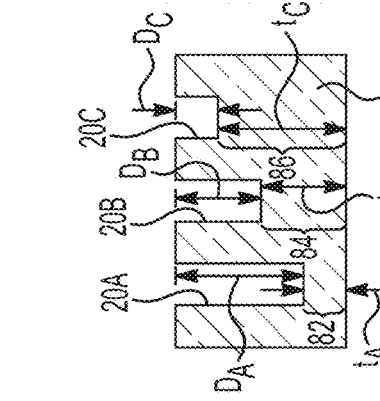
FIG. 17E
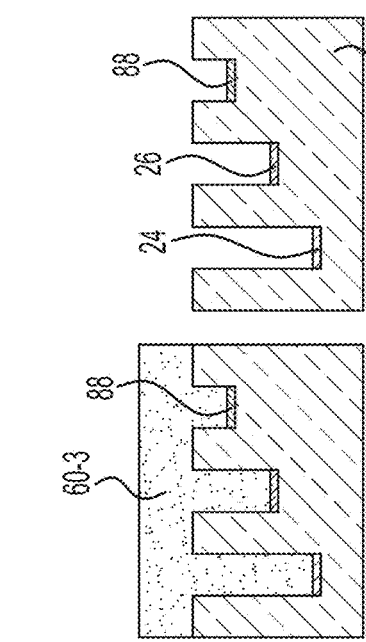
FIG. 17F
FIG. 17G
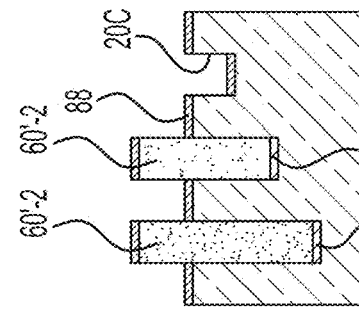
FIG. 17H
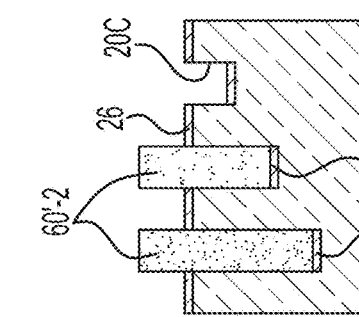
FIG. 17I
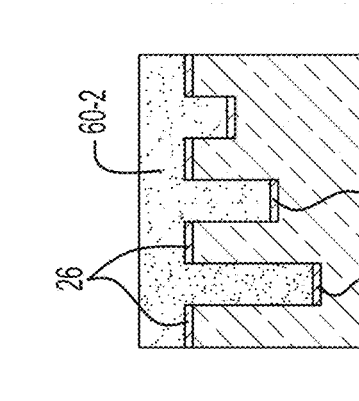
FIG. 17J

FLOW CELLS AND METHODS FOR MAKING THE SAME

CROSS REFERENCE TO RELATED APPLICATION

This application claims the benefit of U.S. Provisional Application Ser. No. 63/195,124, filed May 31, 2021, the contents of which is incorporated by reference herein in its entirety.

REFERENCE TO SEQUENCE LISTING

The Sequence Listing submitted herewith via EFS-Web is hereby incorporated by reference in its entirety. The name of the file is ILI218B_IP-2152-US_Sequence_Listing_ST25.txt, the size of the file is 3,057 bytes, and the date of creation of the file is May 25, 2022.

BACKGROUND

Some available platforms for sequencing nucleic acids utilize a sequencing-by-synthesis approach. With this approach, a nascent strand is synthesized, and the addition of each monomer (e.g., nucleotide) to the growing strand is detected optically and/or electronically. Because a template strand directs synthesis of the nascent strand, one can infer the sequence of the template DNA from the series of nucleotide monomers that were added to the growing strand during the synthesis. In some examples, sequential paired-end sequencing may be used, where forward strands are sequenced and removed, and then reverse strands are constructed and sequenced. In other examples, simultaneous paired-end sequencing may be used, where forward strands and reverse strands are sequenced at the same time.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 1A is a top view of an example flow cell;

FIG. 1B through FIG. 1E are enlarged, and partially cutaway views of different examples of a flow channel of the flow cell;

FIG. 4A through FIG. 4G are schematic views that together illustrate another example of the method using a sputtered or thermally evaporated metal film to create a mask that is used to pattern another example of the flow cell architecture including the depression;

FIG. 5A through FIG. 5E are schematic views that together illustrate yet another example of the method using a sputtered or thermally evaporated metal film to create a mask that is used to pattern yet another example of the flow cell architecture including the depression;

FIG. 6A through FIG. 6E are schematic views that together illustrate still another example of the method using a sputtered or thermally evaporated metal film to create a mask that is used to pattern still another example of the flow cell architecture including the depression;

FIG. 7 is a schematic view of a transparent substrate including an example of a multi-depth depression;

FIG. 8A through FIG. 8N are schematic views that together illustrate two examples of the method using a sputtered or thermally evaporated metal film to create a mask that is used to pattern an example of a flow cell architecture including the multi-depth depression;

FIG. 9A through FIG. 9I are schematic views that together illustrate another example method using a sputtered or thermally evaporated metal film to create a mask that is used to pattern another example of the flow cell architecture including the multi-depth depression;

FIG. 11A through FIG. 11H are schematic views that together illustrate another example of the method using a sputtered or thermally evaporated metal film to create a mask that is used to pattern yet another example of the flow cell architecture including the multi-depth depression;

FIG. 12A through FIG. 12F are schematic views that together illustrate an example of a method using varying thicknesses of a resin layer to pattern one example of a flow cell architecture including a depression;

FIG. 13 is a schematic view of a resin layer including an example of a multi-depth depression;

FIG. 14A through FIG. 14J are schematic views that together illustrate two examples of a method using varying thicknesses of a resin layer to pattern an example of a flow cell architecture including the multi-depth depression;

FIG. 15A through FIG. 15H are schematic views that together illustrate still another example of a method using varying thicknesses of a resin layer to pattern still another example of a flow cell architecture including the multi-depth depression;

FIG. 16A through FIG. 16I are schematic views that together illustrate yet another example of a method using varying thicknesses of a resin layer to pattern an example of a flow cell architecture including the multi-depth depression;

FIG. 17A through FIG. 17J are schematic views that together illustrate another example of a method using varying thicknesses of a resin layer to pattern an example of a flow cell architecture including subsets of depressions having different depths;

DETAILED DESCRIPTION

Figure 2A:
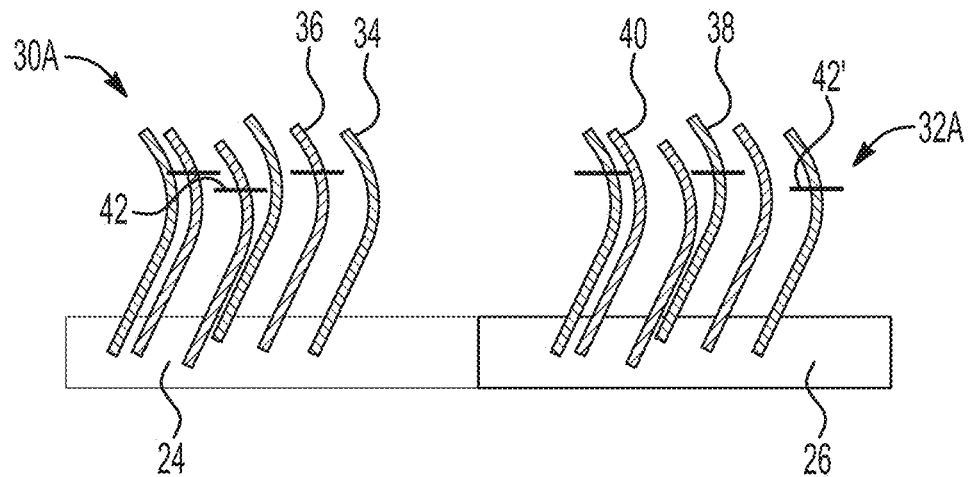
FIG. 2A through FIG. 2D are schematic views of different examples of primer sets that are used in some examples of the flow cells disclosed herein.

Examples of the flow cells disclosed herein may be used for sequencing, examples of which include sequential paired-end nucleic acid sequencing or simultaneous paired-end nucleic acid sequencing.

For sequential paired-end sequencing, a primer set is attached within each depression and/or on each functionalized layer pad of a flow cell. The primers in the primer set include orthogonal cleaving (linearization) chemistry that enables forward strands to be generated, sequenced, and then removed, and then enables reversed strands to be generated sequenced and then removed. In these examples, orthogonal cleaving chemistry may be realized through different cleavage sites that are attached to the different primers in the set. Several example methods are described to generate these flow cells.

For simultaneous paired-end sequencing, different primer sets are attached to different regions within each depression and/or on each functionalized layer pad of the flow cell. In these examples, the primer sets may be controlled so that the cleaving (linearization) chemistry is orthogonal in the different regions. In these examples, orthogonal cleaving chemistry may be realized through identical cleavage sites that are attached to different primers in the different sets, or through different cleavage sites that are attached to different primers in the different sets. This enables a cluster of forward strands to be generated in one region and a cluster of reverse strands to be generated in another region. In an example, the regions are directly adjacent to one another. In another example, any space between the regions is small enough that clustering can span the two regions. In any of these examples, the forward and reverse strands are spatially separate, which separates the fluorescence signals from both reads while allowing for simultaneous base calling of each read. Several example methods are described to generate these flow cells.

Definitions

It is to be understood that terms used herein will take on their ordinary meaning in the relevant art unless specified otherwise. Several terms used herein and their meanings are set forth below.

The singular forms "a", "an", and "the" include plural referents unless the context clearly dictates otherwise.

The terms comprising, including, containing and various forms of these terms are synonymous with each other and are meant to be equally broad.

The terms top, bottom, lower, upper, on, etc. are used herein to describe the flow cell and/or the various components of the flow cell. It is to be understood that these directional terms are not meant to imply a specific orientation, but are used to designate relative orientation between components. The use of directional terms should not be interpreted to limit the examples disclosed herein to any specific orientation(s).

The terms first, second, etc. also are not meant to imply a specific orientation or order, but rather are used to distinguish one component from another.

It is to be understood that the ranges provided herein include the stated range and any value or sub-range within the stated range, as if such values or sub-ranges were explicitly recited. For example, a range of about 400 nm to about 1 μm (1000 nm), should be interpreted to include not only the explicitly recited limits of about 400 nm to about 1 μm, but also to include individual values, such as about 708 nm, about 945.5 nm, etc., and sub-ranges, such as from about 425 nm to about 825 nm, from about 550 nm to about 940 nm, etc. Furthermore, when "about" and/or "substantially" are/is utilized to describe a value, they are meant to encompass minor variations (up to +/−10%) from the stated value.

An "acrylamide monomer" is a monomer with the structure

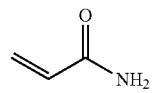

or a monomer including an acrylamide group. Examples of the monomer including an acrylamide group include azido acetamido pentyl acrylamide:

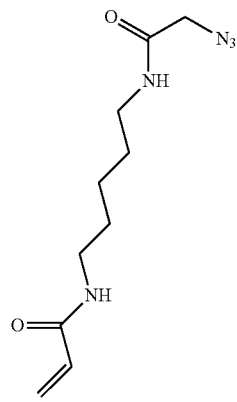 [SMILES: C=CC(=O)NCCCCCNC(=O)CN=[N+]=[N-]]

and N-isopropylacrylamide:

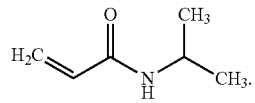

Other acrylamide monomers may be used.

The term "activation," as used herein, refers to a process that generates reactive groups at the surface of a base support or an outermost layer of a multi-layered structure. Activation may be accomplished using silanization or plasma ashing. While the figures do not depict a separate silanized layer or —OH groups from plasma ashing, it is to be understood that activation generates a silanized layer or —OH groups at the surface of the activated support or layer to covalently attach the functionalized layers to the underlying support or layer.

An aldehyde, as used herein, is an organic compound containing a functional group with the structure —CHO, which includes a carbonyl center (i.e., a carbon double-bonded to oxygen) with the carbon atom also bonded to hydrogen and an R group, such as an alkyl or other side chain. The general structure of an aldehyde is:

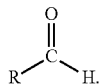

As used herein, "alkyl" refers to a straight or branched hydrocarbon chain that is fully saturated (i.e., contains no double or triple bonds). The alkyl group may have 1 to 20 carbon atoms. Example alkyl groups include methyl, ethyl, propyl, isopropyl, butyl, isobutyl, tertiary butyl, pentyl, hexyl, and the like. As an example, the designation "C1-4 alkyl" indicates that there are one to four carbon atoms in the alkyl chain, i.e., the alkyl chain is selected from the group consisting of methyl, ethyl, propyl, iso-propyl, n-butyl, isobutyl, sec-butyl, and t-butyl.

As used herein, "alkenyl" refers to a straight or branched hydrocarbon chain containing one or more double bonds. The alkenyl group may have 2 to 20 carbon atoms. Example alkenyl groups include ethenyl, propenyl, butenyl, pentenyl, hexenyl, and the like.

As used herein, "alkyne" or "alkynyl" refers to a straight or branched hydrocarbon chain containing one or more triple bonds. The alkynyl group may have 2 to 20 carbon atoms.

As used herein, "aryl" refers to an aromatic ring or ring system (i.e., two or more fused rings that share two adjacent carbon atoms) containing only carbon in the ring backbone. When the aryl is a ring system, every ring in the system is aromatic. The aryl group may have 6 to 18 carbon atoms. Examples of aryl groups include phenyl, naphthyl, azulenyl, and anthracenyl.

An "amine" or "amino" functional group refers to an —NR$_a$R$_b$ group, where R$_a$ and R$_b$ are each independently selected from hydrogen (e.g.

C1-6 alkyl, C2-6 alkenyl, C2-6 alkynyl, C3-7 carbocyclyl, C6-10 aryl, 5-10 membered heteroaryl, and 5-10 membered heterocyclyl, as defined herein.

As used herein, the term "attached" refers to the state of two things being joined, fastened, adhered, connected or bound to each other, either directly or indirectly. For example, a nucleic acid can be attached to a functionalized polymer by a covalent or non-covalent bond. A covalent bond is characterized by the sharing of pairs of electrons between atoms. A non-covalent bond is a physical bond that does not involve the sharing of pairs of electrons and can include, for example, hydrogen bonds, ionic bonds, van der Waals forces, hydrophilic interactions and hydrophobic interactions.

An "azide" or "azido" functional group refers to —N$_3$.

As used herein, a "bonding region" refers to an area of a patterned structure that is to be bonded to another material, which may be, as examples, a spacer layer, a lid, another patterned structure, etc., or combinations thereof (e.g., a spacer layer and a lid, or a spacer layer and another patterned structure). The bond that is formed at the bonding region may be a chemical bond (as described above), or a mechanical bond (e.g., using a fastener, etc.).

As used herein, "carbocyclyl" means a non-aromatic cyclic ring or ring system containing only carbon atoms in the ring system backbone. When the carbocyclyl is a ring system, two or more rings may be joined together in a fused, bridged or spiro-connected fashion. Carbocyclyls may have any degree of saturation, provided that at least one ring in a ring system is not aromatic. Thus, carbocyclyls include cycloalkyls, cycloalkenyls, and cycloalkynyls. The carbocyclyl group may have 3 to 20 carbon atoms. Examples of carbocyclyl rings include cyclopropyl, cyclobutyl, cyclopentyl, cyclohexyl, cyclohexenyl, 2,3-dihydro-indene, bicyclo[2.2.2]octanyl, adamantyl, and spiro[4.4]nonanyl.

As used herein, the term "carboxylic acid" or "carboxyl" as used herein refers to —COOH.

As used herein, "cycloalkylene" means a fully saturated carbocyclyl ring or ring system that is attached to the rest of the molecule via two points of attachment.

As used herein, "cycloalkenyl" or "cycloalkene" means a carbocyclyl ring or ring system having at least one double bond, wherein no ring in the ring system is aromatic. Examples include cyclohexenyl or cyclohexene and norbornenyl or norbornene. Also as used herein, "heterocycloalkenyl" or "heterocycloalkene" means a carbocyclyl ring or ring system with at least one heteroatom in ring backbone, having at least one double bond, wherein no ring in the ring system is aromatic.

As used herein, "cycloalkynyl" or "cycloalkyne" means a carbocyclyl ring or ring system having at least one triple bond, wherein no ring in the ring system is aromatic. An example is cyclooctyne. Another example is bicyclononyne. Also as used herein, "heterocycloalkynyl" or "heterocycloalkyne" means a carbocyclyl ring or ring system with at least one heteroatom in ring backbone, having at least one triple bond, wherein no ring in the ring system is aromatic.

The term "depositing," as used herein, refers to any suitable application technique, which may be manual or automated, and, in some instances, results in modification of the surface properties. Generally, depositing may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, flow through coating, aerosol printing, screen printing, microcontact printing, inkjet printing, or the like.

As used herein, the term "depression" refers to a discrete concave feature in a base support or a layer of a multi-layer stack having a surface opening that is at least partially surrounded by interstitial region(s) of the base support or a layer of a multi-layer stack. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc. As examples, the depression can be a well or two interconnected wells. The depression may also have more complex architectures, such as ridges, step features, etc.

The term "each," when used in reference to a collection of items, is intended to identify an individual item in the collection, but does not necessarily refer to every item in the collection. Exceptions can occur if explicit disclosure or context clearly dictates otherwise.

The term "epoxy" (also referred to as a glycidyl or oxirane group) as used herein refers to

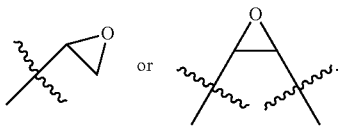

As used herein, the term "flow cell" is intended to mean a vessel having a flow channel where a reaction can be carried out, an inlet for delivering reagent(s) to the flow channel, and an outlet for removing reagent(s) from the flow channel. In some examples, the flow cell accommodates the detection of the reaction that occurs in the flow cell. For example, the flow cell can include one or more transparent surfaces allowing for the optical detection of arrays, optically labeled molecules, or the like.

As used herein, a "flow channel" or "channel" may be an area defined between two bonded components, which can selectively receive a liquid sample. In some examples, the flow channel may be defined between two patterned structures, and thus may be in fluid communication with surface chemistry of the patterned structures. In other examples, the flow channel may be defined between a patterned structure and a lid, and thus may be in fluid communication with surface chemistry of the patterned structures.

As used herein, a "functionalized layer" or a "functionalized layer pad" refers to a gel material that is applied over at least a portion of a flow cell substrate. The gel material includes functional group(s) that can attach to primer(s). The functionalized layer may be positioned within a portion of a depression defined in the substrate. The functionalized layer pad sits on, and thus appears to protrude from, a substantially flat substrate surface. The term "functionalized layer" also refers to the gel material that is applied over all or a portion of the substrate, and that is exposed to further processing to define the functionalized layer in the portion of the depression, or the functionalized layer pad on the substantially flat substrate surface.

As used herein, "heteroaryl" refers to an aromatic ring or ring system (i.e., two or more fused rings that share two adjacent atoms) that contain(s) one or more heteroatoms, that is, an element other than carbon, including but not limited to, nitrogen, oxygen and sulfur, in the ring backbone. When the heteroaryl is a ring system, every ring in the system is aromatic. The heteroaryl group may have 5-18 ring members.

As used herein, "heterocyclyl" means a non-aromatic cyclic ring or ring system containing at least one heteroatom in the ring backbone. Heterocyclyls may be joined together in a fused, bridged or spiro-connected fashion. Heterocyclyls may have any degree of saturation provided that at least one ring in the ring system is not aromatic. In the ring system, the heteroatom(s) may be present in either a non-aromatic or aromatic ring. The heterocyclyl group may have 3 to 20 ring members (i.e., the number of atoms making up the ring backbone, including carbon atoms and heteroatoms). In some examples, the heteroatom(s) are O, N, or S.

The term "hydrazine" or "hydrazinyl" as used herein refers to a —NHNH$_2$ group.

As used herein, the term "hydrazone" or "hydrazonyl" as used herein refers to a

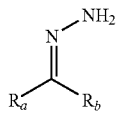

group in which $R_a$ and $R_b$ are each independently selected from hydrogen, C1-6 alkyl, C2-6 alkenyl, C2-6 alkynyl, C3-7 carbocyclyl, C6-10 aryl, 5-10 membered heteroaryl, and 5-10 membered heterocyclyl, as defined herein.

As used herein, "hydroxy" or "hydroxyl" refers to an —OH group.

As used herein, the term "interstitial region" refers to an area, e.g., of a base support or a layer of a multi-layer stack that separates depressions (concave regions) or functionalized layer pads. For example, an interstitial region can separate one depression of an array from another depression of the array. The two depressions that are separated from each other can be discrete, i.e., lacking physical contact with each other. In many examples, the interstitial region is continuous, whereas the depressions or pads are discrete, for example, as is the case for a plurality of depressions defined in an otherwise continuous surface or a plurality of pads defined on an otherwise continuous surface. In other examples, the interstitial regions and the features are discrete, for example, as is the case for a plurality of depressions in the shape of trenches, which are separated by respective interstitial regions. The separation provided by an interstitial region can be partial or full separation. Interstitial regions may have a surface material that differs from the surface material of the depressions. For example, depressions can have a polymer and primer set(s) therein, and the interstitial regions can be free of polymer and primer set(s).

The term "light sensitive material" as used herein refers to a photoresist or another ultraviolet light curable resin.

As used herein, a "negative photoresist" refers to a light sensitive material in which a portion that is exposed to light of particular wavelength(s) becomes insoluble to a developer. In these examples, the insoluble negative photoresist has less than 5% solubility in the developer. With the negative photoresist, the light exposure changes the chemical structure so that the exposed portions of the material becomes less soluble (than non-exposed portions) in the developer. While not soluble in the developer, the insoluble negative photoresist may be at least 99% soluble in a remover that is different from the developer. The remover may be a solvent or solvent mixture used, e.g., in a lift-off process.

In contrast to the insoluble negative photoresist, any portion of the negative photoresist that is not exposed to light is at least 95% soluble in the developer. In some examples, the portion of the negative photoresist not exposed to light is at least 98%, e.g., 99%, 99.5%, 100%, soluble in the developer.

"Nitrile oxide," as used herein, means a "$R_aC\equiv N^+O^-$" group in which $R_a$ is defined herein. Examples of preparing nitrile oxide include in situ generation from aldoximes by treatment with chloramide-T or through action of base on imidoyl chlorides [RC(Cl)=NOH] or from the reaction between hydroxylamine and an aldehyde.

"Nitrone," as used herein, means a

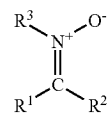

group in which $R^1$, $R^2$, and $R^3$ may be any of the $R_a$ and $R_b$ groups defined herein, except that $R^3$ is not hydrogen (H).

As used herein, a "nucleotide" includes a nitrogen containing heterocyclic base, a sugar, and one or more phosphate groups. Nucleotides are monomeric units of a nucleic acid sequence. In RNA, the sugar is a ribose, and in DNA, the sugar is a deoxyribose, i.e. a sugar lacking a hydroxyl group that is present at the 2' position in ribose. The nitrogen containing heterocyclic base (i.e., nucleobase) can be a purine base or a pyrimidine base. Purine bases include adenine (A) and guanine (G), and modified derivatives or analogs thereof. Pyrimidine bases include cytosine (C), thymine (T), and uracil (U), and modified derivatives or analogs thereof. The C-1 atom of deoxyribose is bonded to N-1 of a pyrimidine or N-9 of a purine. A nucleic acid analog may have any of the phosphate backbone, the sugar, or the nucleobase altered. Examples of nucleic acid analogs include, for example, universal bases or phosphate-sugar backbone analogs, such as peptide nucleic acid (PNA).

In some examples, the term "over" may mean that one component or material is positioned directly on another component or material. When one is directly on another, the two are in contact with each other. In FIG. 1E, the resin layer 18, 18' is applied over the base support 17, 17' so that it is directly on and in contact with the base support 17, 17'.

In other examples, the term "over" may mean that one component or material is positioned indirectly on another component or material. By indirectly on, it is meant that a gap or an additional component or material may be positioned between the two components or materials. In FIG. 1E, the functionalized layers 24, 26 are positioned over the base support 17, 17' such that the two are in indirect contact. The resin layer 18, 18' is positioned therebetween.

A "patterned resin" refers to any polymer that can have depressions defined therein. In some of the examples disclosed herein, the patterned resin may have portions that are ultraviolet light absorbing and other portions that are ultraviolet light transmissive depending, in part, upon the thickness. Specific examples of resins and techniques for patterning the resins will be described further below.

A "patterned structure" refers to a single layer base support that includes, or a multi-layer stack with a layer that includes surface chemistry in a pattern, e.g., in depressions or otherwise positioned on the support or layer surface. The surface chemistry may include a functionalized layer and primers (e.g., used for library template capture and amplification). In some examples, the single layer base support or the layer of the multi-layer stack have been exposed to patterning techniques (e.g., etching, lithography, etc.) in order to generate the pattern for the surface chemistry. However, the term "patterned structure" is not intended to imply that such patterning techniques have to be used to generate the pattern. For example, a base support may be a substantially flat surface having a pattern of the functionalized layers thereon. The patterned structure may be generated via any of the methods disclosed herein.

As used herein, the term "polyhedral oligomeric silsesquioxane" refers to a chemical composition that is a hybrid intermediate (e.g., $RSiO_{1.5}$) between that of silica ($SiO_2$) and silicone ($R_2SiO$). An example of polyhedral oligomeric silsesquioxane may be that described in Kehagias et al., Microelectronic Engineering 86 (2009), pp. 776-778, which is incorporated by reference in its entirety. In an example, the composition is an organosilicon compound with the chemical formula $[RSiO_{3/2}]_n$, where the R groups can be the same or different. Example R groups for POSS include epoxy, azide/azido, a thiol, a poly(ethylene glycol), a norbornene, a tetrazine, acrylates, and/or methacrylates, or further, for example, alkyl, aryl, alkoxy, and/or haloalkyl groups.

As used herein, a "positive photoresist" refers to a light sensitive material in which a portion that is exposed to light of particular wavelength(s) becomes soluble to a developer. In these examples, any portion of the positive photoresist exposed to light is at least 95% soluble in the developer. In some examples, the portion of the positive photoresist exposed to light is at least 98%, e.g., 99%, 99.5%, 100%, soluble in the developer. With the positive photoresist, the light exposure changes the chemical structure so that the exposed portions of the material become more soluble (than non-exposed portions) in the developer.

In contrast to the soluble positive photoresist, any portion of the positive photoresist not exposed to light is insoluble (less than 5% soluble) in the developer. While not soluble in the developer, the insoluble positive photoresist may be at least 99% soluble in a remover that is different from the developer. In some examples, insoluble positive photoresist is at least 98%, e.g., 99%, 99.5%, 100%, soluble in the remover. The remover may be a solvent or solvent mixture used in a lift-off process.

As used herein, the "primer" is defined as a single stranded nucleic acid sequence (e.g., single strand DNA). Some primers, referred to herein as amplification primers, serve as a starting point for template amplification and cluster generation. Other primers, referred to herein as sequencing primers, serve as a starting point for DNA synthesis. The 5' terminus of the primer may be modified to allow a coupling reaction with a functional group of a polymer. The primer length can be any number of bases long and can include a variety of non-natural nucleotides. In an example, the sequencing primer is a short strand, ranging from 10 to 60 bases, or from 20 to 40 bases.

A "spacer layer," as used herein, refers to a material that bonds two components together. In some examples, the spacer layer can be a radiation absorbing material that aids in bonding, or can be put into contact with a radiation absorbing material that aids in bonding.

The term "substrate" refers to the single layer base support or a multi-layer structure upon which surface chemistry is introduced. In the examples of the method that utilize a metal film for patterning, the single layer base support or the layers of the multi-layer structure are capable of transmitting ultraviolet light that is used to pattern a photoresist and is used in nucleic acid sequencing. In the examples of the method that utilize varying thicknesses of a resin layer for patterning, the resin layer (which may be a single layer base support or one layer of the multi-layer structure) is capable of transmitting ultraviolet light at thinner portions and absorbing ultraviolet light at thicker portions. When the resin layer is used in a multi-layer structure, the other layer(s) of the multi-layer structure are capable of transmitting the ultraviolet light that is used to pattern the photoresist and that is used in nucleic acid sequencing.

The term "tantalum pentoxide" refers to the inorganic compound with the formula $Ta_2O_5$. This compound is transparent, having a transmittance ranging from about 0.25 (25%) to 1 (100%), to wavelengths ranging from about 0.35 μm (350 nm) to at least 1.8 μm (1800 nm). A "tantalum pentoxide base support" or "tantalum pentoxide layer" may comprise, consist essentially of, or consist of $Ta_2O_5$. In examples where it is desirable for the tantalum pentoxide base support or the tantalum pentoxide layer to transmit electromagnetic energy having any of these wavelengths, the base support or layer may consist of $Ta_2O_5$ or may comprise or consist essentially of $Ta_2O_5$ and other components that will not interfere with the desired transmittance of the base support or layer.

A "thiol" functional group refers to —SH.

As used herein, the terms "tetrazine" and "tetrazinyl" refer to six-membered heteroaryl group comprising four nitrogen atoms. Tetrazine can be optionally substituted.

"Tetrazole," as used herein, refer to five-membered heterocyclic group including four nitrogen atoms. Tetrazole can be optionally substituted.

The term "transparent" refers to a material, e.g., in the form of a base support or layer, that is capable of transmitting a particular wavelength or range of wavelengths. For example, the material may be transparent to wavelength(s) that are used to chemically change a positive or negative photoresist. Transparency may be quantified using transmittance, i.e., the ratio of light energy falling on a body to that transmitted through the body. The transmittance of a transparent base support or a transparent layer will depend upon the thickness of the base support or layer, the wavelength of light, and the dosage of the light to which it is exposed. In the examples disclosed herein, the transmittance of the transparent base support or the transparent layer may range from 0.25 (25%) to 1 (100%). The material of the base support or layer may be a pure material, a material with some impurities, or a mixture of materials, as long as the resulting base support or layer is capable of the desired transmittance. Additionally, depending upon the transmittance of the base support or layer, the time for light exposure and/or the output power of the light source may be increased or decreased to deliver a suitable dose of light energy through the transparent base support and/or layer to achieve the desired effect (e.g., generating a soluble or insoluble photoresist).

Flow Cells

An example of the flow cell for sequential paired-end sequencing generally includes a patterned structure, which includes a substrate; a functionalized layer over at least a portion of the substrate; and a primer set including two different primers attached to the functionalized layer. An example of the flow cell for simultaneous paired-end sequencing generally includes a patterned structure, which includes a substrate; two functionalized layers over at least a portion of the substrate; and different primer sets attached to the two functionalized layers.

One example of the flow cell 10 is shown in FIG. 1A from a top view. The flow cell 10 may include two patterned structures bonded together or one patterned structure bonded to a lid. Between the two patterned structures or the one patterned structure and the lid is a flow channel 12. The example shown in FIG. 1A includes eight flow channels 12. While eight flow channels 12 are shown, it is to be understood that any number of flow channels 12 may be included in the flow cell 10 (e.g., a single flow channel 12, four flow channels 12, etc.). Each flow channel 12 may be isolated from another flow channel 12 so that fluid introduced into a flow channel 12 does not flow into adjacent flow channel(s) 12. Some examples of the fluids introduced into the flow channel 12 may introduce reaction components (e.g., DNA sample, polymerases, sequencing primers, nucleotides, etc.), washing solutions, deblocking agents, etc.

Each flow channel 12 is in fluid communication with an inlet and an outlet (not shown). The inlet and outlet of each flow channel 12 may be positioned at opposed ends of the flow cell. The inlets and outlets of the respective flow channels 12 may alternatively be positioned anywhere along the length and width of the flow channel 12 that enables desirable fluid flow.

The inlet allows fluids to be introduced into the flow channel 12, and the outlet allows fluid to be extracted from the flow channel 12. Each of the inlets and outlets is fluidly connected to a fluidic control system (including, e.g., reservoirs, pumps, valves, waste containers, and the like) which controls fluid introduction and expulsion.

The flow channel 12 is at least partially defined by a patterned structure. The patterned structure may include a substrate, such as a single layer base support 14 or 14' (as shown in FIG. 1B, FIG. 1C, and FIG. 1D), or a multi-layered structure 16, 16' (as shown in FIG. 1E).

In examples of the method that utilize the metal film (see reference numeral 48 in FIG. 1D) for patterning, the single layer base support 14 may be any material that is capable of transmitting the light that is used to pattern a photoresist (e.g., ultraviolet light) and that is used in nucleic acid sequencing (e.g., ultraviolet light and visible light). In these particular examples, suitable materials include siloxanes, glass, modified or functionalized glass, plastics (including acrylics, polystyrene and copolymers of styrene and other materials, polyethylene terephthalate (PET), polycarbonate, cyclic olefin copolymer (COC), some polyamides, silica or silicon oxide (e.g., $SiO_2$), fused silica, silica-based materials, silicon nitride ($Si_3N_4$), inorganic glasses, resins, or the like. Examples of resins that can transmit UV light include inorganic oxides, such as tantalum pentoxide (e.g., $Ta_2O_5$) or other tantalum oxide(s) ($TaO_x$), aluminum oxide (e.g., $Al_2O_3$), silicon oxide (e.g., $SiO_2$), hafnium oxide (e.g., $HfO_2$), indium tin oxide, titanium dioxide, etc., or polymeric resins, such as a polyhedral oligomeric silsesquioxane based resin (e.g., POSS® from Hybrid Plastics), a non-polyhedral oligomeric silsesquioxane epoxy resin, a poly(ethylene glycol) resin, a polyether resin (e.g., ring opened epoxies), an acrylic resin, an acrylate resin, a methacrylate resin, an amorphous fluoropolymer resin (e.g., CYTOP® from Bellex), and combinations thereof. In some examples, the resin used has a UV transmittance (at the predetermined UV dosage being used) that ranges from about 0.5 to about 1, e.g., from about 0.75 to about 1, from about 0.9 to about 0.99. The thickness of the resin that is used in combination with the metal film can be adjusted so that the entire resin exhibits the desired UV transmittance for the UV dosage being used. In some instances, the resin thickness is 150 nm or less.

In examples of the method that utilize the metal film for patterning, the multi-layer structure 16 may include a base support 17 and a resin layer 18 on the base support 17. In this example, any of the materials for the single layer base support 14 may be used as the base support 17, and any of the resins the single layer base support 14 may be used for the resin layer 18.

In the examples of the method that utilize varying resin layer thickness for patterning, the single layer base support 14' may be any resin material whose UV absorbance, when exposed to a particular UV light dosage, can be altered by adjusting its thickness. Any of the previously listed resins may be used so long as thicker portions absorb the UV light and thinner portions transmit a desirable amount of UV light for patterning when the resin is exposed to a predetermined UV light dosage. In one example, a polyhedral oligomeric silsesquioxane based resin having thicker portions of about 500 nm and thinner portions of about 150 nm will respectively and effectively absorb and transmit UV light when exposed to a dosage ranging from about 30 mJ/cm$^2$ to about 60 mJ/cm$^2$. Other thicknesses may be used, and the UV dosage may be adjusted accordingly to achieve the desired absorption in thicker areas and transmittance in thinner areas.

In examples of the method that utilize varying resin layer thickness for patterning, the multi-layer structure 16' may include a base support 17' and a resin layer 18' on the base support 17' (FIG. 1E). In this example, any of the materials set forth herein that are suitable for use as the single layer base support 14 may be used as the base support 17', and any of the resins set forth herein that are suitable for use as the single layer base support 14' may be used for the resin layer 18'. In this example, the thick and thin portions of the resin layer 18' are adjusted to achieve the desired absorption and transmittance.

The correlation between UV dose, UV absorption constant, and resin layer thickness can be expressed as:

$$D_0 = D \times \exp(-kd)$$

where $D_0$ is the required UV dose to pattern resin layer, D is the actual UV dose which has to be applied to the resin, k is the absorption constant, and d is the thickness of thinner portion of resin. Thus, the actual UV dose (D) can be expressed as:

$$D = D_0 / \exp(-kd)$$

In one example, the single layer base support 14' or the resin layer 18' is the negative photoresist NR9-1000P (from Futurrex), $D_0 = 19$ mJ/cm$^2$ at 0.9 μm of thickness, the UV absorption constant (k) of the photoresist is $3 \times 10^4$ cm$^{-1}$, the thickness of the thinner portion of photoresist is 150 nm, and D is about 30 mJ/cm$^2$.

In some of the examples set forth herein, the single layer base support 14, 14' or the resin layer 18, 18' is patterned with depressions 20, 20'.

Some example materials (e.g., inorganic oxides) can be selectively applied via vapor deposition, aerosol printing, or inkjet printing and the depressions 20, 20' can be formed during this process. Other example materials, e.g., the polymeric resins, may be applied and then patterned to form the depressions 20, 20'. For example, the polymeric resins may be deposited using a suitable technique, such as chemical vapor deposition, dip coating, dunk coating, spin coating, spray coating, puddle dispensing, ultrasonic spray coating, doctor blade coating, aerosol printing, screen printing, microcontact printing, etc. Suitable patterning techniques include photolithography, nanoimprint lithography (NIL), stamping techniques, embossing techniques, molding techniques, microetching techniques, etc.

The single layer base support 14, 14' or the base support 17, 17' may be a circular sheet, a panel, a wafer, a die etc. having a diameter ranging from about 2 mm to about 300 mm, e.g., from about 200 mm to about 300 mm, or may be a rectangular sheet, panel, wafer, die etc. having its largest dimension up to about 10 feet (~3 meters). As one example, a die may have a width ranging from about 0.1 mm to about 10 mm. While example dimensions have been provided, it is to be understood that the single layer base support 14, 14' or the base support 17, 17' may have any suitable dimensions.

In an example, the flow channel 12 has a substantially rectangular configuration (e.g., with curved ends as shown in FIG. 1A). The length and width of the flow channel 12 may be selected so a portion of the single layer base support 14, 14' or the resin layer 18, 18' of the multi-layered structure 16, 16' surrounds the flow channel 12 and is available for attachment to a lid (not shown) or another patterned structure.

The depth of the flow channel 12 can be as small as a monolayer thick when microcontact, aerosol, or inkjet printing is used to deposit a separate material that defines the flow channel 12 walls. For other examples, the depth of the flow channel 12 can be about 1 μm, about 10 μm, about 50 μm, about 100 μm, or more. In an example, the depth may range from about 10 μm to about 100 μm. In another example, the depth may range from about 10 μm to about 30 μm. In still another example, the depth is about 5 μm or less. It is to be understood that the depth of the flow channel 12 may be greater than, less than or between the values specified above.

FIG. 1B, FIG. 1C, FIG. 1D, and FIG. 1E depict examples of the architecture within the flow channel 12. As shown in FIG. 1B, the architecture includes depressions 20 of the same depth separated by interstitial regions 22. In this example, a functionalized layer 24 is formed in each depression 20. As shown in FIG. 1C, the architecture includes depressions 20 of different depths $D_1$, $D_2$ separated by interstitial regions 22. In this example, functionalized layers 24, 26 are formed in the different depressions 20. A functionalized layer pad 28 is also formed on the surface of the single layer base support 14'. As shown in FIG. 1D, the architecture includes a plurality of functionalized layer pads 28, separated by interstitial regions 22', across a substantially planar surface over the single layer base support 14. As shown in FIG. 1E, the architecture includes multi-depth depressions 20' separated by interstitial regions 22, and functionalized layers 24, 26 formed on difference surfaces of the multi-depth depressions 20'. In still other examples, a resin material protrusion may be formed in the depression 20 and the functionalized layer 24 may be formed over this resin material protrusion. An example of this is shown in FIG. 6E.

Many different layouts of the functionalized layer pads 28 and depressions 20, 20' may be envisaged, including regular, repeating, and non-regular patterns. In an example, the functionalized layer pads 28 and/or depressions 20, 20' are disposed in a hexagonal grid for close packing and improved density. Other layouts may include, for example, rectilinear (rectangular) layouts, triangular layouts, and so forth. In some examples, the layout or pattern can be an x-y format in rows and columns. In some other examples, the layout or pattern can be a repeating arrangement of the functionalized layer pads 28 and/or depressions 20, 20' and the interstitial regions 22, 22'. In still other examples, the layout or pattern can be a random arrangement of the functionalized layer pads 28 and/or depressions 20, 20' and the interstitial regions 22, 22'.

The layout or pattern may be characterized with respect to the density (number) of the functionalized layer pads 28 and/or depressions 20, 20' in a defined area. For example, the functionalized layer pads 28 and/or depressions 20, 20' may be present at a density of approximately 2 million per mm$^2$. The density may be tuned to different densities including, for example, a density of about 100 per mm$^2$, about 1,000 per mm$^2$, about 0.1 million per mm$^2$, about 1 million per mm$^2$, about 2 million per mm$^2$, about 5 million per mm$^2$, about 10 million per mm$^2$, about 50 million per mm$^2$, or more, or less. It is to be further understood that the density can be between one of the lower values and one of the upper values selected from the ranges above, or that other densities (outside of the given ranges) may be used. As examples, a high density array may be characterized as having the functionalized layer pads 28 and/or depressions 20, 20' separated by less than about 100 nm, a medium density array may be characterized as having the functionalized layer pads 30 and/or depressions 20, 20' separated by about 400 nm to about 1 μm, and a low density array may be characterized as having the functionalized layer pads 28 and/or depressions 20, 20' separated by greater than about 1 μm.

The layout or pattern of the functionalized layer pads 28 and/or depressions 20, 20' may also or alternatively be characterized in terms of the average pitch, or the spacing from the center of one functionalized layer pad 28 and/or depression 20, 20' to the center of an adjacent set of functionalized layer pad 28 and/or depression 20, 20' (center-to-center spacing) or from the right edge of one functionalized layer pads 28 and/or depressions 20, 20' to the left edge of an adjacent functionalized layer pads 28 and/or depressions 20, 20' (edge-to-edge spacing). The pattern can be regular, such that the coefficient of variation around the average pitch is small, or the pattern can be non-regular in which case the coefficient of variation can be relatively large. In either case, the average pitch can be, for example, about 50 nm, about 0.15 µm, about 0.5 µm, about 1 µm, about 5 µm, about 10 µm, about 100 µm, or more or less. The average pitch for a particular pattern of can be between one of the lower values and one of the upper values selected from the ranges above. In an example, the depressions 20 have a pitch (center-to-center spacing) of about 1.5 µm. While example average pitch values have been provided, it is to be understood that other average pitch values may be used.

The size of each depression 20, 20' may be characterized by its volume, opening area, depth, and/or diameter or length and width. For example, the volume can range from about $1\times10^{-3}$ µm$^3$ to about 100 µm$^3$, e.g., about $1\times10^{-2}$ µm$^3$, about 0.1 µm$^3$, about 1 µm$^3$, about 10 µm$^3$, or more, or less. For another example, the opening area can range from about $1\times10^{-3}$ µm$^2$ to about 100 µm$^2$, e.g., about $1\times10^{-2}$ µm$^2$, about 0.1 µm$^2$, about 1 µm$^2$, at least about 10 µm$^2$, or more, or less. For still another example, the depth can range from about 0.1 µm to about 100 µm, e.g., about 0.5 µm, about 1 µm, about 10 µm, or more, or less. For another example, the depth can range from about 0.1 µm to about 100 µm, e.g., about 0.5 µm, about 1 µm, about 10 µm, or more, or less. For yet another example, the diameter or each of the length and the width can range from about 0.1 µm to about 100 µm, e.g., about 0.5 µm, about 1 µm, about 10 µm, or more, or less.

The size of each functionalized layer pad 28 may be characterized by its top surface area, height, and/or diameter or length and width. In an example, the top surface area can range from about $1\times10^{-3}$ µm$^2$ to about 100 µm$^2$, e.g., about $1\times10^{-2}$ µm$^2$, about 0.1 µm$^2$, about 1 µm$^2$, at least about 10 µm$^2$, or more, or less. For still another example, the height can range from about 0.1 µm to about 100 µm, e.g., about 0.5 µm, about 1 µm, about 10 µm, or more, or less. For yet another example, the diameter or each of the length and the width can range from about 0.1 µm to about 100 µm, e.g., about 0.5 µm, about 1 µm, about 10 µm, or more, or less.

Each of the architectures also includes the functionalized layers 24, 26 and/or the functionalized layer pads 28. In each example, functionalized layers 24, 26 or the functionalized layer pads 28 represent areas that have a primer set attached thereto. Some examples of the primer set 29 (FIGS. 1B, 1C, and 1D) include two different primers 31, 33 that are used in sequential paired-end sequencing. Other examples include different primer sets 30, 32 (FIG. 1E) that are used in simultaneous paired-end sequencing.

In some of the examples disclosed herein, the functionalized layers 24, 26 and/or functionalized layer pad 28 are chemically the same, and any of the techniques disclosed herein may be used to immobilize the primer sets 29 or 30, 32 to the desired layer 24, 26, and/or pad 28. In other examples disclosed herein, the functionalized layers 24, 26 and/or functionalized layer pad 28 are chemically different (e.g., include different functional groups for respective primer set 29 or 30, 32 attachment), and any of the techniques disclosed herein may be used to immobilize the primer sets 29 or 30, 32 to the respective layers 24, 26 and/or pads 28. In other examples disclosed herein, the materials applied to form the functionalized layers 24, 26 or the functionalized layer pads 28 may have the respective primer sets 29 or 30, 32 pre-grafted thereto, and thus the immobilization chemistries of the functionalized layers 24, 26 or the functionalized layer pads 28 may be the same or different.

In some examples, the functionalized layers 24, 26 or the functionalized layer pads 28 may be any gel material that can swell when liquid is taken up and that can contract when liquid is removed, e.g., by drying. In an example, the gel material is a polymeric hydrogel. In an example, the polymeric hydrogel includes an acrylamide copolymer. Some examples of the acrylamide copolymer are represented by the following structure (I):

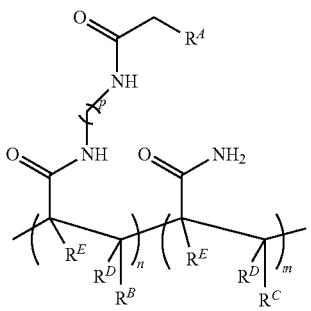

wherein:

$R^A$ is selected from the group consisting of azido, optionally substituted amino, optionally substituted alkenyl, optionally substituted alkyne, halogen, optionally substituted hydrazone, optionally substituted hydrazine, carboxyl, hydroxy, optionally substituted tetrazole, optionally substituted tetrazine, nitrile oxide, nitrone, sulfate, and thiol;

$R^B$ is H or optionally substituted alkyl;

$R^C$, $R^D$, and $R^E$ are each independently selected from the group consisting of H and optionally substituted alkyl;

each of the —(CH$_2$)$_p$— can be optionally substituted;

p is an integer in the range of 1 to 50;

n is an integer in the range of 1 to 50,000; and m is an integer in the range of 1 to 100,000.

One specific example of the acrylamide copolymer represented by structure (I) is poly(N-(5-azidoacetamidylpentyl)acrylamide-co-acrylamide, PAZAM.

One of ordinary skill in the art will recognize that the arrangement of the recurring "n" and "m" features in structure (I) are representative, and the monomeric subunits may be present in any order in the polymer structure (e.g., random, block, patterned, or a combination thereof).

The molecular weight of the acrylamide copolymer may range from about 5 kDa to about 1500 kDa or from about 10 kDa to about 1000 kDa, or may be, in a specific example, about 312 kDa.

In some examples, the acrylamide copolymer is a linear polymer. In some other examples, the acrylamide copolymer is a lightly cross-linked polymer.

In other examples, the gel material may be a variation of structure (I). In one example, the acrylamide unit may be replaced with N,N-dimethylacrylamide

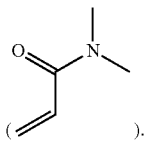

In this example, the acrylamide unit in structure (I) may be replaced with,

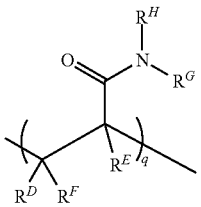

where $R^D$, $R^E$, and $R^F$ are each H or a C1-C6 alkyl, and $R^G$ and $R^H$ are each a C1-C6 alkyl (instead of H as is the case with the acrylamide). In this example, q may be an integer in the range of 1 to 100,000. In another example, the N,N-dimethylacrylamide may be used in addition to the acrylamide unit. In this example, structure (I) may include

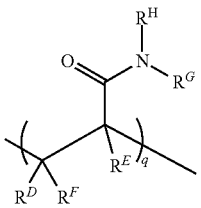

in addition to the recurring "n" and "m" features, where $R^D$, $R^E$, and $R^F$ are each H or a C1-C6 alkyl, and $R^G$ and $R^H$ are each a C1-C6 alkyl. In this example, q may be an integer in the range of 1 to 100,000.

As another example of the polymeric hydrogel, the recurring "n" feature in structure (I) may be replaced with a monomer including a heterocyclic azido group having structure (II):

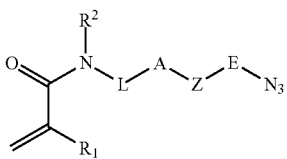

wherein $R^1$ is H or a C1-C6 alkyl; $R_2$ is H or a C1-C6 alkyl; L is a linker including a linear chain with 2 to 20 atoms selected from the group consisting of carbon, oxygen, and nitrogen and 10 optional substituents on the carbon and any nitrogen atoms in the chain; E is a linear chain including 1 to 4 atoms selected from the group consisting of carbon, oxygen and nitrogen, and optional substituents on the carbon and any nitrogen atoms in the chain; A is an N substituted amide with an H or a C1-C4 alkyl attached to the N; and Z is a nitrogen containing heterocycle. Examples of Z include 5 to 10 carbon-containing ring members present as a single cyclic structure or a fused structure. Some specific examples of Z include pyrrolidinyl, pyridinyl, or pyrimidinyl. As still another example, the gel material may include a recurring unit of each of structure (III) and (IV):

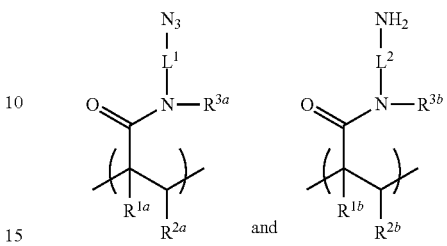

wherein each of $R^{1a}$, $R^{2a}$, $R^{1b}$ and $R^{2b}$ is independently selected from hydrogen, an optionally substituted alkyl or optionally substituted phenyl; each of $R^{1a}$ and $R^{3b}$ is independently selected from hydrogen, an optionally substituted alkyl, an optionally substituted phenyl, or an optionally substituted C7-C14 aralkyl; and each $L^1$ and $L^2$ is independently selected from an optionally substituted alkylene linker or an optionally substituted heteroalkylene linker.

In still another example, the acrylamide copolymer is formed using nitroxide mediated polymerization, and thus at least some of the copolymer chains have an alkoxyamine end group. In the copolymer chain, the term "alkoxyamine end group" refers to the dormant species $—ONR_1R_2$, where each of $R_1$ and $R_2$ may be the same or different, and may independently be a linear or branched alkyl, or a ring structure, and where the oxygen atom is attached to the rest of the copolymer chain. In some examples, the alkoxyamine may also be introduced into some of the recurring acrylamide monomers, e.g., at position $R^4$ in structure (I). As such, in one example, structure (I) includes an alkoxyamine end group; and in another example, structure (I) includes an alkoxyamine end group and alkoxyamine groups in at least some of the side chains.

It is to be understood that other molecules may be used to form the functionalized layer 24, 26 and/or functionalized layer pad 28, as long as they are capable of being functionalized with the desired chemistry, e.g., primer set(s) 29, or 30, 32. Some examples of suitable materials for the functionalized layer 24, 26 and/or functionalized layer pad 28 include functionalized silanes, such as norbornene silane, azido silane, alkyne functionalized silane, amine functionalized silane, maleimide silane, or any other silane having functional groups that can respectively attach the desired chemistry. Still other examples of suitable materials for the functionalized layer 24, 26 and/or functionalized layer pad 28 include those having a colloidal structure, such as agarose; or a polymer mesh structure, such as gelatin; or a cross-linked polymer structure, such as polyacrylamide polymers and copolymers, silane free acrylamide (SFA), or an azidolyzed version of SFA. Examples of suitable polyacrylamide polymers may be synthesized from acrylamide and an acrylic acid or an acrylic acid containing a vinyl group, or from monomers that form [2+2] photo-cycloaddition reactions. Still other examples of suitable materials for the functionalized layer 24, 26 and/or functionalized layer pad 28 include mixed copolymers of acrylamides and acrylates. A variety of polymer architectures containing acrylic monomers (e.g., acrylamides, acrylates etc.) may be utilized in the examples disclosed herein, such as branched polymers, including dendrimers (e.g., multi-arm or star polymers), star-shaped or star-block polymers, and the like. For example, the monomers (e.g., acrylamide, acrylamide containing the catalyst, etc.) may be incorporated, either randomly or in block, into the branches (arms) of a dendrimer.

The gel material for the functionalized layer 24, 26 and/or functionalized layer pad 28 may be formed using any suitable copolymerization process, such as nitroxide mediated polymerization (NMP), reversible addition-fragmentation chain-transfer (RAFT) polymerization, etc.

The attachment of the functionalized layers 24, 26 and/or the functionalized layer pads 28 to the underlying base support 14, 14' or resin layer 18, 18' may be through covalent bonding. In some instances, the underlying base support 14, 14' or resin layer 18, 18' may first be activated, e.g., through silanization or plasma ashing. Covalent linking is helpful for maintaining the primer set(s) 29 or 30, 32 in the desired regions throughout the lifetime of the flow cell 10 during a variety of uses.

Each of the architectures also includes the primer set(s) 29 or 30, 32 attached to the respective functionalized layers 24, 26 and/or pads 28.

The primer set 29 includes two different primers 31, 33 that are used in sequential paired end sequencing. As examples, the primer set 29 may include P5 and P7 primers, P15 and P7 primers, or any combination of the PA primers, the PB primers, the PC primers, and the PD primers set forth herein. As examples, the primer set 29 may include any two PA, PB, PC, and PD primers, or any combination of one PA primers and one PB, PC, or primer PD, or any combination of one PB primers and one PC or primer PD, or any combination of one PC primer and one primer PD.

Examples of P5 and P7 primers are used on the surface of commercial flow cells sold by Illumina Inc. for sequencing, for example, on HISEQ™, HISEQX™, MISEQ™, MISEQDX™, MINISEQ™, NEXTSEQ™, NEXTSEQDX™, NOVASEQ™, ISEQ™, GENOME ANALYZER™, and other instrument platforms. The P5 primer (shown as a cleavable primer) is:

```
P5: 5'→3'
                                    (SEQ. ID. NO. 1)
AATGATACGGCGACCACCGAGAUCTACAC
```

The P7 primer (shown as cleavable primers) may be any of the following:

```
P7#1: 5'→3'
                                    (SEQ. ID. NO. 2)
CAAGCAGAAGACGGCATACGAnAT

P7 #2: 5'→3'
                                    (SEQ. ID. NO. 3)
CAAGCAGAAGACGGCATACnAGAT
``` where "n" is 8-oxoguanine or uracil in each of the sequences.

The P15 primer (shown as a cleavable primer) is:

```
P15: 5'→3'
                                    (SEQ. ID. NO. 4)
AATGATACGGCGACCACCGAGAnCTACAC
``` where "n" is allyl-T.

The other primers (PA-PD, shown as non-cleavable primers) mentioned above include:

```
PA 5'→3'
                                    (SEQ. ID. NO. 5)
GCTGGCACGTCCGAACGCTTCGTTAATCCGTTGAG cPA (PA') 5'→3'
                                    (SEQ. ID. NO. 6)
CTCAACGGATTAACGAAGCGTTCGGACGTGCCAGC

PB 5'→3'
                                    (SEQ. ID. NO. 7)
CGTCGTCTGCCATGGCGCTTCGGTGGATATGAACT cPB (PB') 5'→3'
                                    (SEQ. ID. NO. 8)
AGTTCATATCCACCGAAGCGCCATGGCAGACGACG

PC 5'→3'
                                    (SEQ. ID. NO. 9)
ACGGCCGCTAATATCAACGCGTCGAATCCGCAACT cPC (PC') 5'→3'
                                    (SEQ. ID. NO. 10)
AGTTGCGGATTCGACGCGTTGATATTAGCGGCCGT

PD 5'→3'
                                    (SEQ. ID. NO. 11)
GCCGCGTTACGTTAGCCGGACTATTCGATGCAGC cPD (PD') 5'→3'
                                    (SEQ. ID. NO. 12)
GCTGCATCGAATAGTCCGGCTAACGTAACGCGGC
```

While not shown in the example sequences for PA-PD, it is to be understood that any of these primers may include a cleavage site, such as uracil, 8-oxoguanine, allyl-T, etc. at any point in the strand. Moreover, the P5, P7, and P15 primers may be un-cleavable by eliminating the cleavage site (e.g., uracil, 8-oxoguanine, allyl-T, etc.) from the strand.

Each of the primers disclosed herein may also include a polyT sequence at the 5' end of the primer sequence. In some examples, the polyT region includes from 2 T bases to 20 T bases. As specific examples, the polyT region may include 3, 4, 5, 6, 7, or 10 T bases.

Figure 2B:
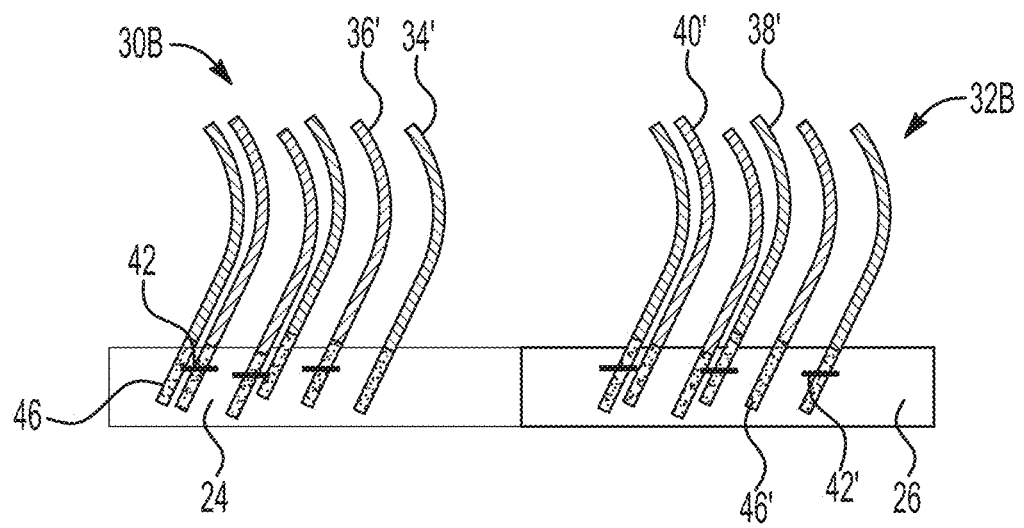
Figure 2C:
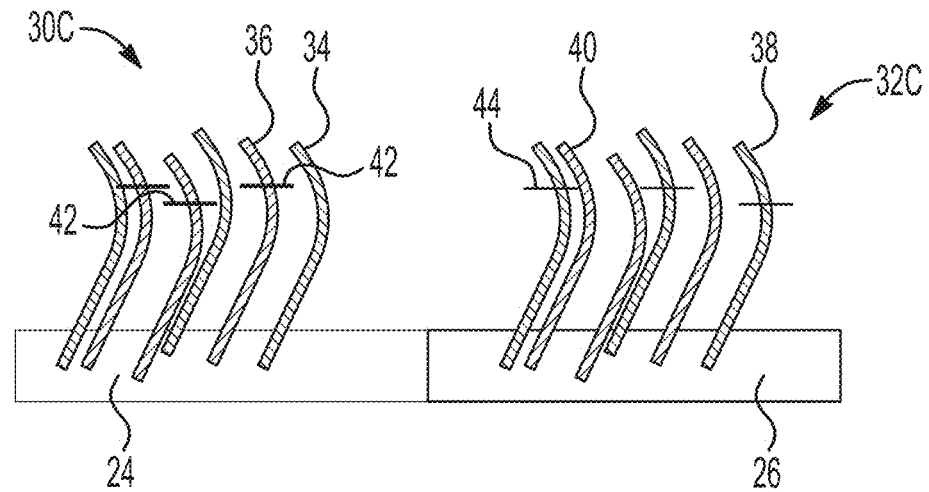
Figure 2D:
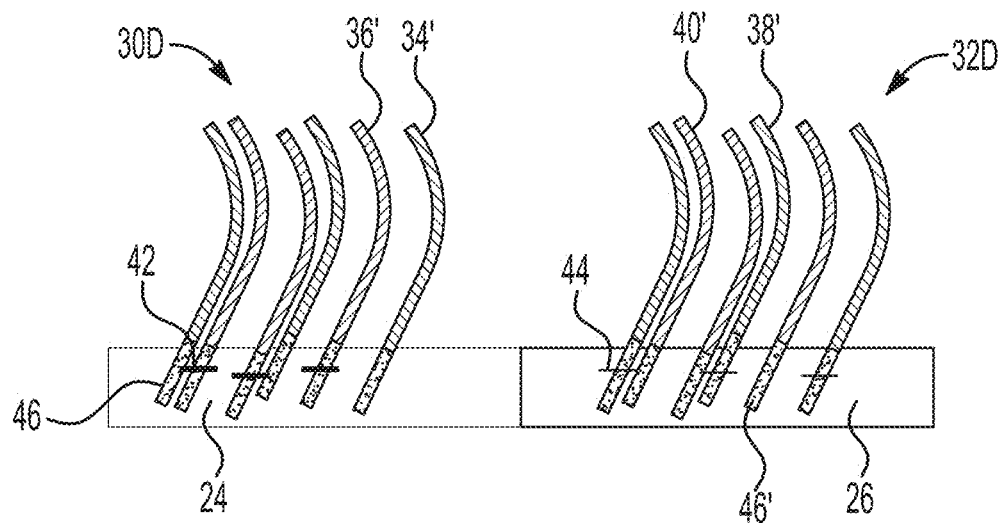

The 5' end of each primer may also include a linker (e.g., 46, 46' described in reference to FIG. 2B and FIG. 2D). Any linker that includes a terminal alkyne group or another suitable terminal functional group that can attach to the surface functional groups of the functionalized layer 24, 26 and/or functionalized layer pad 28 may be used. In one example, the primers are terminated with hexynyl.

The primers sets 30, 32 are related in that one set includes an un-cleavable first primer and a cleavable second primer, and the other set includes a cleavable first primer and an un-cleavable second primer. These primer sets 30, 32 allow a single template strand to be amplified and clustered across both primer sets 30, 32, and also enable the generation of forward and reverse strands on adjacent functionalized layer 24, 26 (e.g., as shown in FIG. 1E) due to the cleavage groups being present on the opposite primers of the sets 30, 32. Examples of these primer sets 30, 32 will be discussed in reference to FIG. 2A through FIG. 2D.

FIG. 2A through FIG. 2D depict different configurations of the primer sets 30A, 32A, 30B, 32B, 30C, 32C, and 30D, 32D attached to the functionalized layers 24, 26.

Each of the first primer sets 30A, 30B, 30C, and 30D includes an un-cleavable first primer 34 or 34' and a cleavable second primer 36 or 36'; and each of the second primer sets 32A, 32B, 32C, and 32D includes a cleavable first primer 38 or 38' and an un-cleavable second primer 40 or 40'.

The un-cleavable first primer 34 or 34' and the cleavable second primer 36 or 36' are oligonucleotide pairs, e.g., where the un-cleavable first primer 34 or 34' is a forward amplification primer and the cleavable second primer 36 or 36' is a reverse amplification primer or where the cleavable second primer 36 or 36' is the forward amplification primer and the un-cleavable first primer 34 or 34' is the reverse amplification primer. In each example of the first primer set 30A, 30B, 30C, and 30D the cleavable second primer 36 or 36' includes a cleavage site 42, while the un-cleavable first primer 34 or 34' does not include a cleavage site 42.

The cleavable first primer 38 or 38' and the un-cleavable second primer 40 or 40' are also oligonucleotide pairs, e.g., where the cleavable first primer 38 or 38' is a forward amplification primer and the un-cleavable second primer 40 or 40' is a reverse amplification primer or where the un-cleavable second primer 40 or 40' is the forward amplification primer and the cleavable first primer 38 or 38' is the reverse amplification primer. In each example of the second primer set 32A, 32B, 32C, and 32D, the cleavable first primer 38 or 38' includes a cleavage site 42' or 44, while the un-cleavable second primer 40 or 40' does not include a cleavage site 42' or 44.

It is to be understood that the un-cleavable first primer 34 or 34' of the first primer set 30A, 30B, 30C, and 30D and the cleavable first primer 38 or 38' of the second primer set 32A, 32B, 32C, and 32D have the same nucleotide sequence (e.g., both are forward amplification primers), except that the cleavable first primer 38 or 38' includes the cleavage site 42' or 44 integrated into the nucleotide sequence or into a linker 46' attached to the nucleotide sequence. Similarly, the cleavable second primer 36 or 36' of the first primer set 30A, 30B, 30C, and 30D and the un-cleavable second primer 40 or 40' of the second primer set 32A, 32B, 32C, and 32D have the same nucleotide sequence (e.g., both are reverse amplification primers), except that the cleavable second primer 36 or 36' includes the cleavage site 42 integrated into the nucleotide sequence or into a linker 46 attached to the nucleotide sequence.

It is to be understood that when the first primers 34 and 38 or 34' and 38' are forward amplification primers, the second primers 36 and 40 or 36' and 40' are reverse primers, and vice versa.

The un-cleavable primers 34, 40 or 34', 40' may be any primers with a universal sequence for capture and/or amplification purposes, such as the P5 and P7 primers (without the respective cleavage sites) or any combination of the PA, PD, PC, PD primers (e.g., PA and PB or PA and PD, etc.). In some examples, the P5 and P7 primers are un-cleavable primers 34, 40 or 34', 40' because they do not include a cleavage site 42, 42', 44. It is to be understood that any suitable universal sequence can be used as the un-cleavable primers 34, 40 or 34', 40'.

Examples of cleavable primers 36, 38 or 36', 38' include the P5 and P7 primers or other universal sequence primers (e.g., the PA, PB, PC, PD primers with cleavage sites) with the respective cleavage sites 42, 42', 44 incorporated into the respective nucleic acid sequences (e.g., FIG. 2A and FIG. 2C), or into a linker 46', 46 that attaches the cleavable primers 36, 38 or 36', 38' to the respective functionalized layers 24, 26 (FIG. 2B and FIG. 2D). Examples of suitable cleavage sites 42, 42', 44 include enzymatically cleavable nucleobases or chemically cleavable nucleobases, modified nucleobases, or linkers (e.g., between nucleobases), as described herein.

Each primer set 30A and 32A or 30B and 32B or 30C and 32C or 30D and 32D is attached to a respective functionalized layer 24, 26. As described herein, the functionalized layer 24, 26 may include different functional groups that can selectively react with the respective primers 34, 36 or 34', 36' or 38, 40 or 38', 40', or may include the same functional groups and the respective primers 34, 36 or 34', 36' or 38, 40 or 38', 40' may be sequentially attached as described in some of the methods.

While not shown in FIG. 2A through FIG. 2D, it is to be understood that one or both of the primer sets 30A, 30B, 30C, 30D or 32A, 32B, 32C or 32D may also include a PX primer for capturing a library template seeding molecule. As one example, PX may be included with the primer set 30A, 30B, 30C, 30D, but not with primer set 32A, 32B, 32C or 32D. As another example, PX may be included with the primer set 30A, 30B, 30C, 30D and with the primer set 32A, 32B, 32C or 32D. The density of the PX motifs should be relatively low in order to minimize polyclonality within each depression 20, 20'.

The PX capture primers may be:

```
PX 5'→3'
                                    (SEQ. ID. NO. 13)
AGGAGGAGGAGGAGGAGGAGGAGG cPX (PX') 5'→3'
                                    (SEQ. ID. NO. 14)
CCTCCTCCTCCTCCTCCTCCTCCT
```

FIG. 2A through FIG. 2D depict different configurations of the primer sets 30A, 32A, 30B, 32B, 30C, 32C, and 30D, 32D attached to the functionalized layers 24, 26. More specifically, FIG. 2A through FIG. 2D depict different configurations of the primers 34, 36 or 34', 36' and 38, 40 or 38', 40' that may be used.

In the example shown in FIG. 2A, the primers 34, 36 and 38, 40 of the primer sets 30A and 32A are directly attached to the functionalized layers 24, 26, for example, without a linker 46, 46'. The functionalized layer 24 has surface functional groups that can immobilize the terminal groups at the 5' end of the primers 34, 36. Similarly, the functionalized layer 26 has surface functional groups that can immobilize the terminal groups at the 5' end of the primers 38, 40. The immobilization chemistry between the functionalized layer 24 and the primers 34, 36 and the immobilization chemistry between the functionalized layer 26 and the primers 38, 40 may be different so that the primers 34, 36 or 38, 40 selectively attach to the desirable functionalized layer 24, 26. Alternatively, the primers 34, 36 or 38, 40 may be pre-grafted or sequentially applied via some of the methods disclosed herein.

Also, in the example shown in FIG. 2A, the cleavage site 42, 42' of each of the cleavable primers 36, 38 is incorporated into the sequence of the primer. In this example, the same type of cleavage site 42, 42' is used in the cleavable primers 36, 38 of the respective primer sets 30A, 32A. As an example, the cleavage sites 42, 42' are uracil bases, and the cleavable primers 36, 38 are P5U (SEQ. ID. NO. 1) and P7U (SEQ. ID. NO. 2 or 3). The uracil bases or other cleavage sites may also be incorporated into any of the PA, PB, PC, and PD primers to generate the cleavable primers 36, 38. In this example, the un-cleavable primer 34 of the oligonucleotide pair 34, 36 may be P7 (SEQ. ID. NO. 2 or 3 without n), and the un-cleavable primer 40 of the oligonucleotide pair 38, 40 may be P5 (SEQ. ID. NO. 1 without U). Thus, in this example, the first primer set 30A includes P7, P5U and the second primer set 32A includes P5, P7U. The primer sets 30A, 32A have opposite linearization chemistries, which, after amplification, cluster generation, and linearization, allows forward template strands to be formed on one functionalized layer 24 and reverse strands to be formed on the other functionalized layer 26.

In the example shown in FIG. 2B, the primers 34', 36' and 38', 40' of the primer sets 30B and 32B are attached to the functionalized layers 24, 26, for example, through linkers 46, 46'. The functionalized layers 24, 26 include respective functional groups, and the terminal ends of the respective linkers 46, 46' are capable of covalently attaching to the respective functional groups. As such, the functionalized layer 24 may have surface functional groups that can immobilize the linker 46 at the 5' end of the primers 34', 36'. Similarly, the functionalized layer 24 may have surface functional groups that can immobilize the linker 46' at the 5' end of the primers 38', 40'. The immobilization chemistry for the functionalized layer 24 and the linkers 46 and the immobilization chemistry for the functionalized layer 26 and the linkers 46' may be different so that the primers 34, 36 or 38, 40 selectively attach to the desirable functionalized layer 24, 26. Alternatively, the primers 34, 36 or 38, 40 may be pre-grafted or sequentially applied via some of the methods disclosed herein.

Examples of suitable linkers 46, 46' may include nucleic acid linkers (e.g., 10 nucleotides or less) or non-nucleic acid linkers, such as a polyethylene glycol chain, an alkyl group or a carbon chain, an aliphatic linker with vicinal diols, a peptide linker, etc. An example of a nucleic acid linker is a polyT spacer, although other nucleotides can also be used. In one example, the spacer is a 6T to 10T spacer. The following are some examples of nucleotides including non-nucleic acid linkers with terminal alkyne groups (where B is the nucleobase and "oligo" is the primer):

linker 46, 46'. The primer 34' is un-cleavable, whereas the primer 38' includes the cleavage site 42' incorporated into the linker 46'. Also in this example, the primers 36', 40' have the same sequence (e.g., P7) aside from the presence or absence of the cleavage site 42 and the same or different linker 46, 46'. The primer 40' in un-cleavable, and the primer 36' includes the cleavage site 42 incorporated into the linker 46. The same type of cleavage site 42, 42' is used in the linker 46, 46' of each of the cleavable primers 36', 38'. As an example, the cleavage sites 42, 42' may be uracil bases that are incorporated into nucleic acid linkers 46, 46'. The primer sets 30B, 32B have opposite linearization chemistries, which, after amplification, cluster generation, and linearization, allows forward template strands to be formed on one functionalized layer 24 and reverse strands to be formed on the other functionalized layer 26.

The example shown in FIG. 2C is similar to the example shown in FIG. 2A, except that different types of cleavage sites 42, 44 are used in the cleavable primers 36, 38 of the respective primer sets 30C, 32C. As examples, two different enzymatic cleavage sites may be used, two different chemical cleavage sites may be used, or one enzymatic cleavage site and one chemical cleavage site may be used. Examples of different cleavage sites 42, 44 that may be used in the respective cleavable primers 36, 38 include any combination of the following: vicinal diol, uracil, allyl ether, disulfide, restriction enzyme site, and 8-oxoguanine.

The example shown in FIG. 2D is similar to the example shown in FIG. 2B, except that different types of cleavage sites 42, 44 are used in the linkers 46, 46' attached to the cleavable primers 36', 38' of the respective primer sets 30D,

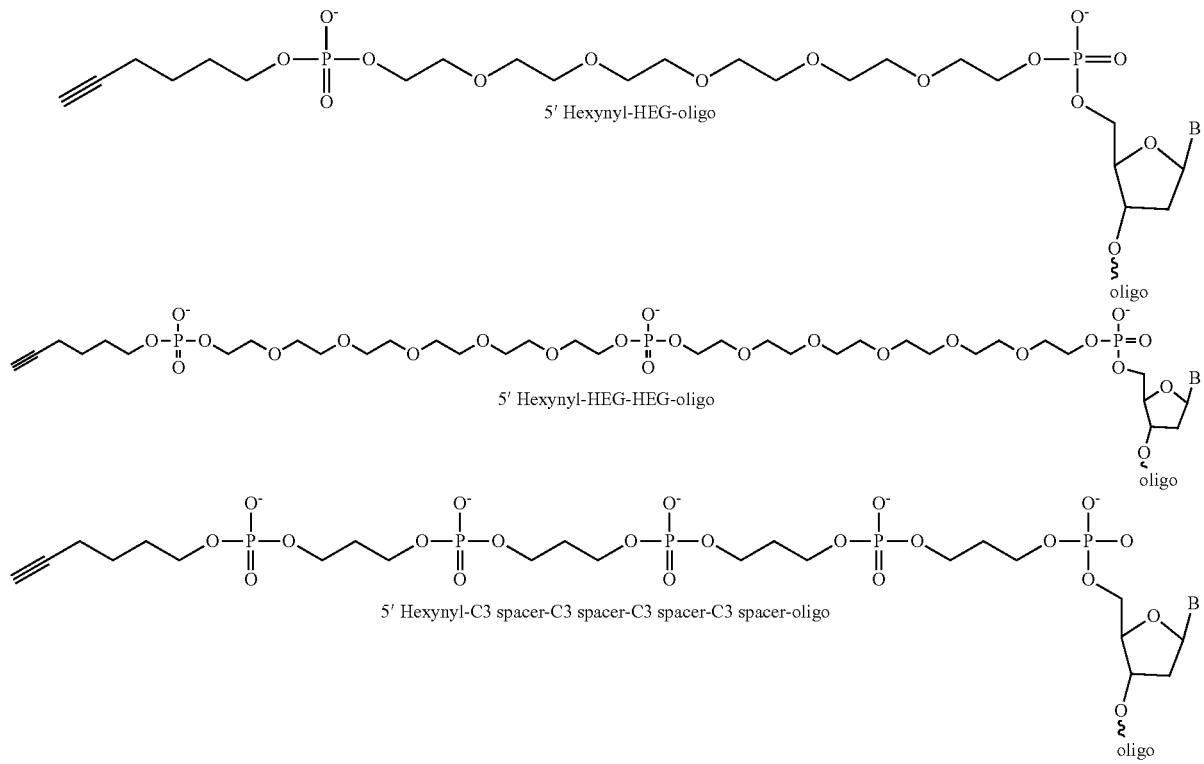

In the example shown in FIG. 2B, the primers 34', 38' have the same sequence (e.g., P5) aside from the presence or absence of the cleavage site 42' and the same or different 32D. Examples of different cleavage sites 42, 44 that may be used in the respective linkers 46, 46' attached to the cleavable primers 36', 38' include any combination of the following: vicinal diol, uracil, allyl ether, disulfide, restriction enzyme site, and 8-oxoguanine.

In any of the examples using the primer set 29 or the primer sets 30, 32, the attachment of the primers 31, 33 or 34, 36 and 38, 40 or 34', 36' and 38', 40' to the functionalized layer(s) 24, 26 and/or functionalized layer pads 28 leaves a template-specific portion of the primers 31, 33 or 34, 36 and 38, 40 or 34', 36' and 38', 40' free to anneal to its cognate template and the 3' hydroxyl group free for primer extension.

Different methods may be used to generate the flow cell architectures disclosed herein. The various methods will now be described.

Methods for Making the Flow Cell Architecture with a Metal Film

Some examples of the methods disclosed herein use a sputtered or thermally evaporated metal film to create a mask that is used to pattern a light sensitive material, which, in turn, is used to pattern the functionalized layer(s) 24, 26 and/or pad 28. These methods generally include sputtering or thermally evaporating a metal material over a transparent substrate including depressions 20, 20' separated by interstitial regions 22, thereby forming a metal film having a first thickness over the interstitial regions 22 and having a second thickness over the depressions 20, 20', the second thickness being about 30 nm or less and being at least 10 nm thinner than the first thickness; depositing a light sensitive material over the metal film; utilizing the metal film to develop the light sensitive material through the transparent substrate (e.g., 14, 16) to define an altered light sensitive material at a first predetermined region over the transparent substrate; and utilizing the altered light sensitive material to generate a functionalized layer 24, 26 or functionalize layer pad 28 at the first predetermined region or at a second predetermined region over the transparent substrate.

In these example methods, the transparent substrate is either the single layer base support 14 or the multi-layered structure 16 as described herein. Both of these structures 14, 16 are capable transmitting the light that is used to pattern the light sensitive material and that is used in nucleic acid sequencing. While the multi-layered structure 16 may be used, the series of FIGS. 3 through 11) illustrate the resin layer 18, but not the underlying base support 17.

The series of figures from FIG. 3A-FIG. 3F through FIG. 6A-FIG. 6E depict the single layer base support 14 or the resin layer 18 of the multi-layered structure 16 having the depression 20 defined therein. The depression 20 may be etched, imprinted, or otherwise defined in the single layer base support 14 or the resin layer 18 using any suitable technique. In one example, nanoimprint lithography is used. In this example, a working stamp is pressed into the single layer base support 14 or the resin layer 18 while the material is soft, which creates an imprint of the working stamp features in the single layer base support 14 or the resin layer 18. The single layer base support 14 or the resin layer 18 may then be cured with the working stamp in place.

Curing may be accomplished by exposure to actinic radiation, such as visible light radiation or ultraviolet (UV) radiation, when a radiation-curable resin material is used; or by exposure to heat when a thermal-curable resin material is used. Curing may promote polymerization and/or cross-linking. As an example, curing may include multiple stages, including a softbake (e.g., to drive off any liquid carrier that may be used to deposit the resin) and a hardbake. The softbake may take place at a lower temperature, ranging from about 50° C. to about 150° C. The duration of the hardbake may last from about 5 seconds to about 10 minutes at a temperature ranging from about 100° C. to about 300° C. Examples of devices that can be used for softbaking and/or hardbaking include a hot plate, oven, etc.

After curing, the working stamp is released. This creates topographic features (e.g., the depression 20) in the single layer base support 14 or the resin layer 18.

In the series of figures from FIG. 3A-FIG. 3F through FIG. 6A-FIG. 6E, a metal material is sputter coated or thermally evaporated on the surface of the single layer base support 14 or the resin layer 18. During sputtering, the metal material is deposited at an angle (e.g., 45° or 60°) relative to the surface. This creates a shadow effect in the depression 20 where less or no metal material is deposited in an area of the depression 20 that is transverse to the incoming metal material. Thus, the transparent substrate (e.g., single layer base support 14 or multi-layered structure 16) is rotated throughout sputtering to introduce the metal material to these area(s) of the depression 20. As the metal material continues to be applied to the interstitial regions 22 as the substrate is rotated, this process deposits more of the metal material on the interstitial regions 22 and less of the metal material in the depressions 20 due, at least in part, to the shadow effect. The pressure may also be adjusted during sputtering. Low pressure (about 5 mTorr or less) renders sputtering more directional, which maximizes the shadow effect. A similar effect may be achieved with thermal evaporation (e.g., using low pressure), and thus this technique may be used instead of sputtering to create the metal film 48. Thus, as a result of sputtering or thermal evaporation, a metal film 48 (see FIG. 3A, FIG. 4A, FIG. 5A, FIG. 6A) is generated having a first thickness $T_1$ over the interstitial regions 22 and having a second thickness $T_2$ over the depressions 20. Sputtering or thermal evaporation is controlled so that the second thickness $T_2$ is about 30 nm or less and is at least 10 nm thinner than the first thickness $T_1$. The second thickness $T_2$ enables UV light to transmit through the metal film 48 at the thinner portion, while the first thickness $T_1$ is sufficient to block UV light from transmitting through the metal film 48 at the thicker portion.

As mentioned, the second thickness $T_2$ is about 30 nm or less and is at least 10 nm thinner than the first thickness $T_1$. In some examples, the second $T_2$ is 20 nm or less (which provides desirable UV transmittance). As such, in some instances, $T_2 \leq 20 \leq T_1 - 10$ nm. In one example, the first thickness $T_1$ is about 30 nm and the second thickness $T_2$ is at least 10 nm thinner (e.g., 20 nm or less (e.g., 8.5 nm, 15 nm, etc.)). As other examples, $T_1=40$ nm and $T_2=30$ nm; =15 nm and $T_2=5$ nm; $T_1=20$ nm and $T_2=10$ nm; and $T_1=25$ nm and $T_2=15$ nm.

The metal material used to form the metal film 48 may be titanium, chromium, aluminum, gold, or copper. In some examples, the metal material may be at least substantially pure (<99% pure). In other examples, molecules or compounds of the listed elements may be used as long as the metal film 48 is i) opaque (non-transparent or having transmittance less than 0.25) to the light energy used for light sensitive material alteration in the thick regions and ii) transparent (having transmittance greater than 0.25) to the light energy used for light sensitive material alteration in the thin regions. For example, oxides of any of the listed metals (e.g., aluminum oxide, zinc oxide, titanium dioxide, etc.) may be used, alone or in combination with the listed metal. As a result of sputtering or thermal evaporation, the metal film 48 having varying thicknesses $T_1$, $T_2$ is positioned over the single layer base support 14 or the resin layer 18, as shown in each of FIG. 3A, FIG. 4A, FIG. 5A, and FIG. 6A.

Figure 3A:
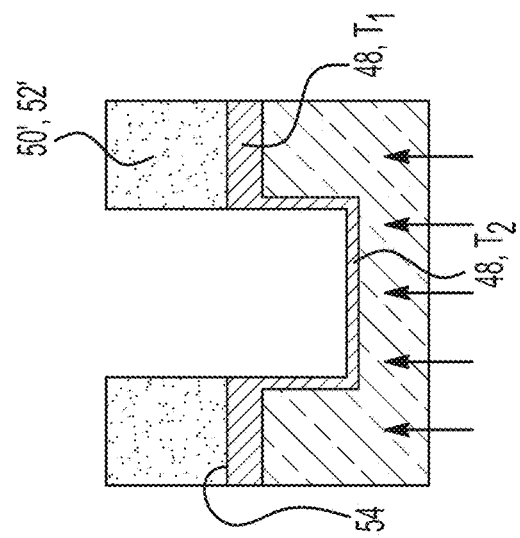
FIG. 3A through FIG. 3F are schematic views that together illustrate an example of a method using a sputtered or thermally evaporated metal film to create a mask that is used to pattern one example of a flow cell architecture including a depression.
Figure 3C:
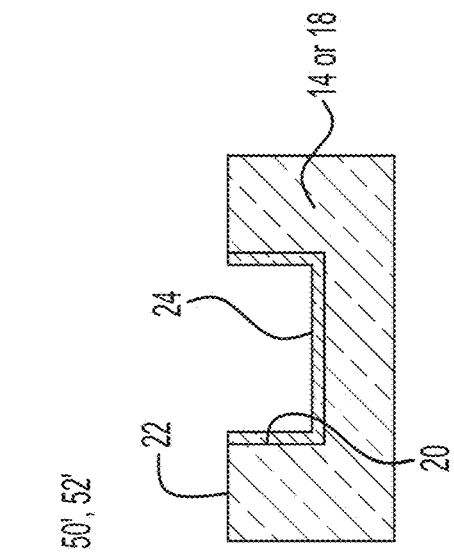
Figure 3B:
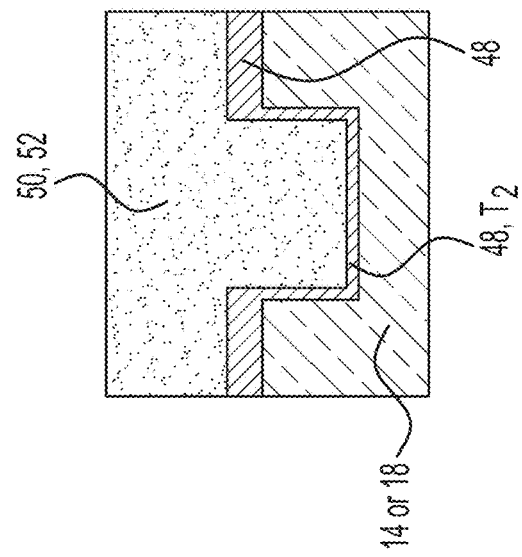
Figure 3E:
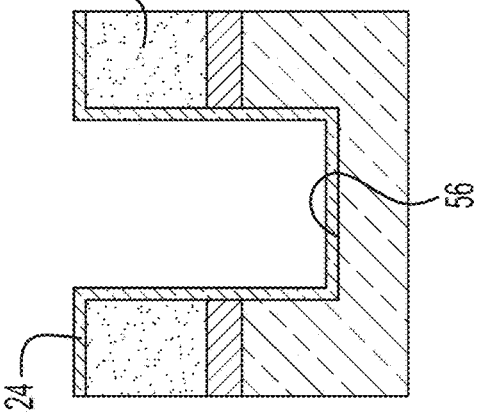

In the method of FIG. 3A through FIG. 3F, the light sensitive material 50 is a positive photoresist 52; the positive photoresist 52 is deposited in direct contact with the metal film 48; utilizing the metal film 48 to develop the light sensitive material 50 involves exposing the positive photoresist 52 to light through the transparent substrate 14, 16, whereby portions of the positive photoresist 52 overlying the depressions 20 become soluble, and portions of the positive photoresist 52 overlying the interstitial regions 22 define an insoluble positive photoresist 52'; the insoluble positive photoresist 52' is the altered light sensitive material 50'; the interstitial regions 22 are the first predetermined region 54 (see FIG. 3C, where the altered light sensitive material 50' is formed); and the depressions 20 are the second predetermined region 56 (see FIG. 3E, where the functionalized layer 24 is formed).

As shown in FIG. 3B, the positive photoresist 52 is deposited on the metal film 48. Any of the deposition techniques described herein may be used.

Examples of suitable positive photoresists 52 include the MICROPOSIT® S1800 series or the AZ® 1500 series, both of which are available from Kayaku Advanced Materials, Inc. Another example of a suitable positive photoresist is SPR™-220 (from DuPont). When a positive photoresist 52 is used, selective exposure to certain wavelengths of light form a soluble region (e.g., which is at least 95% soluble in a developer), and the developer is used to remove the soluble regions. Those portions of the positive photoresist 52 not exposed to light will become insoluble in the developer. Examples of suitable developers for the positive photoresist 52 include aqueous-alkaline solutions, such as diluted sodium hydroxide, diluted potassium hydroxide, or an aqueous solution of the metal ion free organic TMAH (tetramethylammoniumhydroxide).

In this example, utilizing the metal film 48 to develop the light sensitive material 50 (e.g., positive photoresist 52) involves exposing the positive photoresist 52 to light (e.g., ultraviolet light) through the transparent substrate 14, 16. The thicker metal film 48 (having thickness $T_1$) blocks at least 75% of light that is transmitted through the transparent substrate 14, 16 from reaching the positive photoresist 52 that is positioned directly in line with the thicker metal film 48, $T_1$. As such, these portions become the insoluble portions 50', 52', as shown in FIG. 3C. In contrast, the UV light is able to transmit through the thinner metal film 48 (having thickness $T_2$), and thus portions of the positive photoresist 52 overlying the depressions 20 become soluble. The soluble portions are removed, e.g., with the developer, to reveal the thinner metal film 48, $T_2$ present in the depressions 20. The resulting structure is shown in FIG. 3C.

Figure 3D:
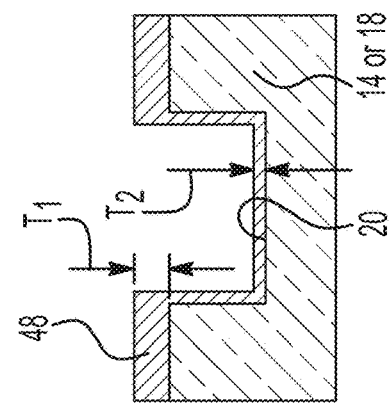
Figure 3F:
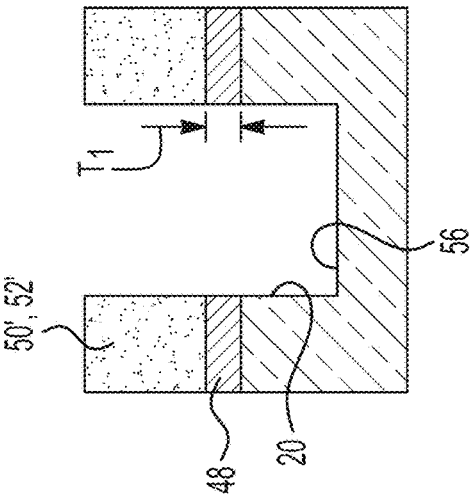

The altered light sensitive material 50' (e.g., insoluble positive photoresist 52') is then used to generate the functionalized layer 24 at the second predetermined region 56. This involves: etching the metal film 48 from the depressions 20 (FIG. 3D); depositing the functionalized layer 24 over the insoluble positive photoresist 52' and the depressions 20 (FIG. 3E); and removing the insoluble positive photoresist 52' and the metal film 48 (FIG. 3F).

Dry etching of the metal film 48 from the depressions 20 may involve reactive ion etching with $BCl_3+Cl_2$. The dry etching process may be stopped when the surface of the support 14 or resin layer 18 is exposed. This process exposes the second predetermined region 56 where the functionalized layer 24 will be formed. The removal of the metal film 48 from the depressions 20 is shown in FIG. 3D. Wet etching of the metal film 48 from the depressions 20 may also be used. Wet etching of an aluminum metal film 48 may be performed using acidic or basic conditions, wet etching of a copper metal film 48 may be performed using $FeCl_3$ or an iodine and iodide solution, wet etching of a gold metal film 48 may be performed using an iodine and iodide solution, and wet etching of a titanium metal film 48 may be performed using $H_2O_2$. In these examples, the support 14 or resin layer 18 acts as an etch stop for the etching process.

If the base support 14 or resin layer 18 does not include surface groups to covalently attach to the functionalized layer 24, the base support 14 or resin layer 18 may first be activated, e.g., through silanization or plasma ashing. If the base support 14 or resin layer 18 does include surface groups to covalently attach to the functionalized layer 24, the activation process is not performed.

The functionalized layer 24 is then deposited over the insoluble positive photoresist 52' and the depression 20. The functionalized layer 24 may be any of the gel materials described herein and may be applied using any suitable method. A curing process may be performed after deposition. The functionalized layer 24 covalently attaches to the base support 14 or resin layer 18 in the depression 20. The deposited functionalized layer 24 is shown in FIG. 3E.

The insoluble positive photoresist 52' and the metal film 48 may then be removed from the interstitial regions 22. The insoluble positive photoresist 52' may be lifted off with a remover, such as dimethylsulfoxide (DMSO) using sonication, or in acetone, or in propylene glycol monomethyl ether acetate, or with an NMP (N-methyl-2-pyrrolidone) based stripper. The lift-off process removes i) at least 99% of the insoluble positive photoresist 52' and ii) the functionalized layer 24 positioned thereon. The metal film 48 may also be lifted off using a suitable stripper for the particular metal. As examples, an aluminum metal film 48 may be removed using a suitable base, such as potassium hydroxide (KOH) or sodium hydroxide (NaOH) and a copper metal film 48 may be removed using $FeCl_3$ or a mixture of iodine and iodide. After each of these removal processes, the functionalized layer 24 in the depression 20 remains intact, at least in part because it is covalently attached to the base support 14 or resin layer 18.

While not shown, this method also includes attaching the primer set 29 to the functionalized layer 24. In some examples, the primers 31, 33 (not shown in FIG. 3A through FIG. 3F) may be pre-grafted to the functionalized layer 24. In these examples, additional primer grafting is not performed.

In other examples, the primers 31, 33 are not pre-grafted to the functionalized layer 24. In these examples, the primers 31, 33 may be grafted after the functionalized layer 24 is applied (e.g., at FIG. 3E or at FIG. 3F).

When grafting is performed during the method, grafting may be accomplished using any suitable grafting techniques. As examples, grafting may be accomplished by flow through deposition (e.g., using a temporarily bound lid), dunk coating, spray coating, puddle dispensing, or by another suitable method. Each of these example techniques may utilize a primer solution or mixture, which may include the primer(s) 31, 33, water, a buffer, and a catalyst. With any of the grafting methods, the primers 31, 33 attach to the reactive groups of the functionalized layer 24, and have no affinity for the interstitial regions 22 (if exposed, as shown in FIG. 3F).

While a single depression 20 and functionalized layer 24 are shown in FIG. 3F, it is to be understood that the method described in reference to FIG. 3A through 3F may be performed to generate an array of functionalized depressions, separated by interstitial regions 22, across the surface of the base support 14 or resin layer 18.

In the method of FIG. 4A through FIG. 4G, the light sensitive material 50 is a negative photoresist 60; the negative photoresist 60 is deposited in direct contact with the functionalized layer 24 (see FIG. 4D); utilizing the metal film 48 to develop the light sensitive material 50 involves exposing the negative photoresist 60 to light through the transparent substrate 14 or 16, whereby portions of the negative photoresist 60 overlying the depressions 20 define an insoluble negative photoresist 60', and portions of the negative photoresist 60 overlying the interstitial regions 22 become soluble; the insoluble negative photoresist 60' is the altered light sensitive material 50'; and the depressions 20 are the first predetermined region 54 (see FIG. 4E, where the altered light sensitive material 50' is formed); and the depressions 20 are (also) the second predetermined region 56 (see FIG. 4F, where the altered light sensitive material 50' and the functionalized layer 24 are formed).

In this example method, as shown in FIG. 4B and FIG. 4C, prior to depositing the light sensitive material 50 over the metal film 48, the method further includes depositing a protective layer 58 in direct contact with the metal film 48; and depositing the functionalized layer 24 in direct contact with the protective layer 58.

The protective layer 58 may be any inorganic material that has high resistance to degradation from the chemicals used in nucleic acid sequencing (thus keeping the underlying metal film 48 from being exposed) and also has or can be activated to have good adhesion to the functionalized layer 24. In one example, the protective layer 58 is an inorganic material including surface groups to attach to the functionalized layer 24. One example of this protective layer 58 is silicon dioxide. In another example, the protective layer 58 is an inorganic material that does not include surface groups to attach to the functionalized layer 24, and the method further includes activating the protective layer 58 by silanization or plasma ashing, thus introducing surface groups to attach to the functionalized layer 24. For example, the protective layer 58 is $Ta_2O_5$, which can be silanized to generate surface groups to react with the functionalized layer 24; or a polyhedral oligomeric silsesquioxane based resin, which can be plasma ashed or silanized to generate surface groups to react with the functionalized layer 24. The protective layer 58 may be deposited using any suitable technique, and coats the metal film 48 as shown in FIG. 4B.

The functionalized layer 24 is then deposited over the protective layer 58. The functionalized layer 24 may be any of the gel materials described herein and may be applied using any suitable method. A curing process may be performed after deposition. The functionalized layer 24 covalently attaches to the protective layer 58 (due to the inherent or generated surface groups). The deposited functionalized layer 24 is shown in FIG. 4C.

As shown in FIG. 4D, the negative photoresist 60 is deposited on the functionalized layer 24. Any of the deposition techniques described herein may be used.

An example of a suitable negative photoresist 60 includes the NR® series photoresist (available from Futurrex). Other suitable negative photoresists 54 include the SU-8 Series and the KMPR® Series (both of which are available from Kayaku Advanced Materials, Inc.), or the UVN™ Series (available from DuPont). When the negative photoresist 60 is used, it is selectively exposed to certain wavelengths of light to form an insoluble negative photoresist 60', and is exposed to a developer to remove soluble portions (e.g., those portions that are not exposed to the certain wavelengths of light). Examples of suitable developers for the negative photoresist 60 include aqueous-alkaline solutions, such as diluted sodium hydroxide, diluted potassium hydroxide, or an aqueous solution of the metal ion free organic TMAH (tetramethylammoniumhydroxide).

In this example, utilizing the metal film 48 to develop the light sensitive material 50 (e.g., negative photoresist 60) involves exposing the negative photoresist 60 to light (e.g., ultraviolet light) through the transparent substrate 14, 16. The thicker metal film 48 (having thickness $T_1$) blocks at least 75% of light that is transmitted through the transparent substrate 14, 16 from reaching the negative photoresist 60 that is positioned directly in line with the thicker metal film 48, $T_1$. As such, these portions become soluble. The soluble portions are removed, e.g., with the developer, to reveal the functionalized layer 24 over the interstitial regions 22. In contrast, the UV light is able to transmit through the thinner metal film 48 (having thickness $T_2$), and thus portions of the negative photoresist 60 overlying the depressions 20 become insoluble. The resulting structure is shown in FIG. 4E.

The altered light sensitive material 50' (e.g., insoluble negative photoresist 60') is then used to generate the functionalized layer 24 at the first predetermined region 54. This involves dry etching the functionalized layer 24, the protective layer 58, and the metal film 48 from the interstitial regions 22; and removing the insoluble negative photoresist 60'.

The dry etching or ashing process that is used to remove the functionalized layer 24 and the protective layer 58 from the interstitial regions 22 may be performed with plasma, such as 100% $O_2$ plasma, air plasma, argon plasma, etc. This process may also be used to remove the metal film 48. Alternatively, the dry etching process that is used to remove the metal film 48 from the interstitial regions 22 may be reactive ion etching with $BCl_3+Cl_2$.

Removal of the insoluble negative photoresist 60' may then be performed to expose the functionalized layer 24 in the depression 20. While the insoluble negative photoresist 60' is not soluble in the developer, it is soluble (at least 99% soluble) in a remover. Suitable removers include dimethylsulfoxide (DMSO) using sonication, or in acetone, or with an NMP (N-methyl-2-pyrrolidone) based stripper.

While not shown, this method also includes attaching the primer set 29 to the functionalized layer 24. In some examples, the primers 31, 33 (not shown in FIG. 4A through FIG. 4G) may be pre-grafted to the functionalized layer 24. In these examples, additional primer grafting is not performed.

In other examples, the primers 31, 33 are not pre-grafted to the functionalized layer 24. In these examples, the primers 31, 33 may be grafted after the functionalized layer 24 is applied or re-exposed (e.g., at FIG. 4C or at FIG. 4G).

When grafting is performed during the method, grafting may be accomplished using any suitable grafting techniques. As examples, grafting may be accomplished by flow through deposition (e.g., using a temporarily bound lid), dunk coating, spray coating, puddle dispensing, or by another suitable method. Each of these example techniques may utilize a primer solution or mixture, which may include the primer(s) 31, 33, water, a buffer, and a catalyst. When grafting is performed after the insoluble negative photoresist 60' is removed, the primers 31, 33 attach to the reactive groups of the functionalized layer 24 in the depression 20, and have no affinity for the interstitial regions 22.

While a single depression 20 and functionalized layer 24 are shown in FIG. 4G, it is to be understood that the method described in reference to FIG. 4A through 4G may be performed to generate an array of functionalized depressions, separated by interstitial regions 22, across the surface of the base support 14 or resin layer 18.

In the method of FIG. 5A through FIG. 5E, prior to depositing the light sensitive material 50 over the metal film 48, the method further includes depositing a transparent resin 62 in direct contact with the metal film 48. Any example of the materials set forth herein for the resin layer 18 may be used as the transparent resin 62, and may be deposited at a thickness that enables the light (used for light sensitive material 50 patterning) to be transmitted therethrough.

The transparent resin 62 may be deposited using any suitable technique disclosed herein. For some deposition techniques, the resin may be mixed in a liquid carrier, such as propylene glycol monomethyl ether acetate (PGMEA), toluene, dimethyl sulfoxide (DMSO), tetrahydrofuran (THF), etc. The transparent resin 62 may be spun on or otherwise deposited and then cured. Curing may be accomplished by exposure to actinic radiation, such as visible light radiation or ultraviolet (UV) radiation, when a radiation-curable resin material is used; or by exposure to heat when a thermal-curable resin material is used.

The transparent resin 62 may be activated using silanization or plasma ashing to generate surface groups that can react with the functionalized layer 24.

After the transparent resin 62 is generated, the light sensitive material 50 is deposited and patterned. In this example, the light sensitive material 50 is a positive photoresist 52; the positive photoresist 52 is deposited in direct contact with the transparent resin 62 (FIG. 5B); and utilizing the metal film 48 to develop the light sensitive material 50 involves exposing the positive photoresist 52 to light through the transparent substrate 14 or 18, whereby portions of the positive photoresist 52 overlying the depressions 20 becomes soluble, and portions of the positive photoresist 52 overlying the interstitial regions 22 define an insoluble positive photoresist 52'; the insoluble positive photoresist 52' is the altered light sensitive material 50'; portions of the transparent resin 62 overlying the interstitial regions 22 are the first predetermined region 54 (see FIG. 5C, where the altered light sensitive material 50' is formed); and portions of the transparent resin 62 overlying the depressions 20 are the second predetermined region 56 (see FIG. 5D, where the functionalized layer 24 is formed).

In this example, utilizing the metal film 48 to develop the light sensitive material 50 (e.g., positive photoresist 52) involves exposing the positive photoresist 52 to light (e.g., ultraviolet light) through the transparent substrate 14, 16. The thicker metal film 48 (having thickness $T_1$) blocks at least 75% of light that is transmitted through the transparent substrate 14, 16 from reaching the positive photoresist 52 that is positioned directly in line with the thicker metal film 48, $T_1$. As such, these portions become the insoluble portions 50', 52', as shown in FIG. 5C. In contrast, the UV light is able to transmit through the thinner metal film 48 (having thickness $T_2$), and thus portions of the positive photoresist 52 overlying the depressions 20 become soluble. The soluble portions are removed, e.g., with the developer, to reveal a portion of the transparent resin 62. This portion is the second predetermined region 56. The resulting structure is shown in FIG. 5C.

In this example method, utilizing the altered light sensitive material 50' to generate the functionalized layer (which, in this example is the functionalized layer pad 28 (see FIG. 5E)) at the second predetermined region 56 involves: depositing the functionalized layer 24 over the insoluble positive photoresist 52' and the second predetermined region 56; and removing the insoluble positive photoresist 52'.

The functionalized layer 24 is deposited over the insoluble positive photoresist 52' and the second predetermined region 56, which, in this example is the exposed portion of the transparent resin 62. The functionalized layer 24 may be any of the gel materials described herein and may be applied using any suitable method. A curing process may be performed after deposition. The functionalized layer 24 covalently attaches to the transparent resin 62. The deposited functionalized layer 24 is shown in FIG. 5D.

The insoluble positive photoresist 52' may then be removed. The insoluble positive photoresist 52' may be lifted off with a remover, such as dimethylsulfoxide (DMSO) using sonication, or in acetone, or in propylene glycol monomethyl ether acetate, or with an NMP (N-methyl-2-pyrrolidone) based stripper. The lift-off process removes i) at least 99% of the insoluble positive photoresist 52' and ii) the functionalized layer 24 positioned thereon. After photoresist removal, functionalized layer pads 28 separated by interstitial regions 22' (of the transparent resin 62) are formed.

While not shown, this method also includes attaching the primer set 29 to the functionalized layer pad 28. In some examples, the primers 31, 33 (not shown in FIG. 5A through FIG. 5E) may be pre-grafted to the functionalized layer 24, and thus to the functionalized layer pads 28. In these examples, additional primer grafting is not performed.

In other examples, the primers 31, 33 are not pre-grafted to the functionalized layer 24. In these examples, the primers 31, 33 may be grafted after the functionalized layer 24 is applied (e.g., at FIG. 5D) or after the functionalized layer pad 28 is formed (e.g., at FIG. 5E).

When grafting is performed during the method, grafting may be accomplished using any suitable grafting techniques. As examples, grafting may be accomplished by flow through deposition (e.g., using a temporarily bound lid), dunk coating, spray coating, puddle dispensing, or by another suitable method. Each of these example techniques may utilize a primer solution or mixture, which may include the primer(s) 31, 33, water, a buffer, and a catalyst. When the primers 31, 33 are attached to the functionalized layer pad 28 (FIG. 5E), the primers 31, 33 attach to the reactive groups of the functionalized layer pad 28, and have no affinity for the interstitial regions 22'.

While a single functionalized layer pad 28 is shown in FIG. 5E, it is to be understood that the method described in reference to FIG. 5A through FIG. 5E may be performed to generate an array of functionalized layer pads 28 (see, e.g., FIG. 1D), separated by interstitial regions 22', across the surface of the base support 14 or resin layer 18.

The method shown in FIG. 6A through FIG. 6E uses an example of the protective layer 58' and a light curable resin 64. In this example, the light curable resin 64 is the light sensitive material 50.

As shown in FIG. 6B and FIG. 6C, prior to depositing the light sensitive material 50 over the metal film 48, the method further includes depositing a protective layer 58' in direct contact with the metal film 48. In this example, the protective layer 58' may be any inorganic material that has high resistance to degradation from the chemicals used in nucleic acid sequencing (thus keeping the underlying metal film 48 from being exposed) and also has poor adhesion to the functionalized layer 24. Examples of the protective layer 58' include tantalum pentoxide ($Ta_2O_5$) or another suitable tantalum oxide, fluoroctatrichlorosilane (FOTS), polyethylene glycols, etc.

In this example method, the light sensitive material 50 is the light curable resin 64; the light curable resin 64 is deposited in direct contact with the protective layer 58'; utilizing the metal film 48 to develop the light sensitive material 50 involves exposing the light curable resin 64 to light through the transparent substrate 14, 16, whereby portions of the light curable resin 64 overlying the depressions 20 are cured, and portions of the light curable resin 64 overlying the interstitial regions 22 remain uncured; and the method further comprises removing the uncured portions of the light curable resin 64, thereby exposing the protective layer 58' at the interstitial regions 22.

The light curable resin 64 is any resin material that can be cured with actinic radiation and that includes or can be activated to include surface groups to attach to the functionalized layer 24. In an example, the light curable resin 64 is a polyhedral oligomeric silsesquioxane based resin, which can be plasma ashed or silanized to generate surface groups to react with the functionalized layer 24.

In this example, utilizing the metal film 48 to develop the light sensitive material 50 involves exposing the light curable resin 64 to light (e.g., ultraviolet light) through the transparent substrate 14, 16. The thicker metal film 48 (having thickness $T_1$) blocks at least 75% of light that is transmitted through the transparent substrate 14, 16 from reaching the light curable resin 64 that is positioned directly in line with the thicker metal film 48, $T_1$. As such, these portions remain uncured and are removable. In contrast, the UV light is able to transmit through the thinner metal film 48 (having thickness $T_2$), and thus portions of the light curable resin 64 overlying the depressions 20 become cured (shown at 64' in FIG. 6D). The uncured portions are removed, e.g., with a washing process, to reveal portions of the protective layer 58'. The resulting structure is shown in FIG. 6D.

In this example method, utilizing the altered light sensitive material 50' (in this example, the light curable resin 64) to generate the functionalized layer 24 at the first predetermined region 54 involves depositing the functionalized layer 24, whereby the functionalized layer 24 attaches to the cured portions 64' of the light curable resin 64 and does not attach to the protective layer 58' at the interstitial regions 22.

The functionalized layer 24 is deposited using any suitable method. In this example, the functionalized layer 24 covalently attaches to the cured portions 64' and has no affinity for the exposed protective layer 58'. A curing process may be performed after deposition. The deposited functionalized layer 24 is shown in FIG. 6E.

This method forms an example of the flow cell 10 having protrusions (cured portions 64' of the light curable resin 64) having the functionalized layer 24 thereon. The exposed portions of the protective layer 58' function as interstitial regions 22 separating adjacent functionalized layer 24.

While not shown, this method also includes attaching the primer set 29 to the functionalized layer 24. In some examples, the primers 31, 33 (not shown in FIG. 6A through FIG. 6E) may be pre-grafted to the functionalized layer 24. In these examples, additional primer grafting is not performed.

In other examples, the primers 31, 33 are not pre-grafted to the functionalized layer 24. In these examples, the primers 31, 33 may be grafted after the functionalized layer 24 is applied (e.g., at FIG. 6E).

When grafting is performed during the method, grafting may be accomplished using any suitable grafting techniques. As examples, grafting may be accomplished by flow through deposition (e.g., using a temporarily bound lid), dunk coating, spray coating, puddle dispensing, or by another suitable method. Each of these example techniques may utilize a primer solution or mixture, which may include the primer(s) 31, 33, water, a buffer, and a catalyst. When the primers 31, 33 are attached to the functionalized layer pad 28, the primers 31, 33 attach to the reactive groups of the functionalized layer 24, and have no affinity for the protective layer 58'.

While one protrusion supporting the functionalized layer 24 is shown in FIG. 6E, it is to be understood that the method described in reference to FIG. 6A through 6E may be performed to generate an array of protrusions supporting respective functionalized layers 24, separated by exposed portions of the protective layer 58', across the surface of the base support 14 or resin layer 18.

The series of figures from FIG. 8A-FIG. 8I/FIG. 8J through FIG. 11A-FIG. 11E depict the single layer base support 14 or the resin layer 18 of the multi-layered structure 16 having the depression 20' defined therein. The depression 20' may be etched, imprinted, or otherwise defined in the single layer base support 14 or the resin layer 18 using any suitable technique. FIG. 7 depicts an example of a multi-depth depression 20' defined in the single layer base support 14 or the resin layer 18 of the multi-layered structure 16. The multi-depth depression 20' includes a deep portion 66 and a shallow portion 68 defined by a step portion 70.

In each of the example methods shown in FIG. 8A-FIG. 8I/FIG. 8J through FIG. 11A-FIG. 11E, a metal material is sputter coated or thermally evaporated on the surface of the single layer base support 14 or the resin layer 18. During sputtering, the metal material is deposited at an angle (e.g., 45° or 60°) relative to the surface. This creates a shadow effect in the depression 20' where less or no metal material is deposited in areas of the depression 20' transverse to the incoming metal material. Thus, the transparent substrate (e.g., single layer base support 14 or multi-layered structure 16) is rotated throughout sputtering to introduce the metal material to these area(s) of the multi-depth depression 20'. As the metal material continues to be applied to the interstitial regions 22 as the substrate is rotated, this process deposits more of the metal material on the interstitial regions 22 and less of the metal material in the depressions 20'. A similar effect can be achieved using thermal evaporation. Low pressure may be used in both processes to maximize the effect. Thus, as a result of sputtering or thermal evaporation, a metal film 48 (see FIG. 8A, FIG. 9A, FIG. 10A, and FIG. 11A) is generated having a first thickness $T_1$ over the interstitial regions 22, having a second thickness $T_2$ over the surface 72 in the deep portion 66 of the depression 20', and a third thickness $T_3$ over the surface 74 in the shallow portion 68 of the depression 20'. Thus, in the series of figures from 8 to 11, each of the depressions is a multi-depth depression 20' including a deep portion 66 and a shallow portion 68 adjacent to the deep portion 66; the metal film 48 is generated over the deep portion 66 of each multi-depth depression 20' and the shallow portion 68 of each multi-depth depression 20'; the metal film 48 over the deep portion 66 of each multi-depth depression 20' has the second thickness $T_2$ (which is about 30 nm or less and is at least 10 nm thinner than the first thickness $T_1$); and the metal film 48 over the shallow portion 68 of each multi-depth depression 20' has a third thickness $T_3$ that is less than the first thickness and greater than the second thickness $T_2$. The second thickness $T_2$ enables UV light to transmit through the metal film 48 at the thinner portion, while the first thickness $T_1$ and the third thickness $T_3$ are sufficient to block UV light from transmitting through the metal film 48 at the thicker portions.

Any of the metal materials disclosed herein may be used. As a result of sputtering or thermal evaporation, the metal film 48 having varying thicknesses $T_1$, $T_2$, $T_3$ is positioned over the multi-depth depression 20' of the single layer base support 14 or the resin layer 18, as shown in each of FIG. 8A, FIG. 9A, FIG. 10A, and FIG. 11A.

Two examples of the method are shown in the FIG. 8 series. One method is shown in FIG. 8A through FIG. 8I. The other method is shown in FIG. 8A through FIG. 8F and FIG. 8J through FIG. 8N.

At the outset of the methods shown in the FIG. 8 series, if the base support 14 or resin layer 18 does not include surface groups to covalently attach to the functionalized layer 24, the base support 14 or resin layer 18 may first be activated, e.g., through silanization or plasma ashing. If the base support 14 or resin layer 18 does include surface groups to covalently attach to the functionalized layer 24, the activation process is not performed.

In the methods of FIG. 8A through FIG. 8N, the light sensitive material 50 is a positive photoresist 52; the positive photoresist 52 is deposited in direct contact with the metal film 48; utilizing the metal film 48 to develop the light sensitive material 50 involves exposing the positive photoresist 52 to light through the transparent substrate 14, 16, whereby portions of the positive photoresist 52 overlying the deep portion 66 of each multi-depth depression 20' become soluble, and portions of the positive photoresist 52 overlying the shallow portion 68 and overlying the interstitial regions 22 define an insoluble positive photoresist 52'; the insoluble positive photoresist 52' is the altered light sensitive material 50'; the shallow portion 68 of each multi-depth depression 20' and the interstitial regions 22 are the first predetermined region 54 (see FIG. 8C, where the altered light sensitive material 50' is formed); and the deep portion 66 of each multi-depth depression 20' is the second predetermined region 56 (see FIG. 8F, where the functionalized layer 24 is formed).

As shown in FIG. 8B, the positive photoresist 52 is deposited on the metal film 48. Any of the positive photoresists 52 and any deposition techniques described herein may be used in this example.

In this example, utilizing the metal film 48 to develop the light sensitive material 50 (e.g., positive photoresist 52) involves exposing the positive photoresist 52 to light (e.g., ultraviolet light) through the transparent substrate 14, 16. The thicker portions of the metal film 48 (having thickness $T_1$ or thickness $T_3$) block at least 75% of light that is transmitted through the transparent substrate 14, 16 from reaching the positive photoresist 52 that is positioned directly in line with the thicker metal film 48, $T_1$, $T_3$. As such, these portions become the insoluble portions 50', 52', as shown in FIG. 8C. In contrast, the UV light is able to transmit through the thinner metal film 48 (having thickness $T_2$), and thus portions of the positive photoresist 52 overlying the deep portion 66 of the depressions 20' become soluble. The soluble portions are removed, e.g., with the developer, to reveal the thinner metal film 48, $T_2$ present in the depressions 20'. The resulting structure is shown in FIG. 8C.

The altered light sensitive material 50' (e.g., insoluble positive photoresist 52') is then used to generate the functionalized layer 24 at the second predetermined region 56. This involves: etching the metal film 48 from the deep portion 66 of each multi-depth depression 20' (FIG. 8D); and depositing the functionalized layer 24 over the insoluble positive photoresist 52' and the deep portion 66 of each depression 20' (FIG. 8E).

The metal film 48 may be removed from the surface 72 in the deep portion 66 using dry or wet etching. Dry etching of the metal film 48 from the deep portion 66 may involve reactive ion etching with $BCl_3+Cl_2$. The dry etching process may be stopped when the surface of the support 14 or resin layer 18 is exposed. Wet etching of an aluminum metal film 48 may be performed using acidic or basic conditions, and wet etching of a copper metal film 48 may be performed using $FeCl_3$ or an iodine and iodide solution. In these examples, the support 14 or layer 18 acts as an etch stop for the etching process. The etching process exposes the surface 72 of support 14 or layer 18 that is located in the deep portion 66. In this example, the surface 72 is the second predetermined region 56 where the functionalized layer 24 will be formed. The removal of the metal film 48 from the deep portion 66 is shown in FIG. 8D.

The functionalized layer 24 is then deposited over the insoluble positive photoresist 52' and the deep portion 66 of the depression 20'. The functionalized layer 24 may be any of the gel materials described herein and may be applied using any suitable method. A curing process may be performed after deposition. The functionalized layer 24 covalently attaches to the base support 14 or resin layer 18 in the deep portion 66 of the depression 20'. The deposited functionalized layer 24 is shown in FIG. 8E.

In the example method shown in FIG. 8A through FIG. 8I, the method further includes removing the insoluble positive photoresist 52', thereby exposing the metal film 48 over the shallow portion 68 of each multi-depth depression 20' and over the interstitial regions 22 (FIG. 8F); wet etching the metal film 48 from the shallow portion 68 of each multi-depth depression 20' and from the interstitial regions 22 (FIG. 8G); depositing a second functionalized layer 26 over the shallow portion 68 of each multi-depth depression 20' and over the interstitial regions 22 (FIG. 8H); and polishing the second functionalized layer 26 from the interstitial regions 22 (FIG. 8I).

The insoluble positive photoresist 52' may be lifted off with a remover, such as dimethylsulfoxide (DMSO) using sonication, or in acetone, or in propylene glycol monomethyl ether acetate, or with an NMP (N-methyl-2-pyrrolidone) based stripper. The lift-off process removes i) at least 99% of the insoluble positive photoresist 52' and ii) the functionalized layer 24 positioned thereon, as shown in FIG. 8F.

In this example, any of the wet etching processes described herein may be used to remove the metal film 48. This exposes the surface 74 of the support 14 or resin layer 18 at the shallow portion 68 and also exposes the interstitial regions 22. This is shown in FIG. 8G.

As shown in FIG. 8H, the second functionalized layer 26 may then be applied over the surface 74 of the support 14 or resin layer 18 at the shallow portion 68 and also over the interstitial regions 22. The second functionalized layer 26 (e.g., the gel material that forms the second functionalized layer 26) may be applied using any suitable deposition technique. In this example, when deposition of the gel material is performed under high ionic strength (e.g., in the presence of 10×PBS, NaCl, KCl, etc.), the second functionalized layer 26 does not deposit on or adhere to the first functionalized layer 24. As such, the second functionalized layer 26 does not contaminate the first functionalized layer 24.

In FIG. 8I, the second functionalized layer 26 that is positioned over the interstitial regions 22 is removed, e.g., using a polishing process. The polishing process may be performed with a chemical slurry (including, e.g., an abrasive, a buffer, a chelating agent, a surfactant, and/or a dispersant) which can remove the functionalized layer(s) 24 and/or 26 from the interstitial regions 22 without deleteriously affecting the underlying substrate (e.g., 14 or 18) at those regions 22. Alternatively, polishing may be performed with a solution that does not include the abrasive particles.

The chemical slurry may be used in a chemical mechanical polishing system to polish the surface of the interstitial regions 22. The polishing head(s)/pad(s) or other polishing tool(s) is/are capable of polishing functionalized layers 24, 26 that may be present over the interstitial regions 22 while leaving the functionalized layers 24, 26 in the depression(s) 20' at least substantially intact. As an example, the polishing head may be a Strasbaugh ViPRR II polishing head.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

In the example method shown in FIG. 8A through FIG. 8F and FIG. 8J through 8N, the method further includes removing the insoluble positive photoresist 52', thereby exposing the metal film 48 over the shallow portion 68 of each multi-depth depression 20' and over the interstitial regions 22 (FIG. 8F); patterning a negative photoresist 60 to form an insoluble negative photoresist 60' over the deep portion 66 of each multi-depth depression 20' (FIG. 8J); wet etching the metal film 48 from the shallow portion 68 of each multi-depth depression 20' and from the interstitial regions 22; depositing a second functionalized layer 26 over the insoluble negative photoresist 60', the shallow portion 68 of each multi-depth depression 20', and the interstitial regions 22 (FIG. 8L); removing the insoluble negative photoresist 60', thereby exposing the functionalized layer 24 (FIG. 8M); and removing the second functionalized layer 26 from the interstitial regions 22 (FIG. 8N).

As mentioned above, the insoluble positive photoresist 52' may be lifted off with a remover, such as dimethylsulfoxide (DMSO) using sonication, or in acetone, or in propylene glycol monomethyl ether acetate, or with an NMP (N-methyl-2-pyrrolidone) based stripper. The lift-off process removes i) at least 99% of the insoluble positive photoresist 52' and ii) the functionalized layer 24 positioned thereon, as shown in FIG. 8F.

The negative photoresist 60 is then deposited on the functionalized layer 24 and the metal layer 48 (not shown in FIG. 8A through FIG. 8F or FIG. 8J through 8N. Any of the deposition techniques described herein may be used. In this example, the negative photoresist 60 is exposed to light (e.g., ultraviolet light) through the transparent substrate 14, 16. The thicker metal film 48 (having thickness $T_1$ and thickness $T_3$) blocks at least 75% of light that is transmitted through the transparent substrate 14, 16 from reaching the negative photoresist 60 that is positioned directly in line with the thicker metal film 48, $T_1$, $T_3$. As such, these portions become soluble. The soluble portions are removed, e.g., with the developer, to reveal the metal film 48 over the surface 74 at the shallow portion 68 and the interstitial regions 22. In contrast, the UV light is able to transmit through the thinner metal film 48 (having thickness $T_2$), and thus portions of the negative photoresist 60 overlying the deep portion 66 of the depression 20' become insoluble. The resulting structure, including insoluble negative photoresist 60' in the deep portion 66, is shown in FIG. 8J.

In this example, any of the wet etching processes described herein may be used to remove the metal film 48.

This exposes the surface 74 of the support 14 or resin layer 18 at the shallow portion 68 and also exposes the interstitial regions 22. The insoluble negative photoresist 60' remains intact during this process. This is shown in FIG. 8K.

As shown in FIG. 8L, the second functionalized layer 26 may then be applied over the surface 74 of the support 14 or resin layer 18 at the shallow portion 68 and also over the interstitial regions 22. The second functionalized layer 26 (e.g., the gel material that forms the second functionalized layer 26) may be applied using any suitable deposition technique. In this example, the second functionalized layer 26 is also applied over the insoluble negative photoresist 60' (which overlies the funtionalized layer 24).

Removal of the insoluble negative photoresist 60' may then be performed to expose the functionalized layer 24 in the deep portion 66 of the depression 20', as shown in FIG. 8M. While the insoluble negative photoresist 60' is not soluble in the developer, it is soluble (at least 99% soluble) in a remover. Suitable removers include dimethylsulfoxide (DMSO) using sonication, or in acetone, or with an NMP (N-methyl-2-pyrrolidone) based stripper.

The second functionalized layer 26 is then removed from the interstitial regions 22, e.g., using polishing as described in reference to FIG. 8I. The resulting structure is shown in FIG. 8N.

While not shown, the methods shown in the FIG. 8 series also includes attaching respective primer sets 30, 32 to the functionalized layers 24, 26. In some examples, the primers 34, 36 or 34', 36' (not shown in FIG. 8A through FIG. 8N) may be pre-grafted to the functionalized layer 24. Similarly, the primers 38, 40 or 38', 40' (not shown in FIG. 8A through FIG. 8N) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 8E). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 8H or FIG. 8L), as long as i) the functionalized layer 26 has different functional groups (than functionalized layer 24) for attaching the primers 38, 40 or 38', 40' (in examples where the functionalized layer 24 is exposed) or ii) any unreacted functional groups of the functionalized layer 24 have been quenched, e.g., using the Staudinger reduction to amines or additional click reaction with a passive molecule such as hexynoic acid (in examples where the functionalized layer 24 is exposed) or iii) the insoluble negative photoresist 60' is still in place (FIG. 8L).

When grafting is performed during the method, grafting may be accomplished using any of the grafting techniques described herein.

While a single set of the functionalized layers 24, 26 is shown in FIG. 8I and FIG. 8N, it is to be understood that the methods described in reference to FIG. 8A through FIG. 8N may be performed to generate an array of depressions 20' (having functionalized layers 24, 26 therein) separated by interstitial regions 22 across the surface of the support 14 or resin layer 18 of the multi-layer structure 16.

Another method involving the multi-layer depression 20' is shown in FIG. 9A through FIG. 9I. At the outset of the methods shown in the FIG. 9 series, if the base support 14 or resin layer 18 does not include surface groups to covalently attach to the functionalized layer 24, the base support 14 or resin layer 18 may first be activated, e.g., through silanization or plasma ashing. If the base support 14 or resin layer 18 does include surface groups to covalently attach to the functionalized layer 24, the activation process is not performed.

In the example method shown in FIG. 9A through FIG. 9I, the light sensitive material 50 is a negative photoresist 60; the negative photoresist 60 is deposited in direct contact with the metal film 48; utilizing the metal film 48 to develop the light sensitive material 50 involves exposing the negative photoresist 60 to light through the transparent substrate (e.g., single layer substrate 14 or multi-layer structure 16), whereby portions of the negative photoresist 60 overlying the deep portion 66 of each multi-depth depression 20' define an insoluble negative photoresist 60', and portions of the negative photoresist 60 overlying the shallow portion 68 of each multi-depth depression 20' and overlying the interstitial regions 22 become soluble; the insoluble negative photoresist 60' is the altered light sensitive material 50'; the deep portion 66 of each multi-depth depression 20' is the first predetermined region 54 (where the altered light sensitive material 50' is formed); and the shallow 68 portion of each multi-depth depression 20' is the second predetermined region 56 (where the first functionalized layer 24 is formed).

As shown in FIG. 9B, the negative photoresist 60 is deposited on the metal film 48. Any of the negative photoresists 60 and any deposition techniques described herein may be used in this example.

In this example, utilizing the metal film 48 to develop the light sensitive material 50 (e.g., negative photoresist 60) involves exposing the negative photoresist 60 to light (e.g., ultraviolet light) through the transparent substrate 14, 16. The thicker metal film 48 (having thickness $T_1$ and $T_3$) blocks at least 75% of light that is transmitted through the transparent substrate 14, 16 from reaching the negative photoresist 60 that is positioned directly in line with the thicker metal film 48, $T_1$ and $T_3$. As such, these portions become soluble. The soluble portions are removed, e.g., with the developer, to reveal the metal film 48 overlying the shallow portion 68 of each multi-depth depression 20' and overlying the interstitial regions 22. In contrast, the UV light is able to transmit through the thinner metal film 48 (having thickness $T_2$), and thus portions of the negative photoresist 60 overlying the deep portion 66 of the depressions 20' become insoluble. The resulting structure is shown in FIG. 9C.

The altered light sensitive material 50' (e.g., insoluble negative photoresist 60') is then used to generate the functionalized layer 24 at the second predetermined region 56. This involves: etching the metal film 48 from the shallow portion 68 of each multi-depth depression 20' and from the interstitial regions 22; and depositing the functionalized layer 24 over the insoluble negative photoresist 60', the shallow portion 68 of each multi-depth depression 20', and the interstitial regions 22.

The metal film 48 may be removed from the surface 74 in the shallow portion 68 and from the interstitial regions 22 using dry or wet etching. Dry etching of the metal film 48 from the shallow portion 68 and from the interstitial regions 22 may involve reactive ion etching with $BCl_3+Cl_2$. The dry etching process may be stopped when the surface of the support 14 or resin layer 18 is exposed. Wet etching of an aluminum metal film 48 may be performed using acidic or basic conditions, and wet etching of a copper metal film 48 may be performed using $FeCl_3$ or an iodine and iodide solution. In these examples, the support 14 or layer 18 acts as an etch stop for the etching process. The etching process exposes the surface 74 of the support 14 or layer 18 that is located in the shallow portion 68 and also exposes the interstitial regions 22. In this example, the surface 74 is the second predetermined region 56 where the functionalized layer 24 will be formed. The removal of the metal film 48 from the surface 74 in the shallow portion 68 and from the interstitial regions 22 is shown in FIG. 9D.

The functionalized layer 24 is then deposited over the insoluble negative photoresist 60', the shallow portion 68 of each multi-depth depression 20', and the interstitial regions 22. The functionalized layer 24 may be any of the gel materials described herein and may be applied using any suitable method. A curing process may be performed after deposition. The functionalized layer 24 covalently attaches to the base support 14 or resin layer 18 in the shallow portion 68 of the depression 20' and at the interstitial regions 22. The deposited functionalized layer 24 is shown in FIG. 9E.

Figure 9F:
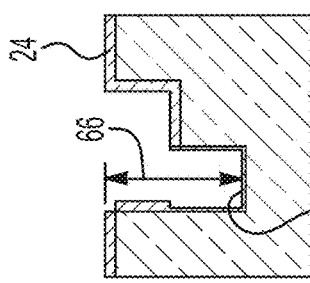
Figure 9G:
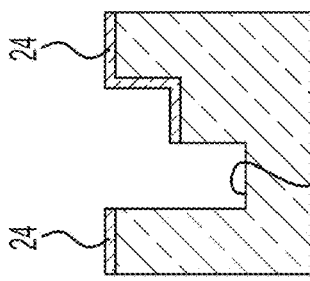
Figure 9H:
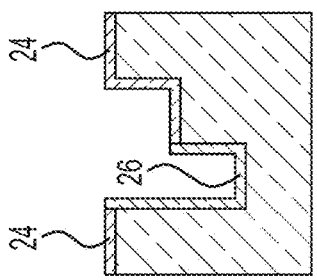
Figure 9I:
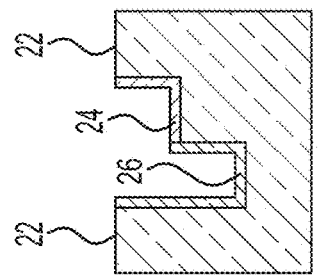

In the example method shown in FIG. 9A through FIG. 9I, the method further includes removing the insoluble negative photoresist 60', thereby exposing the metal film 48 over the deep portion 66 of each multi-depth depression 20' (FIG. 9F); wet etching the metal film 48 from the deep portion 66 of each multi-depth depression 20' (FIG. 9G); depositing a second functionalized layer 26 over the deep portion 66 of each multi-depth depression 20' (FIG. 9H); and removing the functionalized layer 26 from the interstitial regions 22 (FIG. 9I).

Removal of the insoluble negative photoresist 60' may then be performed to expose the metal layer 48 in the deep portion 66 of the depression 20'. While the insoluble negative photoresist 60' is not soluble in the developer, it is soluble (at least 99% soluble) in a remover. Suitable removers include dimethylsulfoxide (DMSO) using sonication, or in acetone, or with an NMP (N-methyl-2-pyrrolidone) based stripper.

In this example, any of the wet etching processes described herein may be used to remove the metal film 48. This exposes the surface 72 of the support 14 or resin layer 18 at the deep portion 66. This is shown in FIG. 9G.

As shown in FIG. 9H, the second functionalized layer 26 may then be applied over the surface 72 of the support 14 or resin layer 18 at the deep portion 66. The second functionalized layer 26 (e.g., the gel material that forms the second functionalized layer 26) may be applied using any suitable deposition technique. In this example, when deposition of the gel material is performed under high ionic strength (e.g., in the presence of 10×PBS, NaCl, KCl, etc.), the second functionalized layer 26 does not deposit on or adhere to the first functionalized layer 24. As such, the second functionalized layer 26 does not contaminate the first functionalized layer 24.

In FIG. 9I, the functionalized layer 24 that is positioned over the interstitial regions 22 is removed, e.g., using a polishing process. The polishing process may be performed as described herein. Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

While not shown, the method shown in FIG. 9A through FIG. 9I also includes attaching respective primer sets 30, 32 to the functionalized layers 24, 26. In some examples, the primers 34, 36 or 34', 36' (not shown in FIG. 9A through FIG. 9I) may be pre-grafted to the functionalized layer 24. Similarly, the primers 38, 40 or 38', 40' (not shown in FIG.

9A through FIG. 9I) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 9E). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 9H), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 9I, it is to be understood that the method described in reference to FIG. 9A through FIG. 9I may be performed to generate an array of depressions 20' (having functionalized layers 24, 26 therein) separated by interstitial regions 22 across the surface of the support 14 or resin layer 18 of the multi-layer structure 16.

Still another method is shown in FIG. 10A through FIG. 10H.

Figure 10A:
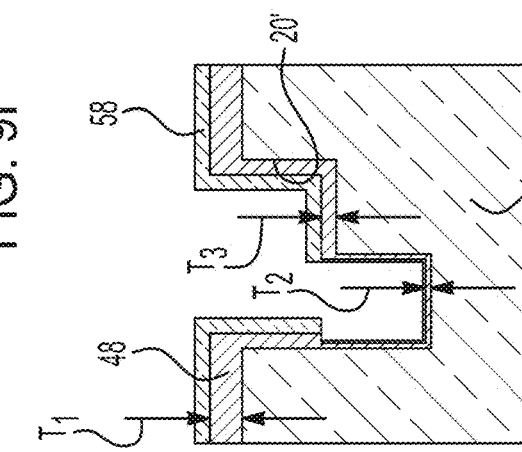
FIG. 10A through FIG. 10H are schematic views that together illustrate another example of the method using a sputtered or thermally evaporated metal film to create a mask that is used to pattern still another example of the flow cell architecture including the multi-depth depression.
Figure 10B:
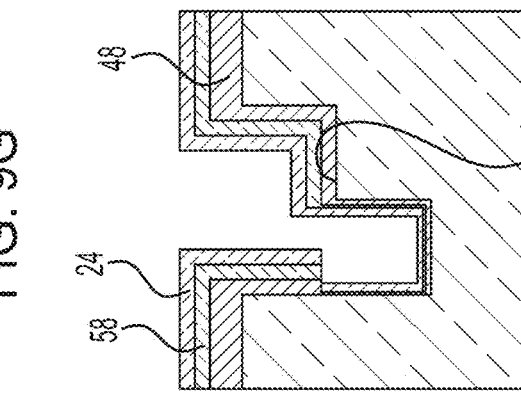
Figure 10C:
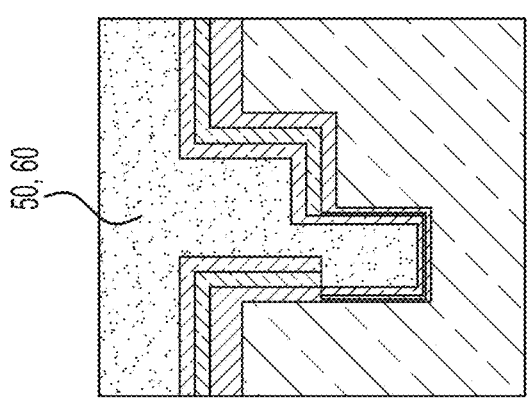
Figure 10D:
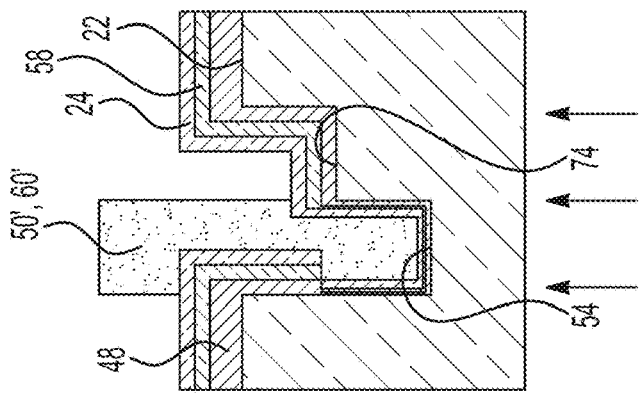

In the method of FIG. 10A through FIG. 10H, the light sensitive material 50 is a negative photoresist 60; the negative photoresist 60 is deposited in direct contact with the functionalized layer 24 (see FIG. 10B); utilizing the metal film 48 to develop the light sensitive material 50 involves exposing the negative photoresist 60 to light through the transparent substrate 14 or 16, whereby portions of the negative photoresist 60 overlying the deep portion 66 of the depressions 20' define an insoluble negative photoresist 60', and portions of the negative photoresist 60 overlying the shallow portion 68 of each multi-depth depression 20' and overlying the interstitial regions 22 become soluble; the insoluble negative photoresist 60' is the altered light sensitive material 50'; and the deep portion 66 of each depression 20' is the first predetermined region 54 (see FIG. 10D, where the altered light sensitive material 50' is formed).

In this example method, as shown in FIG. 10A and FIG. 10B, prior to depositing the light sensitive material 50 over the metal film 48, the method further includes depositing a protective layer 58 in direct contact with the metal film 48; and depositing the functionalized layer 24 in direct contact with the protective layer 58.

In this example, the protective layer 58 may be any inorganic material that has high resistance to degradation from the chemicals used in nucleic acid sequencing (thus keeping the underlying metal film 48 from being exposed) and also has or can be activated to have good adhesion to the functionalized layers 24, 26. Examples of suitable protective materials include silicon dioxide or $Ta_2O_5$ (which can be silanized to generate surface groups to react with the functionalized layers 24, 26). The protective layer 58 may be deposited using any suitable technique, and coats the metal film 48 as shown in FIG. 10A.

The functionalized layer 24 is then deposited over the protective layer 58. The functionalized layer 24 may be any of the gel materials described herein and may be applied using any suitable method. A curing process may be performed after deposition. The functionalized layer 24 covalently attaches to the protective layer 58. The deposited functionalized layer 24 is shown in FIG. 10B.

In FIG. 10C, the negative photoresist 60 is deposited on the functionalized layer 24. Any of the negative photoresist 60 materials and any of the deposition techniques described herein may be used.

In this example, utilizing the metal film 48 to develop the light sensitive material 50 (e.g., negative photoresist 60) involves exposing the negative photoresist 60 to light (e.g., ultraviolet light) through the transparent substrate 14, 16. The thicker metal film 48 (having thickness $T_1$ and $T_3$) blocks at least 75% of light that is transmitted through the transparent substrate 14, 16 from reaching the negative photoresist 60 that is positioned directly in line with the thicker metal film 48, $T_1$, $T_3$. As such, these portions become soluble. The soluble portions are removed, e.g., with the developer, to reveal the functionalized layer 24 positioned over the surface 74 in the shallow portion 68 of the depression 20' and over the interstitial regions 22. In contrast, the UV light is able to transmit through the thinner metal film 48 (having thickness $T_2$), and thus portions of the negative photoresist 60 overlying the deep portion 66 of the depressions 20' become insoluble. The resulting structure is shown in FIG. 10D.

Figure 10E:
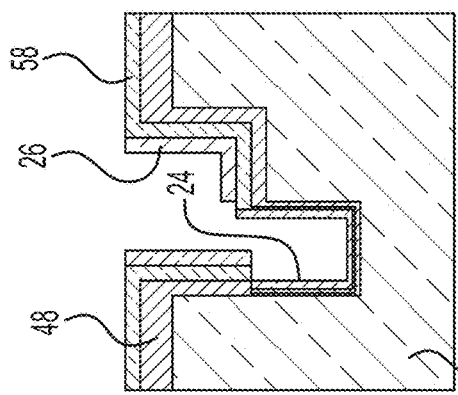

The altered light sensitive material 50' (e.g., insoluble negative photoresist 60') is then used to generate the functionalized layer 24 at the first predetermined region 54. This involves dry etching the functionalized layer 24 from the shallow portion 68 of each multi-depth depression 20' and from the interstitial regions 22, whereby the protective layer 58 is exposed at the shallow portion 68 of each multi-depth depression 20' and at the interstitial regions 22, and the functionalized layer 24 remains in the deep portion 66 of each multi-depth depression 20'. The dry etching process used to remove the functionalized layer 24 may be performed using plasma, such as 100% $O_2$ plasma, air plasma, argon plasma, etc. This etching process will remove the first functionalized layer 24 at the shallow portion 68, and will also remove the portions of the first functionalized layer 24 that overlie the interstitial regions 22. The protective layer 58 acts as an etch stop. As depicted in FIG. 10E, after dry etching, the functionalized layer 24 remains in the deep portion 66 of the depression 20'.

Figure 10F:
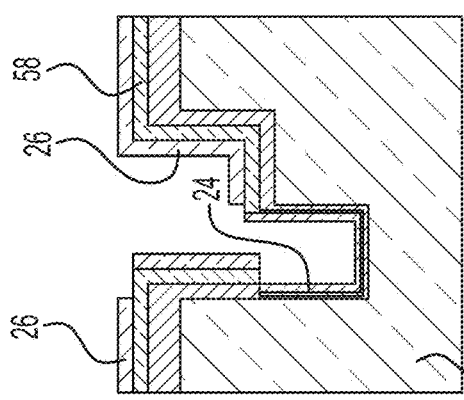
Figure 10G:
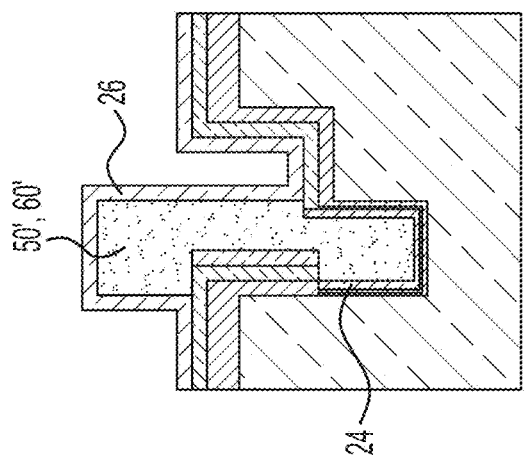
Figure 10H:
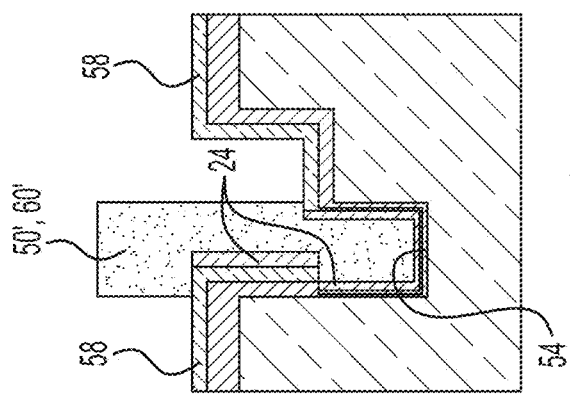

This example method further includes depositing a second functionalized layer 26 over the insoluble negative photoresist 60', and over the protective layer 58 exposed at the shallow portion 68 of each multi-depth depression 20' and at the interstitial regions 22 (FIG. 10F); removing the insoluble negative photoresist 60', thereby exposing the functionalized layer 24 over the deep portion 66 of each multi-depth depression 20' (FIG. 10G); and removing the second functionalized layer 26 from the interstitial regions 22 (FIG. 10H).

As shown in FIG. 10F, the second functionalized layer 26 may then be applied over the protective layer 58 at the shallow portion 68 and at the interstitial regions 22. The second functionalized layer 26 (e.g., the gel material that forms the second functionalized layer 26) may be applied using any suitable deposition technique. In this example, the second functionalized layer 26 is also applied over the insoluble negative photoresist 60'.

Removal of the insoluble negative photoresist 60' may then be performed to expose the functionalized layer 24 in the deep portion 66 of the depression 20', as shown in FIG. 10G. While the insoluble negative photoresist 60' is not soluble in the developer, it is soluble (at least 99% soluble) in a remover. Suitable removers include dimethylsulfoxide (DMSO) using sonication, or in acetone, or with an NMP (N-methyl-2-pyrrolidone) based stripper. This process removes i) at least 99% of the insoluble negative photoresist 60' and ii) the functionalized layer 26 positioned thereon.

The second functionalized layer 26 is then removed from the protective layer 58 over the interstitial regions 22, e.g., using polishing as described in reference to FIG. 8I. The resulting structure is shown in FIG. 10H.

While not shown, the methods shown in FIG. 10A through FIG. 10H includes attaching respective primer sets 30, 32 to the functionalized layers 24, 26. In some examples, the primers 34, 36 or 34', 36' (not shown in 10A through FIG. 10H) may be pre-grafted to the functionalized layer 24. Similarly, the primers 38, 40 or 38', 40' (not shown in 10A through FIG. 10H) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 10B). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 10F, or FIG. 10G, or FIG. 10H), as long as i) the functionalized layer 26 has different functional groups (than functionalized layer 24) for attaching the primers 38, 40 or 38', 40' (in examples where the functionalized layer 24 is exposed) or ii) any unreacted functional groups of the functionalized layer 24 have been quenched, e.g., using the Staudinger reduction to amines or additional click reaction with a passive molecule such as hexynoic acid (in examples where the functionalized layer 24 is exposed) or iii) the insoluble negative photoresist 60' is still in place (FIG. 10F).

When grafting is performed during the method, grafting may be accomplished using any of the grafting techniques described herein.

While a single set of the functionalized layers 24, 26 is shown in FIG. 10H, it is to be understood that the method described in reference to FIG. 10A through FIG. 10H may be performed to generate an array of depressions 20' (having functionalized layers 24, 26 therein) separated by the protective layer 58 over the interstitial regions 22 across the surface of the support 14 or resin layer 18 of the multi-layer structure 16.

Still another method is shown in FIG. 11A through FIG. 11H.

In the method of FIG. 11A through FIG. 11H, the light sensitive material 50 is a positive photoresist 52; the positive photoresist 50 is deposited in direct contact with the functionalized layer 24; utilizing the metal film 48 to develop the light sensitive material 50 involves exposing the positive photoresist 52 to light through the transparent substrate 14, 16, whereby portions of the positive photoresist 52 overlying the deep portion 66 of each multi-depth depression 20' become soluble, and portions of the positive photoresist 52 overlying the shallow portion 68 of each multi-depth depression 20' and overlying the interstitial regions 22 define an insoluble positive photoresist 52'; the insoluble positive photoresist 52' is the altered light sensitive material 50'; and the shallow portion 68 of each multi-depth depression 20' and the interstitial regions 22' are the first predetermined region 54.

Figure 11A:
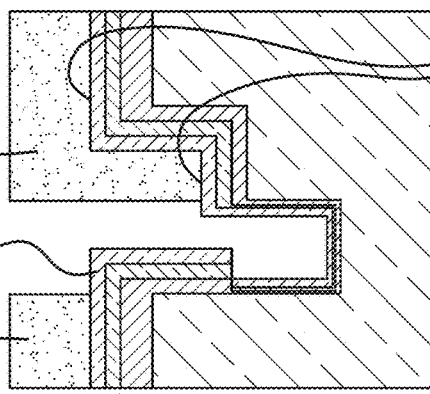
Figure 11B:
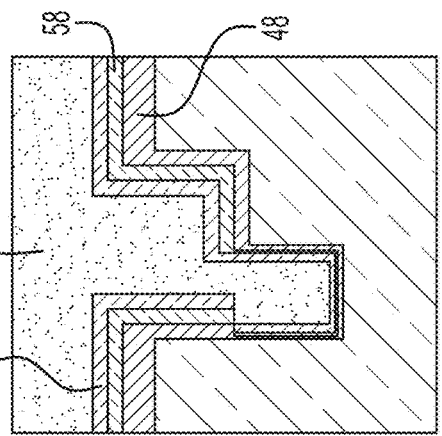

In this example method, as shown in FIG. 11A and FIG. 11B, prior to depositing the light sensitive material 50 over the metal film 48, the method further includes depositing a protective layer 58 in direct contact with the metal film 48; and depositing the functionalized layer 24 in direct contact with the protective layer 58.

In this example, the protective layer 58 may be any inorganic material that has high resistance to degradation from the chemicals used in nucleic acid sequencing (thus keeping the underlying metal film 48 from being exposed) and also has or can be activated to have good adhesion to the functionalized layers 24, 26. Examples of suitable protective materials include silicon dioxide or $Ta_2O_5$ (which can be silanized to generate surface groups to react with the functionalized layers 24, 26). The protective layer 58 may be deposited using any suitable technique, and coats the metal film 48 as shown in FIG. 11A.

The functionalized layer 24 is then deposited over the protective layer 58. The functionalized layer 24 may be any of the gel materials described herein and may be applied using any suitable method. A curing process may be performed after deposition. The functionalized layer 24 covalently attaches to the protective layer 58. The deposited functionalized layer 24 is shown in FIG. 11B.

Figure 11C:
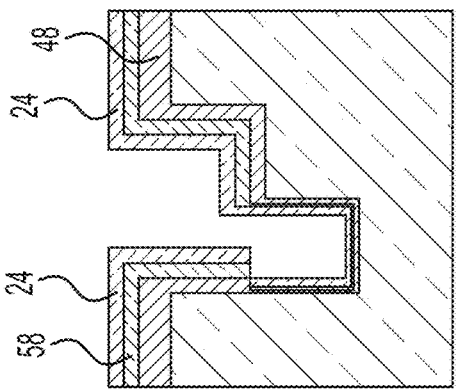

In FIG. 11C, the positive photoresist 52 is deposited on the functionalized layer 24. Any of the positive photoresist 52 materials and any of the deposition techniques described herein may be used.

Figure 11D:
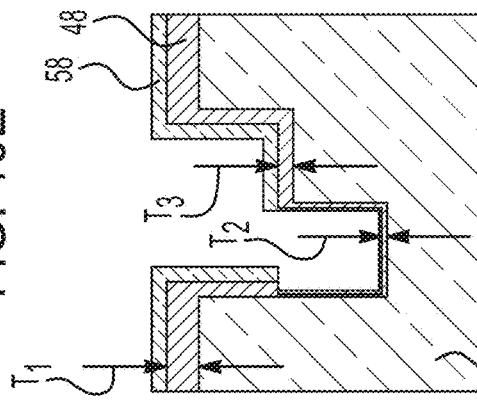

In this example, utilizing the metal film 48 to develop the light sensitive material 50 (e.g., positive photoresist 52) involves exposing the positive photoresist 52 to light (e.g., ultraviolet light) through the transparent substrate 14, 16. The thicker portions of the metal film 48 (having thickness $T_1$ or thickness $T_3$) blocks at least 75% of light that is transmitted through the transparent substrate 14, 16 from reaching the positive photoresist 52 that is positioned directly in line with the thicker metal film 48, $T_1$, $T_3$. As such, these portions become the insoluble portions 50', 52', as shown in FIG. 11D. In contrast, the UV light is able to transmit through the thinner metal film 48 (having thickness $T_2$), and thus portions of the positive photoresist 52 overlying the deep portion 66 of the depressions 20' become soluble. The soluble portions are removed, e.g., with the developer, to reveal the functionalized layer 24 formed over the thinner metal film 48, $T_2$ present in the deep portion 66 of the depressions 20'. The resulting structure is shown in FIG. 11D.

The altered light sensitive material 50' (e.g., insoluble positive photoresist 52') is then used to generate the functionalized layer 24 at the first predetermined region 54. This involves removing the functionalized layer 24 from the deep portion 66 of each multi-depth depression 20', whereby the protective layer 58 is exposed at the deep portion 66 of each multi-depth depression 20' and the functionalized layer 24 remains in the shallow portion 68 of each multi-depth depression 20' and over the interstitial regions 22. In this example, removing the functionalized layer 24 involves ashing the functionalized layer 24. To ash the functionalized layer 24, an oxygen plasma, air plasma, or other gas plasma is used. The resulting structure is shown in FIG. 11E.

This example method further includes depositing a second functionalized layer 26 over the insoluble positive photoresist 52', and over the protective layer 58 exposed at the deep portion 66 of each multi-depth depression 20' (FIG. 11F);

removing the insoluble positive photoresist 52', thereby exposing the functionalized layer 24 over the shallow portion 68 of each multi-depth depression 20' and over the interstitial regions 22 (FIG. 11G); and removing the functionalized layer 24 from the interstitial regions 22 (FIG. 11H).

As shown in FIG. 11F, the second functionalized layer 26 is applied over the protective layer 58 at the deep portion 66. In this example, the second functionalized layer 26 is also applied over the insoluble positive photoresist 52'. The second functionalized layer 26 (e.g., the gel material that forms the second functionalized layer 26) may be applied using any suitable deposition technique.

The insoluble positive photoresist 52' may then be removed. The insoluble positive photoresist 52' may be lifted off with a remover, such as dimethylsulfoxide (DMSO) using sonication, or in acetone, or in propylene glycol monomethyl ether acetate, or with an NMP (N-methyl-2-pyrrolidone) based stripper. The lift-off process removes i) at least 99% of the insoluble positive photoresist 52' and ii) the functionalized layer 26 positioned thereon. After this removal process, the functionalized layer 24 in the shallow portion 68 of the depression 20' and over the interstitial regions 22 is exposed. The functionalized layer 24 remains intact because it is covalently attached to the protective layer 58.

The functionalized layer 24 is then removed from the protective layer 58 over the interstitial regions 22, e.g., using polishing as described in reference to FIG. 8I. The resulting structure is shown in FIG. 11H.

While not shown, the methods shown in FIG. 11A through FIG. 11H includes attaching respective primer sets 30, 32 to the functionalized layers 24, 26. In some examples, the primers 34, 36 or 34', 36' (not shown in FIG. 11A through FIG. 11H) may be pre-grafted to the functionalized layer 24. Similarly, the primers 38, 40 or 38', 40' (not shown in FIG. 11A through FIG. 11H) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 11B). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 11F, or FIG. 11G, or FIG. 11H), as long as i) the functionalized layer 26 has different functional groups (than functionalized layer 24) for attaching the primers 38, 40 or 38', 40' (in examples where the functionalized layer 24 is exposed) or ii) any unreacted functional groups of the functionalized layer 24 have been quenched, e.g., using the Staudinger reduction to amines or additional click reaction with a passive molecule such as hexynoic acid (in examples where the functionalized layer 24 is exposed) or iii) the insoluble positive photoresist 52' is still in place (FIG. 11F).

When grafting is performed during the method, grafting may be accomplished using any of the grafting techniques described herein.

While a single set of the functionalized layers 24, 26 is shown in FIG. 11H, it is to be understood that the method described in reference to FIG. 11A through FIG. 11H may be performed to generate an array of depressions 20' (having functionalized layers 24, 26 therein) separated by the protective layer 58 over the interstitial regions 22 across the surface of the support 14 or resin layer 18 of the multi-layer structure 16.

Methods for Making the Flow Cell Architecture with a Resin of Varying Thicknesses Other examples of the methods disclosed herein use a resin layer with varying thickness and UV transmission characteristics to create a mask that is used to pattern the light sensitive material 50, which, in turn, is used to pattern the functionalized layer(s) 24, 26.

These methods generally include depositing a light sensitive material 50 over a resin layer including depressions 20, 20' separated by interstitial regions 22, wherein the depressions 20, 20' overlie a first resin portion having a first thickness $t_1$ and the interstitial regions 22 overlie a second resin portion having a second thickness $t_2$ that is greater than the first thickness $t_1$; directing, through the resin layer a predetermined ultraviolet light dosage that is based on the first and second thicknesses $t_1$, $t_2$, whereby the light sensitive material 50 overlying the depressions 20, 20' is exposed to ultraviolet light and the second resin portion absorbs the ultraviolet light, thereby defining an altered light sensitive material 50' at a first predetermined region 54 over the resin layer; and utilizing the altered light sensitive material 50' to generate a functionalized layer 24, 26 at the first predetermined region 54 or at a second predetermined region 56 over the resin layer.

In these example methods, the resin layer is either the single layer base support 14' or the resin layer 18' of the multi-layered structure 16' as described herein. Thus, the resin layer in these examples is referred to as "resin layer 14', 18'" throughout the description of these methods. While the multi-layered structure 16' may be used, the series of FIGS. 12 through 17) illustrate the resin layer 18', but not the underlying base support 17'.

The series of FIGS. 12 and 14 through 17 depict the resin layer 14', 18' having the depressions 20 or 20' defined therein. The depressions 20 or 20' may be etched, imprinted, or defined in the resin layer 14', 18' using any suitable technique. In one example, nanoimprint lithography is used.

In some examples when the depression 20 is used (as shown in FIG. 12A), the depression 20 overlies a first resin portion 76 having a first thickness $t_1$ and the interstitial regions 22 overlie a second resin portion 78 having a second thickness $t_2$ that is greater than the first thickness $t_1$. The thicknesses $t_1$, $t_2$ depend upon the resin layer 14', 18' material and the UV dosage that is to be applied. For example, a nanoimprint lithography resin having a thickness $t_1$ of 150 nm and a thickness $t_2$ of 750 nm is capable of respectively transmitting and absorbing UV light at a UV dosage of 90 mJ/cm². For another example, a nanoimprint lithography resin having a thickness $t_1$ of 150 nm and a thickness $t_2$ of 500 nm is capable of respectively transmitting and absorbing UV light at a UV dosage of 30 mJ/cm². In these examples, the UV light dosage would have to be increased 3 to 4 times in order to be transmitted through the portions with thickness $t_2$.

In other examples when the depression 20 is used (as shown in FIG. 17A), the depressions 20 include n number of depression subsets 20A, 20B, 20C, etc., where n is greater than or equal to 3; and each of the depression subsets 20A, 20B, 20C has a different depth $D_A$, $D_B$, $D_C$ than each other of the depression subsets 20A, 20B, 20C. The corresponding resin portions have different thicknesses $t_A$, $t_B$, $t_C$ with different UV absorbance characteristics.

When the depression 20' is used, the depression 20' includes the deep portion 66 and the shallow portion 68 as described herein. The depression 20' is shown in FIG. 13. In this example, the deep portion 66 overlies the first resin portion 76 having the first thickness $t_1$ and the interstitial regions 22 overlie the second resin portion 78 having the second thickness $t_2$ that is greater than the first thickness $t_1$. The shallow portion 68 overlies a third resin portion 80 having a third thickness $t_3$. The third thickness $t_3$ may block UV light from transmitting through the resin layer 14', 18' at the third resin portion 80 or may enable UV light transmission through the resin layer 14', 18' at the third resin portion 80 depending upon the UV dosage that is applied.

Referring now to FIG. 12A through FIG. 12F, this method utilizes the resin layer 14', 18' having the depression 20 defined therein. In this method, the light sensitive material 50 is a negative photoresist 60; the negative photoresist 60 is deposited in direct contact with the functionalized layer 24 (see FIG. 12B); after the predetermined ultraviolet light dosage is directed through the resin layer 14', 18', the light sensitive material 50 overlying the depressions 20 defines an insoluble negative photoresist 60', and the light sensitive material 50 overlying the interstitial regions 22 becomes soluble; the insoluble negative photoresist 60' is the altered light sensitive material 50'; and the depressions 20 are the first predetermined region 54 (see FIG. 12D, where the altered light sensitive material 50' is formed).

In this example method, as shown in FIG. 12B and FIG. 12C, prior to depositing the light sensitive material 50, the method further includes depositing the functionalized layer 24 in direct contact with the resin layer 14', 18'. The functionalized layer 24 may be any of the gel materials described herein and may be applied using any suitable method. A curing process may be performed after deposition. The functionalized layer 24 covalently attaches to the resin layer 14', 18' (which may have been exposed to an activation process at the outset of the method). The deposited functionalized layer 24 is shown in FIG. 12B.

As shown in FIG. 12C, the negative photoresist 60 is deposited on the functionalized layer 24. Any example of the negative photoresist 60 may be used, and any of the deposition techniques described herein may be used to deposit the negative photoresist 60.

As shown in FIG. 12D, the predetermined ultraviolet light dosage is directed through the resin layer 14', 18'. The thicker resin portions 78 (having thickness $t_2$) block at least 75% of light that is transmitted through the resin layer 14', 18' from reaching the negative photoresist 60 that is positioned directly in line with the thicker resin portions 78, $t_2$. As such, these portions become soluble. The soluble portions are removed, e.g., with the developer, to reveal the functionalized layer 24 over the interstitial regions 22. In contrast, the UV light is able to transmit through the thinner resin portions 76 (having thickness $t_1$), and thus portions of the negative photoresist 60 overlying the depressions 20 become insoluble. The resulting structure is shown in FIG. 12D.

The altered light sensitive material 50' (e.g., insoluble negative photoresist 60') is then used to generate the functionalized layer 24 at the first predetermined region 54. This involves: removing the functionalized layer 24 from the interstitial regions 22; and removing the insoluble negative photoresist 60'.

The functionalized layer 24 may be removed from the interstitial regions 22 using an ashing process. The insoluble negative photoresist 60' protects the underlying functionalized layer 24 in the depression 20. The exposed interstitial regions 22 after ashing is complete are shown in FIG. 12E.

Removal of the insoluble negative photoresist 60' may then be performed to expose the functionalized layer 24 in the depression 20. While the insoluble negative photoresist 60' is not soluble in the developer, it is soluble (at least 99% soluble) in a remover. Suitable removers include dimethyl-sulfoxide (DMSO) using sonication, or in acetone, or with an NMP (N-methyl-2-pyrrolidone) based stripper. The resulting structure is shown in FIG. 12F.

While not shown, this method also includes attaching the primer set 29 to the functionalized layer 24. In some examples, the primers 31, 33 (not shown in FIG. 12A through FIG. 12F) may be pre-grafted to the functionalized layer 24. In these examples, additional primer grafting is not performed.

In other examples, the primers 31, 33 are not pre-grafted to the functionalized layer 24. In these examples, the primers 31, 33 may be grafted after the functionalized layer 24 is applied (e.g., at FIG. 12B or at FIG. 12F).

When grafting is performed during the method, grafting may be accomplished using any suitable grafting technique disclosed herein. When grafting is performed after the insoluble negative photoresist 60' is removed, the primers 31, 33 attach to the reactive groups of the functionalized layer 24 in the depression 20, and have no affinity for the interstitial regions 22.

While a single depression 20 and functionalized layer 24 are shown in FIG. 12F, it is to be understood that the method described in reference to FIG. 12A through 12F may be performed to generate an array of functionalized depressions, separated by interstitial regions 22, across the surface of the base support 14' or resin layer 18'.

In the example shown in FIG. 12A through FIG. 12F, the base support 14' or resin layer 18' may be embedded with particles that are equally absorptive of ultraviolet light and visible light or more absorptive of ultraviolet light than of visible light. These particles have a visible light transmittance of at least 0.25, and thus enhance the transmittance of wavelengths used during nucleic acid sequencing. The particles may be equally or less transmitting of the ultraviolet light used for patterning, e.g., have a UV light transmittance of 0.25 or less. These particles may help to increase the visible light transmittance of the base support 14' or resin layer 18' without deleteriously affecting the desired varying UV transmittance. Some examples of suitable particles include tantalum pentoxide, zinc oxide, titanium oxide sol-gel, etc.

In the series of FIGS. 14 through 16, each of the depressions defined in the resin layer 14', 18' is a multi-depth depression 20' including a deep portion 66 and a shallow portion 68 adjacent to the deep portion 66. This example of the multi-depth depression is shown and described in reference to FIG. 13.

Two example methods are shown in FIG. 14A through FIG. 14J. One example method is shown in FIG. 14A through FIG. 14G and the other example method is shown in FIG. 14A through FIG. 14E and FIG. 14H through FIG. 14J.

In the portion of the methods shown in FIG. 14A through FIG. 14E, the light sensitive material 50 is a positive photoresist 52; the positive photoresist 52 is deposited in direct contact with the functionalized layer 24; after the predetermined ultraviolet light dosage is directed through the resin layer 14', 18', portions of the positive photoresist 52 overlying the deep portion 66 of each multi-depth depression 20' become soluble, and portions of the positive photoresist 52 overlying the shallow portion 68 of each multi-depth depression 20' and overlying the interstitial regions 22 define an insoluble positive photoresist 52'; the insoluble positive photoresist 52' is the altered light sensitive material 50'; and the shallow portion 68 of each multi-depth depression 20' and the interstitial regions 22 are the first predetermined region 54 (where the first functionalized layer 24 is defined).

In this example method, as shown in FIG. 14A and FIG. 14B, prior to depositing the light sensitive material 50, the method further includes depositing the functionalized layer 24 in direct contact with the resin layer 14', 18'. The functionalized layer 24 may be any of the gel materials described herein and may be applied using any suitable method. A curing process may be performed after deposition. The functionalized layer 24 covalently attaches to the resin layer 14', 18' (which may have been exposed to an activation process at the outset of the method). The deposited functionalized layer 24 is shown in FIG. 14A.

The light sensitive material 50, in this example the positive photoresist 52), is the deposited over the functionalized layer 24 using any suitable deposition technique. The deposited light sensitive material 50 is shown in FIG. 14B.

As shown in FIG. 14C, the predetermined ultraviolet light dosage is directed through the resin layer 14', 18'. The thicker portions 78, 80 of the resin layer 14', 18' (having thickness $t_2$ or thickness $t_3$) block at least 75% of light that is transmitted through the resin layer 14', 18' from reaching the positive photoresist 52 that is positioned over these portions 78, $t_2$ and 80, $t_3$. As such, these portions become the insoluble portions 50', 52', as shown in FIG. 14C. In contrast, the UV light is able to transmit through the thinner portion 76 (having thickness $t_1$), and thus portions of the positive photoresist 52 overlying the deep portion 66 of the depressions 20' become soluble. The soluble portions are removed, e.g., with the developer, to reveal the functionalized layer 24 formed over the thinner portion 76, $t_1$ and present in the deep portion 66 of the depressions 20'. The resulting structure is shown in FIG. 14C.

The altered light sensitive material 50' (e.g., insoluble positive photoresist 52') is then used to generate the functionalized layer 24 at the first predetermined region 54. This involves removing the functionalized layer 24 from the deep portion 66 of each multi-depth depression 20', whereby the resin layer 14', 18' is exposed at the deep portion 66 of each multi-depth depression 20' and the functionalized layer 24 remains in the shallow portion 68 of each multi-depth depression 20' and over the interstitial regions 22. In this example, removing the functionalized layer 24 involves ashing the functionalized layer 24 using a suitable plasma. The resulting structure is shown in FIG. 14D.

The example method shown in FIG. 14A through FIG. 14G further includes depositing a second functionalized layer 26 over the insoluble positive photoresist 52', and over the resin layer 14', 18' exposed at the deep portion 66 of each multi-depth depression 20' (FIG. 14E); removing the insoluble positive photoresist 52', thereby exposing the functionalized layer 24 over the shallow portion 68 of each multi-depth depression 20' and over the interstitial regions 22 (FIG. 14F); and removing the functionalized layer 24 from the interstitial regions 22 (FIG. 14G).

As shown in FIG. 14E, the second functionalized layer 26 is applied over the insoluble positive photoresist 52', and over the resin layer 14', 18' exposed at the deep portion 66 of each multi-depth depression 20'. The second functionalized layer 26 (e.g., the gel material that forms the second functionalized layer 26) may be applied using any suitable deposition technique.

The insoluble positive photoresist 52' may then be removed. The insoluble positive photoresist 52' may be lifted off with a remover, such as dimethylsulfoxide (DMSO) using sonication, or in acetone, or in propylene glycol monomethyl ether acetate, or with an NMP (N-methyl-2-pyrrolidone) based stripper. The lift-off process removes i) at least 99% of the insoluble positive photoresist 52' and ii) the functionalized layer 26 positioned thereon. After this removal process, the functionalized layer 24 in the shallow portion 68 of the depression 20' and over the interstitial regions 22 is exposed. The functionalized layer 24 remains intact because it is covalently attached to the resin layer 14', 18'. This is shown in FIG. 14F.

The functionalized layer 24 is then removed from the resin layer 14', 18' over the interstitial regions 22, e.g., using polishing as described in reference to FIG. 8I. The resulting structure is shown in FIG. 14G.

Referring back to FIG. 14D, the example method shown in FIG. 14A through FIG. 14E and FIG. 14H through FIG. 14J further includes depositing a second functionalized layer 26 over the insoluble positive photoresist 52', and over the resin layer 14', 18' exposed at the deep portion 66 of each multi-depth depression 20' (FIG. 14E); removing the insoluble positive photoresist 52', thereby exposing the functionalized layer 24 over the shallow portion 68 of each multi-depth depression 20' and over the interstitial regions 22 (similar to the example shown in FIG. 14F); depositing a negative photoresist 60 over the functionalized layer 24 and the second functionalized layer 26 (FIG. 14H); directing, through the resin layer 14', 18', a second ultraviolet light dosage that is higher than the predetermined ultraviolet light dosage, whereby the negative photoresist 60 overlying the deep portion 66 and overlying the shallow portion 68 is exposed to ultraviolet light to generate an insoluble negative photoresist 60', and the negative photoresist 60 overlying the interstitial regions 22 becomes soluble (FIG. 14I); removing the functionalized layer 24 from the interstitial regions 22 (FIG. 14J); and removing the insoluble negative photoresist 60' (FIG. 14J).

The second functionalized layer 26 may be deposited over the insoluble positive photoresist 52' and over the resin layer 14', 18' exposed at the deep portion 66 of each multi-depth depression 20' as described in reference to FIG. 14E. The insoluble positive photoresist 52' may be removed to expose the functionalized layer 24 over the shallow portion 68 of each multi-depth depression 20' and over the interstitial regions 22 as described in reference to FIG. 14E.

As shown in FIG. 14H, the negative photoresist 60 is deposited on the functionalized layers 24, 26. Any example of the negative photoresist 60 may be used, and any of the deposition techniques described herein may be used to deposit the negative photoresist 60.

As shown in FIG. 14I, the second predetermined ultraviolet light dosage is directed through the resin layer 14', 18'. The second ultraviolet light dosage is higher than the predetermined ultraviolet light dosage (applied at FIG. 14C) so that the thickest resin portions 78 (having thickness $t_2$) block at least 75% of light that is transmitted through the resin layer 14', 18' from reaching the negative photoresist 60 that is positioned directly in line with the thickest resin portions 78, $t_2$. As such, these portions become soluble. The soluble portions are removed, e.g., with the developer, to reveal the functionalized layer 24 over the interstitial regions 22. In contrast, the UV light is able to transmit through the thinner resin portions 76, 80 (having thickness $t_1$ and thickness $t_3$), and thus portions of the negative photoresist 60 overlying the depressions 20' become insoluble. The insoluble negative photoresist 60' is shown in FIG. 14I.

The functionalized layer 24 may be removed from the interstitial regions 22 using an ashing process (e.g., performed with plasma, such as 100% $O_2$ plasma, air plasma, argon plasma, etc). The insoluble negative photoresist 60' protects the underlying functionalized layer 24, 26' in the depression 20'. The exposed interstitial regions 22 after ashing is complete are shown in FIG. 14J.

Removal of the insoluble negative photoresist 60' may then be performed to expose the functionalized layers 24, 26 in the depression 20'. While the insoluble negative photoresist 60' is not soluble in the developer, it is soluble (at least 99% soluble) in a remover. Suitable removers include dimethylsulfoxide (DMSO) using sonication, or in acetone, or with an NMP (N-methyl-2-pyrrolidone) based stripper. The resulting structure is shown in FIG. 14J.

While not shown, the methods shown in the FIG. 14 series also includes attaching respective primer sets 30, 32 to the functionalized layers 24, 26. In some examples, the primers 34, 36 or 34', 36' (not shown in FIG. 14A through FIG. 14J) may be pre-grafted to the functionalized layer 24. Similarly, the primers 38, 40 or 38', 40' (not shown in FIG. 14A through FIG. 14J) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 14A). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at any point from FIG. 14E or FIG. 14J), as long as i) the functionalized layer 26 has different functional groups (than functionalized layer 24) for attaching the primers 38, 40 or 38', 40' (in examples where the functionalized layer 24 is exposed) or ii) any unreacted functional groups of the functionalized layer 24 have been quenched, e.g., using the Staudinger reduction to amines or additional click reaction with a passive molecule such as hexynoic acid (in examples where the functionalized layer 24 is exposed) or iii) the insoluble positive photoresist 52' is still in place (FIG. 14E).

When grafting is performed during the method, grafting may be accomplished using any of the grafting techniques described herein.

While a single set of the functionalized layers 24, 26 is shown in FIG. 14G and FIG. 14J, it is to be understood that the methods described in reference to FIG. 14A through FIG. 14J may be performed to generate an array of depressions 20' (having functionalized layers 24, 26 therein) separated by interstitial regions 22 across the surface of the support 14' or resin layer 18' of the multi-layer structure 16'.

Another example method is shown in FIG. 15A through FIG. 15H.

At the outset of this method, if the resin layer 14', 18' does not include surface groups to covalently attach to the functionalized layers 24, 26, the resin layer 14', 18' may first be activated, e.g., through silanization or plasma ashing. If the resin layer 14', 18' does include surface groups to covalently attach to the functionalized layers 24, 26, the activation process is not performed.

In this method, the light sensitive material 50 is a positive photoresist 52; the positive photoresist 52 is deposited in direct contact with the resin layer 14', 18'; after the predetermined ultraviolet light dosage is directed through the resin layer 14', 18', portions of the positive photoresist 52 overlying the deep portion 66 of each multi-depth depression 20' become soluble, and portions of the positive photoresist 52 overlying the shallow portion 68 of each multi-depth depression 20' and overlying the interstitial regions 22 define an insoluble positive photoresist 52'; the insoluble positive photoresist 52' is the altered light sensitive material 50'; the shallow portion 66 of each multi-depth depression 20' and the interstitial regions 22 are the first predetermined region 54 (FIG. 15C, where the altered light sensitive material 50' is formed); and the deep portion 66 of each multi-depth depression 20' is the second predetermined region 56 (FIG. 15C and FIG. 15D, where the functionalized layer 24 is formed).

As shown in FIG. 15A, the positive photoresist 52 is deposited on the resin layer 14', 18'. Any example of the positive photoresist 52 may be used, and any of the deposition techniques described herein may be used to deposit the positive photoresist 52.

As shown in FIG. 15B, the predetermined ultraviolet light dosage is directed through the resin layer 14', 18'. The thicker portions 78, 80 of the resin layer 14', 18' (having thickness $t_2$ or thickness $t_3$) block at least 75% of light that is transmitted through the resin layer 14', 18' from reaching the positive photoresist 52 that is positioned over these portions 78, $t_2$ and 80, $t_3$. As such, these portions become the insoluble portions 50', 52'. In contrast, the UV light is able to transmit through the thinner portion 76 (having thickness $t_1$), and thus portions of the positive photoresist 52 overlying the deep portion 66 of the depressions 20' become soluble. The soluble portions are removed, e.g., with the developer, to reveal the resin layer 14', 18' formed over the thinner portion 76, $t_1$ of the resin layer 14', 18' and present in the deep portion 66 of the depressions 20'. The resulting structure is shown in FIG. 15B.

In this example method, utilizing the altered light sensitive material 50' to generate the functionalized layer 24 at the second predetermined region 56 involves: depositing the functionalized layer 24 over the insoluble positive photoresist 52', and over the resin layer 14', 18' exposed at the deep portion 66 of each multi-depth depression 20' (FIG. 15C); and removing the insoluble positive photoresist 52', thereby exposing the shallow portion 68 of each multi-depth depression 20' and the interstitial regions 22 (FIG. 15D).

The functionalized layer 24 may be any of the gel materials described herein and may be applied using any suitable method. A curing process may be performed after deposition. The functionalized layer 24 covalently attaches to the resin layer 14', 18' in the deep portion 66. The deposited functionalized layer 24 is shown in FIG. 15C.

The insoluble positive photoresist 52' may then be removed, as shown in FIG. 15D. The insoluble positive photoresist 52' may be lifted off with a remover, such as dimethylsulfoxide (DMSO) using sonication, or in acetone, or in propylene glycol monomethyl ether acetate, or with an NMP (N-methyl-2-pyrrolidone) based stripper. The lift-off process removes i) at least 99% of the insoluble positive photoresist 52' and ii) the functionalized layer 24 positioned thereon. After this removal process, the functionalized layer 24 is present in the deep portion 66 of the depression 20', and the resin layer 14', 18' at the shallow portion 68 and the interstitial regions 22 are exposed.

The example method shown in FIG. 15A through FIG. 15H further includes depositing a second positive photoresist 52-2 over the functionalized layer 24 in the deep portion 66 of each multi-depth depression 20', the shallow portion 68 of each multi-depth depression 20', and the interstitial regions 22 (FIG. 15E); directing, through the resin layer 14, a second ultraviolet light dosage that is higher than the predetermined ultraviolet light dosage, whereby the second positive photoresist 52-2 overlying the deep portion 66 and overlying the shallow portion 68 is exposed to ultraviolet light and becomes soluble, and the second positive photoresist 52-2 overlying the interstitial regions 22 generates a second insoluble positive photoresist 52'-2 (FIG. 15F); removing the soluble second positive photoresist 52-2, thereby again exposing the shallow portion 68 of each multi-depth depression 20' (FIG. 15F); depositing a second functionalized layer 26 over the second insoluble positive photoresist 52'-2 and over the resin layer 14', 18' exposed at the shallow portion 68 of each multi-depth depression 20' (FIG. 15G); and removing the second insoluble positive photoresist 52'-2, thereby exposing the interstitial regions 22 (FIG. 15H).

As shown in FIG. 15E, the second positive photoresist 52-2 is deposited on the exposed portions of the resin layer 14', 18' and on the functionalized layer 24. Any example of the positive photoresist 52 may be used, and any of the deposition techniques described herein may be used to deposit the positive photoresist 52.

As shown in FIG. 15F, the second predetermined ultraviolet light dosage is directed through the resin layer 14', 18'. The second ultraviolet light dosage is higher than the predetermined ultraviolet light dosage (applied at FIG. 15B) so that the thickest resin portion 78 (having thickness $t_2$) blocks at least 75% of light that is transmitted through the resin layer 14', 18' from reaching the second positive photoresist 52 that is positioned directly in line with the thickest resin portions 78, $t_2$. As such, these portions become the second insoluble positive photoresist 52'-2. In contrast, the UV light is able to transmit through the thinner resin portions 76, 80 (having thickness $t_1$ and thickness $t_3$), and thus portions of the positive photoresist 52 overlying the depressions 20' become soluble. The soluble portions are removed, e.g., with the developer, to reveal the functionalized layer 24 over the deep portion 66 and to reveal the resin layer 14', 18 at the shallow portion 68.

The second functionalized layer 26 is then applied over the second insoluble positive photoresist 52'-2 and over the resin layer 14', 18' exposed at the shallow portion 68 of each multi-depth depression 20'. In this example, the second functionalized layer 26 (e.g., the gel material that forms the second functionalized layer 26) may be applied using any suitable deposition technique that is performed under high ionic strength (e.g., in the presence of 10×PBS, NaCl, KCl, etc.). Under these conditions, the second functionalized layer 26 does not deposit on or adhere to the first functionalized layer 24. As such, the second functionalized layer 26 does not contaminate the first functionalized layer 24.

The second insoluble positive photoresist 52'-2 may then be removed from the interstitial regions 22. The insoluble positive photoresist 52' may be lifted off with a remover, such as dimethylsulfoxide (DMSO) using sonication, or in acetone, or in propylene glycol monomethyl ether acetate, or with an NMP (N-methyl-2-pyrrolidone) based stripper. The lift-off process removes i) at least 99% of the second insoluble positive photoresist 52'-2 and ii) the second functionalized layer 26 positioned thereon. After this removal process, the functionalized layers 24, 26 in the depression 20' remain intact because they are covalently attached to the resin layer 14', 18'.

While not shown in the FIG. 15 series, an alternative method may be performed. In this alternative, after the insoluble positive photoresist 52' is removed (FIG. 15D), the second functionalized layer 26 (e.g., the gel material that forms the second functionalized layer 26) may be applied using any suitable deposition technique that is performed under high ionic strength (e.g., in the presence of 10×PBS, NaCl, KCl, etc.). With this deposition technique, the second functionalized layer 26 does not deposit on or adhere to the first functionalized layer 24. As such, the second functionalized layer 26 does not contaminate the first functionalized layer 24. Polishing could then be used to remove the second functionalized layer 26 from the interstitial regions 22, resulting in the architecture shown in FIG. 15H.

While not shown, the method shown in FIG. 15A through FIG. 15H also includes attaching respective primer sets 30, 32 to the functionalized layers 24, 26. In some examples, the primers 34, 36 or 34', 36' (not shown in FIG. 15A through FIG. 15H) may be pre-grafted to the functionalized layer 24. Similarly, the primers 38, 40 or 38', 40' (not shown in FIG. 15A through FIG. 15H) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 15C). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 15G or FIG. 15H (or FIG. 15D in the alternative method)), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 15H, it is to be understood that the methods described in reference to FIG. 15A through FIG. 15H may be performed to generate an array of depressions 20' (having functionalized layers 24, 26 therein) separated by interstitial regions 22 across the surface of the support 14' or resin layer 18' of the multi-layer structure 16'.

Another example method is shown in FIG. 16A through FIG. 16I.

At the outset of this method, if the resin layer 14', 18' does not include surface groups to covalently attach to the functionalized layers 24, 26, the resin layer 14', 18' may first be activated, e.g., through silanization or plasma ashing. If the resin layer 14', 18' does include surface groups to covalently attach to the functionalized layers 24, 26, the activation process is not performed.

In this method, the light sensitive material 50 is a positive photoresist 52; the positive photoresist 52 is deposited in direct contact with the resin layer 14', 18' (FIG. 16A); after the predetermined ultraviolet light dosage is directed through the resin layer 14', 18', portions of the positive photoresist 52 overlying the deep portion 66 of each multi-depth depression 20' become soluble, and portions of the positive photoresist 52 overlying the shallow portion 68 of each multi-depth depression 20' and overlying the interstitial regions 22 define an insoluble positive photoresist 52'; the insoluble positive photoresist 52' is the altered light sensitive material 50' (FIG. 16B); the shallow portion 66 of each multi-depth depression 20' and the interstitial regions 22 are the first predetermined region 54 (FIG. 16B, where the altered light sensitive material 50' is formed); and the deep portion 66 of each multi-depth depression 20' is the second predetermined region 56 (FIG. 16C and FIG. 16D, where the functionalized layer 24 is formed).

As shown in FIG. 16A, the positive photoresist 52 is deposited on the resin layer 14', 18'. Any example of the positive photoresist 52 may be used, and any of the deposition techniques described herein may be used to deposit the positive photoresist 52.

As shown in FIG. 16B, the predetermined ultraviolet light dosage is directed through the resin layer 14', 18'. The thicker portions 78, 80 of the resin layer 14', 18' (having thickness $t_2$ or thickness $t_3$) block at least 75% of light that is transmitted through the resin layer 14', 18' from reaching the positive photoresist 52 that is positioned over these portions 78, $t_2$ and 80, $t_3$. As such, these portions become the insoluble portions 50', 52'. In contrast, the UV light is able to transmit through the thinner portion 76 (having thickness $t_1$), and thus portions of the positive photoresist 52 overlying the deep portion 66 of the depressions 20' become soluble. The soluble portions are removed, e.g., with the developer, to reveal the resin layer 14', 18' formed over the thinner portion 76, $t_1$ of the resin layer 14', 18' and present in the deep portion 66 of the depressions 20'. The resulting structure is shown in FIG. 16B.

In this example method, utilizing the altered light sensitive material 50' to generate the functionalized layer 24 at the second predetermined region 56 involves: depositing the functionalized layer 24 over the insoluble positive photoresist 52', and over the resin layer 14', 18' exposed at the deep portion 66 of each multi-depth depression 20' (FIG. 16C); and removing the insoluble positive photoresist 52', thereby exposing the shallow portion 68 of each multi-depth depression 20' and the interstitial regions 22 (FIG. 16D).

The functionalized layer 24 may be any of the gel materials described herein and may be applied using any suitable method. A curing process may be performed after deposition. The functionalized layer 24 covalently attaches to the resin layer 14', 18' in the deep portion 66. The deposited functionalized layer 24 is shown in FIG. 16C.

The insoluble positive photoresist 52' may then be removed, as shown in FIG. 16D. The insoluble positive photoresist 52' may be lifted off with a remover, such as dimethylsulfoxide (DMSO) using sonication, or in acetone, or in propylene glycol monomethyl ether acetate, or with an NMP (N-methyl-2-pyrrolidone) based stripper. The lift-off process removes i) at least 99% of the insoluble positive photoresist 52' and ii) the functionalized layer 24 positioned thereon. After this removal process, the functionalized layer 24 is present in the deep portion 66 of the depression 20', and the resin layer 14', 18' at the shallow portion 68 and the interstitial regions 22 are exposed.

The example method shown in FIG. 16A through FIG. 16I further includes depositing a negative photoresist 60 over the functionalized layer 24 in the deep portion 66 of each multi-depth depression 20', the shallow portion 66 of each multi-depth depression 20', and the interstitial regions 22 (FIG. 16E); directing, through the resin layer 14', 18', a second ultraviolet light dosage, whereby the negative photoresist 60 overlying the deep portion 66 is exposed to ultraviolet light and generates an insoluble negative photoresist 60', and the negative photoresist 60 overlying the shallow portion 66 and the interstitial regions 22 becomes soluble (FIG. 16F); removing the soluble negative photoresist 60, thereby again exposing the shallow portion 68 of each multi-depth depression 20' and the interstitial regions (FIG. 16F); depositing a second functionalized layer 26 over the insoluble negative photoresist 60' and over the resin layer 14', 18' exposed at the shallow portion 68 of each multi-depth depression 20' and at the interstitial regions 22 (FIG. 16G); removing the insoluble negative photoresist 60', thereby exposing the functionalized layer 24 over the deep portion 66 of each multi-depth depression 20'; and removing the second functionalized layer 26 from the interstitial regions 22 (FIG. 16I).

As shown in FIG. 16E, the negative photoresist 60 is deposited on the exposed portions of the resin layer 14', 18' and on the functionalized layer 24. Any example of the negative photoresist 60 may be used, and any of the deposition techniques described herein may be used to deposit the negative photoresist 60.

As shown in FIG. 16F, the second predetermined ultraviolet light dosage is directed through the resin layer 14', 18'. The second ultraviolet light dosage may be the same as the predetermined ultraviolet light dosage (applied at FIG. 16B) so that the thicker portions 78, 80 of the resin layer 14', 18' (having thickness $t_2$ or thickness $t_3$) block at least 75% of light that is transmitted through the resin layer 14', 18' from reaching the negative photoresist 60 that is positioned over these portions 78, $t_2$ and 80, $t_3$. As such, these portions become soluble. The soluble portions are removed, e.g., with the developer, to reveal the resin layer 14', 18' at the shallow portion 68 of each multi-depth depression 20' and at the interstitial regions 22. In contrast, the UV light is able to transmit through the thinner resin portions 76 (having thickness $t_1$), and thus portions of the negative photoresist 60 overlying the deep portion 66 of the depressions 20' become the insoluble negative photoresist 60'.

The second functionalized layer 26 is then applied over the insoluble negative photoresist 60' and over the resin layer 14', 18' exposed at the shallow portion 68 and at the interstitial regions 22. In this example, the second functionalized layer 26 (e.g., the gel material that forms the second functionalized layer 26) may be applied using any suitable deposition technique. The second functionalized layer 26 does not contaminate the first functionalized layer 24 as it is protected by the insoluble negative photoresist 60'. The deposited second functionalized layer 26 is shown in FIG. 16G.

Removal of the insoluble negative photoresist 60' may then be performed to expose the functionalized layer 24 in the deep portion 66 of the depression 20', as shown in FIG. 16H. While the insoluble negative photoresist 60' is not soluble in the developer, it is soluble (at least 99% soluble) in a remover. Suitable removers include dimethylsulfoxide (DMSO) using sonication, or in acetone, or with an NMP (N-methyl-2-pyrrolidone) based stripper.

The second functionalized layer 26 is then removed from the interstitial regions 22, e.g., using polishing as described in reference to FIG. 8I. The resulting structure is shown in FIG. 16I.

While not shown, the method shown in FIG. 16A through FIG. 16I also includes attaching respective primer sets 30, 32 to the functionalized layers 24, 26. In some examples, the primers 34, 36 or 34', 36' (not shown in FIG. 16A through FIG. 16I) may be pre-grafted to the functionalized layer 24. Similarly, the primers 38, 40 or 38', 40' (not shown in FIG.

16A through FIG. 16I) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 16C). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 16G, FIG. 16H, or FIG. 16I), as long as i) the functionalized layer 26 has different functional groups (than functionalized layer 24) for attaching the primers 38, 40 or 38', 40' (in examples where the functionalized layer 24 is exposed) or ii) any unreacted functional groups of the functionalized layer 24 have been quenched, e.g., using the Staudinger reduction to amines or additional click reaction with a passive molecule such as hexynoic acid (in examples where the functionalized layer 24 is exposed), or iii) the insoluble negative photoresist 60' is still in place (FIG. 16G).

When grafting is performed during the method, grafting may be accomplished using any of the grafting techniques described herein.

While a single set of the functionalized layers 24, 26 is shown in FIG. 16I, it is to be understood that the method described in reference to FIG. 16A through FIG. 16I may be performed to generate an array of depressions 20' (having functionalized layers 24, 26 therein) separated by interstitial regions 22 across the surface of the support 14' or resin layer 18' of the multi-layer structure 16'.

Still another example method is shown in FIG. 17A through FIG. 17J. As shown in FIG. 17A, this example includes the resin layer 14', 18' with "n" number of depression subsets 20A, 20B, 20C defined therein, where n is greater than or equal to 3. The depression subsets 20A, 20B, 20C may be defined using any suitable technique, such as etching, nanoimprint lithography, etc.

Each of the depression subsets 20A, 20B, 20C has a different depth $D_A$, $D_B$, $D_C$ than each other of the depression subsets 20A, 20B, 20C. As the depth $D_A$, $D_B$, $D_C$ of the depression subsets 20A, 20B, 20C decreases, the thickness $t_A$, $t_B$, $t_C$ of the underlying resin portion 82, 84, 86 increases. Thus, the depression subset 20A with the greatest depth $D_A$ of all the subsets 20A, 20B, 20C overlies the resin portion 82 with the smallest thickness $t_A$, and the depression subset 20C with the smallest depth $D_C$ of all the subsets 20A, 20B, 20C overlies the resin portion 86 with the greatest thickness $t_C$.

In this method, the light sensitive material 50 is a negative photoresist 60; the negative photoresist 60 is deposited in direct contact with the functionalized layer 24 (see FIG. 17B); after the predetermined ultraviolet light dosage is directed through the resin layer 14', 18', the light sensitive material 50 overlying a first depression subset 20A having a greatest depth $D_A$ defines an insoluble negative photoresist 60', and the light sensitive material 50 overlying the interstitial regions 22 and overlying each other depression subset 20B, 20C having depths $D_B$, $D_C$ smaller than the greatest depth $D_A$ becomes soluble; the insoluble negative photoresist 60' is the altered light sensitive material 50'; and first depression subset 20A is the first predetermined region 54 (see FIG. 17C, where the altered light sensitive material 50' is formed).

In this example method, prior to depositing the light sensitive material 50, the method further includes depositing the functionalized layer 24 in direct contact with the resin layer 14', 18'. The functionalized layer 24 may be any of the gel materials described herein and may be applied using any suitable method. A curing process may be performed after deposition. The functionalized layer 24 covalently attaches to the resin layer 14', 18' (which may have been exposed to an activation process at the outset of the method). The deposited functionalized layer 24 is shown in FIG. 17B.

As shown in FIG. 17B, the negative photoresist 60 is deposited on the functionalized layer 24. Any example of the negative photoresist 60 may be used, and any of the deposition techniques described herein may be used to deposit the negative photoresist 60.

As shown in FIG. 17C, the predetermined ultraviolet light dosage is directed through the resin layer 14', 18'. The predetermined ultraviolet light dosage is relatively low, and is selected so that the thicker portions 84, 86 of the resin layer 14', 18' (having thickness $t_B$ or thickness $t_C$) block at least 75% of light that is transmitted through the resin layer 14', 18' from reaching the negative photoresist 60 that is positioned over these portions 84, $t_B$ and 86, $t_C$. As such, these portions become soluble. The soluble portions are removed, e.g., with the developer, to reveal the functionalized layer 24 in each of the depression subsets 20B, 20C and at the interstitial regions 22. In contrast, the UV light is able to transmit through the thinner resin portions 82 (having thickness $t_A$), and thus portions of the negative photoresist 60 overlying the depression subset 20A become the insoluble negative photoresist 60'.

In this example, utilizing the altered light sensitive material 50' to generate the functionalized layer 24 at the first predetermined region involves removing the functionalized layer 24 from the interstitial regions 22 and from each other depression subset 20B, 20C while the insoluble negative photoresist 60' is present in the first depression subset 20A. In this example, removing the functionalized layer 24 involves ashing the functionalized layer 24 using a suitable plasma. The resulting structure is shown in FIG. 17D.

The method shown in FIG. 17A through FIG. 17J then includes depositing a second functionalized layer 26 over the insoluble negative photoresist 60', the interstitial regions 22, and each other depression subset 20B, 20C (FIG. 17E); removing the insoluble negative photoresist 60', thereby exposing the functionalized layer 24 in the first depression subset 20A (FIG. 17F); depositing a second negative photoresist 60-2 over the functionalized layer 24 in the first depression subset 20A, over each other depression subset 20B, 20C, and over the interstitial regions 22 (FIG. 17F); directing, through the resin layer 14', 18', a second ultraviolet light dosage that is higher than the predetermined ultraviolet light dosage, whereby the second negative photoresist 60-2 overlying the functionalized layer 24 in the first depression subset 20A and overlying a second depression subset 20B having a second greatest depth $D_B$ defines a second insoluble negative photoresist 60', and the second negative photoresist 60-2 overlying the interstitial regions 22 and overlying each other depression subset 20C having depth smaller $D_C$ than the second greatest depth $D_B$ becomes soluble (FIG. 17G); and removing the second functionalized layer 26 from the interstitial regions 22 and from each other depression subset 20C having depth $D_C$ smaller than the second greatest depth $D_B$ while the second insoluble negative photoresist 60'-2 is present in the first and second depression subsets 20A, 20B.

Referring specifically to FIG. 17E, the second functionalized layer 24 may be any of the gel materials described herein and may be applied using any suitable method. A curing process may be performed after deposition.

Removal of the insoluble negative photoresist 60' may then be performed to expose the functionalized layer 24 in the depression subset 20A. While the insoluble negative photoresist 60' is not soluble in the developer, it is soluble (at least 99% soluble) in a remover. Suitable removers include dimethylsulfoxide (DMSO) using sonication, or in acetone, or with an NMP (N-methyl-2-pyrrolidone) based stripper.

After the insoluble negative photoresist 60' is removed, a second negative photoresist 60-2 is deposited on the functionalized layers 24, 26, as shown in FIG. 17F. Any example of the negative photoresist 60 may be used for the second negative photoresist 60-2, and any of the deposition techniques described herein may be used to deposit the second negative photoresist 60-2.

As shown in FIG. 17G, the second ultraviolet light dosage is directed through the resin layer 14', 18'. The second predetermined ultraviolet light dosage is higher than the predetermined ultraviolet light dosage, and is selected so that the thickest portions 86 of the resin layer 14', 18' (having thickness $t_C$) block at least 75% of light that is transmitted through the resin layer 14', 18' from reaching the second negative photoresist 60-2 that is positioned over these portions 86, $t_C$. As such, these portions become soluble. The soluble portions are removed, e.g., with the developer, to reveal the functionalized layer 26 in the depression subsets 20C and at the interstitial regions 22. In contrast, the UV light is able to transmit through the thinner resin portions 82, 84 (having thickness $t_C$ or thickness $t_B$), and thus portions of the second negative photoresist 60-2 overlying the depression subsets 20A, 20B become the insoluble negative photoresist 60'.

The second functionalized layer 26 is then removed, e.g., via ashing using a suitable plasma. As shown in FIG. 17I (e.g., if negative photoresist 60-3 were not present), this process exposes the depression subset 20C with the third greatest depth $D_C$ and the interstitial regions 22.

The processes described in FIG. 17F through FIG. 17H are repeated using a third functionalized layer 88 (see FIG. 17H) and a third negative photoresist 60-3 (see FIG. 17I). The method includes depositing a third functionalized layer 88 over the second insoluble negative photoresist 60'-2, the interstitial regions 22, and each other depression subset 20C having depth $D_C$ smaller than the second greatest depth $D_B$ (FIG. 17H); removing the second insoluble negative photoresist 60'-2, thereby exposing the functionalized layer 24 in the first depression subset 20A and the second functionalized layer 26 in the second depression subset 20B; depositing a third negative photoresist 60-3 over the functionalized layer 24 in the first depression subset 20A, over the second functionalized layer 26 in the second depression subset 20B, over the third functionalized layer 88 in the third depression subset 20C, over each other depression subset if n>3, and over the interstitial regions 22 (FIG. 17I); directing, through the resin layer 14', 16', a third ultraviolet light dosage that is higher than the second ultraviolet light dosage, whereby the third negative photoresist 60-3 overlying the functionalized layer 24 in the first depression subset 20A, overlying the functionalized layer 26 in the second depression subset 20B, and overlying the functionalized layer 88 in the third depression subset 20C having a third greatest depth $D_C$ defines a third insoluble negative photoresist (not shown), and the third negative photoresist 60-3 overlying the interstitial regions 22 and, if n>3, overlying each other depression subset having a depth smaller than the third greatest depth $D_C$ becomes soluble; and removing the third functionalized layer 88 from the interstitial regions 22 and, if n>3, from each other depression subset having depth smaller than the third greatest depth $D_C$ while the third insoluble negative photoresist is present in the first, second, and third depression subsets 20A, 20B, 20C. Each of the processes described in this paragraph may be performed as described herein. These processes result in the structure shown in FIG. 17J. These processes can also be repeated for the n number of depression subsets 20A, 20B, 20C, etc.

While not shown, the method shown in FIG. 17A through FIG. 17J also includes attaching respective primer sets to the functionalized layers 24, 26, 88. Different primer sets (e.g., P5 and P7, PA and PB, and PC and PD) may be used on the different functionalized layers 24, 26, 88. In some examples, the respective primer sets may be pre-grafted to the functionalized layers 24, 26, 88. In other examples, the respective primer sets may be grafted to the functionalized layers 24, 26, 88 after being deposited and before the insoluble negative photoresist 60', 60'-2, etc. are generated. When grafting is performed during the method, grafting may be accomplished using any of the grafting techniques described herein.

While a single set of the functionalized layers 24, 26, 88 is shown in FIG. 17J, it is to be understood that the method described in reference to FIG. 17A through FIG. 17J may be performed to generate an array of depression subsets 20A, 20B, 20C (having functionalized layers 24, 26, 88 respectively therein) separated by interstitial regions 22 across the surface of the support 14' or resin layer 18' of the multi-layer structure 16'.

To further illustrate the present disclosure, examples are given herein. It is to be understood that these examples are provided for illustrative purposes and are not to be construed as limiting the scope of the present disclosure.

NON-LIMITING WORKING EXAMPLES

Example 1

Figure 18A:
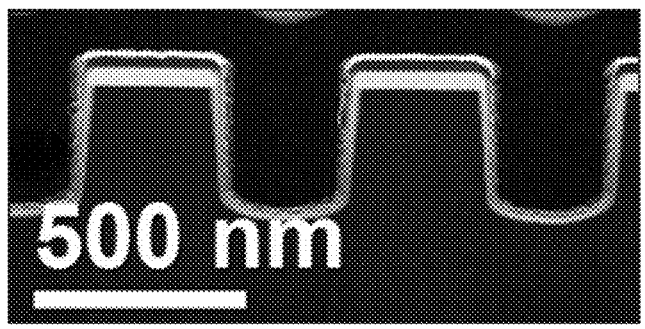
FIG. 18A and FIG. 18B are, respectively, a scanning electron micrograph (SEM) image and a confocal microscope image (reproduced in black and white) of an aluminum film sputtered on a flow cell.
Figure 18B:
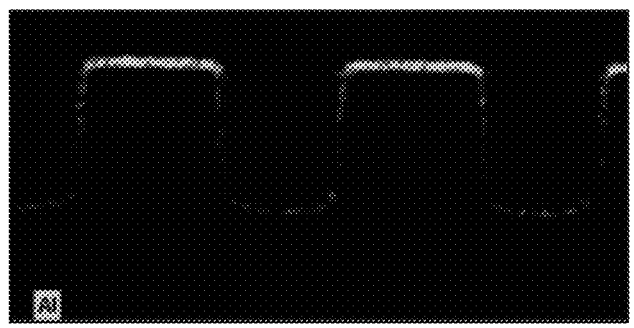

A flow cell including a fused silica and glass substrate and a patterned resin layer was sputter coated (60° angle) at room temperature with aluminum. The flow cell was rotated during sputtering. A SEM image (50,000× magnification) of a few of the depressions is shown in FIG. 18A, and a confocal microscope image (reproduced in black and white) of the same depressions is shown in FIG. 18B. As illustrated in these figures, the portion of the aluminum film formed on the interstitial regions is thicker than the portion of the aluminum film formed on the bottom surface of the depressions.

Figure 19A:
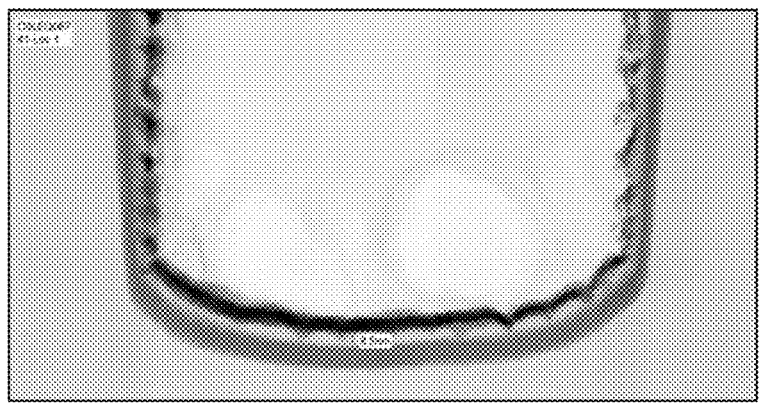
FIG. 19A and FIG. 19B are enlarged portions of the scanning electron micrograph of FIG. 18A, illustrating the bottom of a depression and a portion of interstitial region.
Figure 19B:
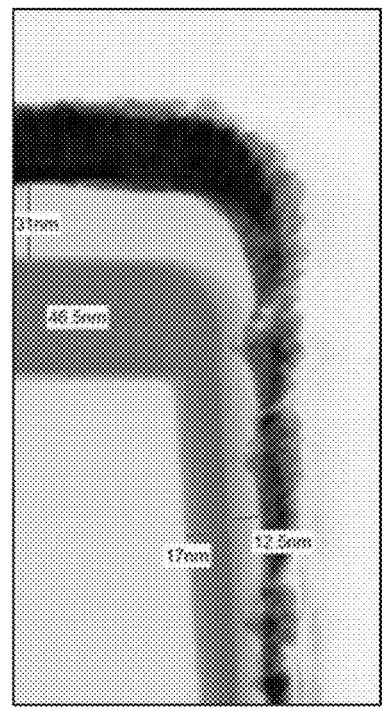

SEM images of the bottom of one depression and the interstitial region adjacent that depression were taken at a higher magnification (200,000×). These images are shown in FIG. 19A (depression) and FIG. 19B (interstitial region). The thickness of the aluminum film in the depression was measured to be about 8.5 nm and the thickness of the aluminum film on the interstitial region was measured to be about 31 nm. These results illustrate the ability to create a metal film of varying thickness using sputtering.

Example 2

A workflow similar to that shown in FIG. 4A through FIG. 4G was performed, except that a protective layer was not included.

Aluminum was sputtered onto a flow cell surface as described in Example 1. PAZAM was deposited on the metal film so that it coated both the interstitial regions and the depressions.

Figure 20:
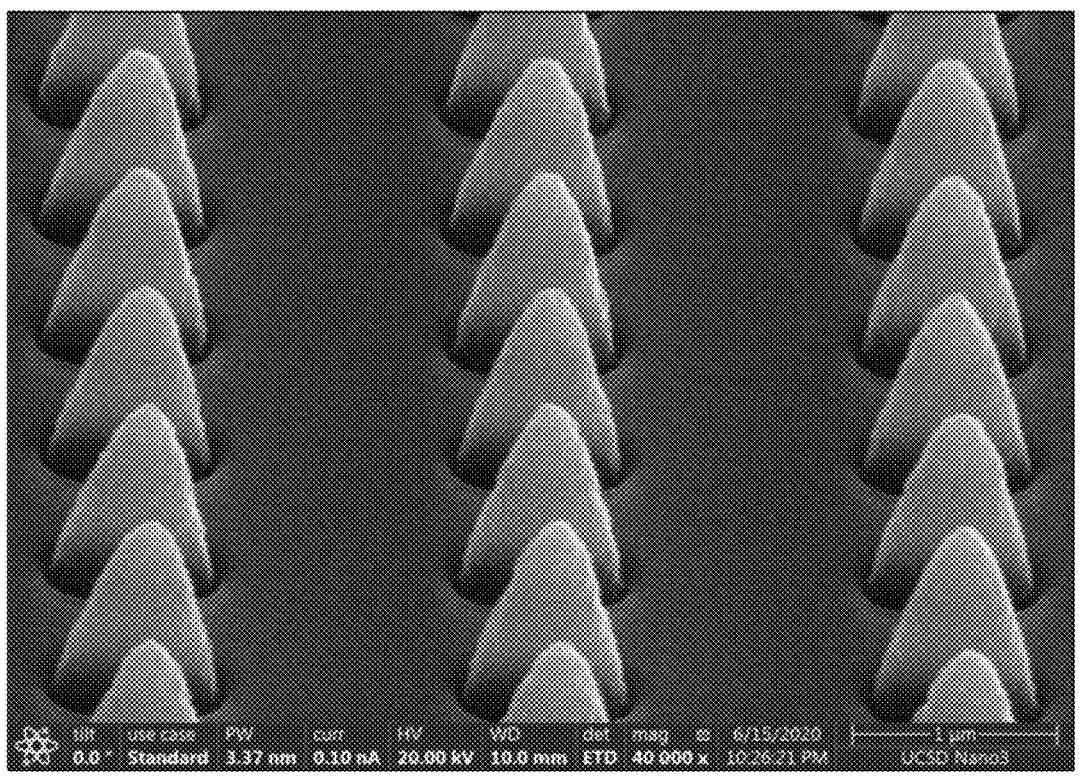
FIG. 20 is a SEM image of a top view of flow cell surface similar to that shown in FIG. 4E, where a metal film has been used to generate an insoluble negative photoresist in the depressions and not on interstitial regions.

A negative photoresist (NR9-1500PY from Futurrex) was deposited on the PAZAM layer. Ultraviolet light (365 nm) was directed through the flow cell substrate, and then soluble portions of the negative photoresist were removed in a developer (RD6 (a tetramethylammonium hydroxide (TMAH) based developer) from Futurrex). A SEM image of the surface of the flow cell was then taken, and is shown in FIG. 20. As depicted, the negative photoresist was rendered insoluble in each of the depressions, thus illustrating that the UV light was transmitted through the thinner portion of the aluminum film. The negative photoresist became soluble over the interstitial regions, thus illustrating that the UV light was blocked at the thicker portion of the aluminum film.

Figure 21:
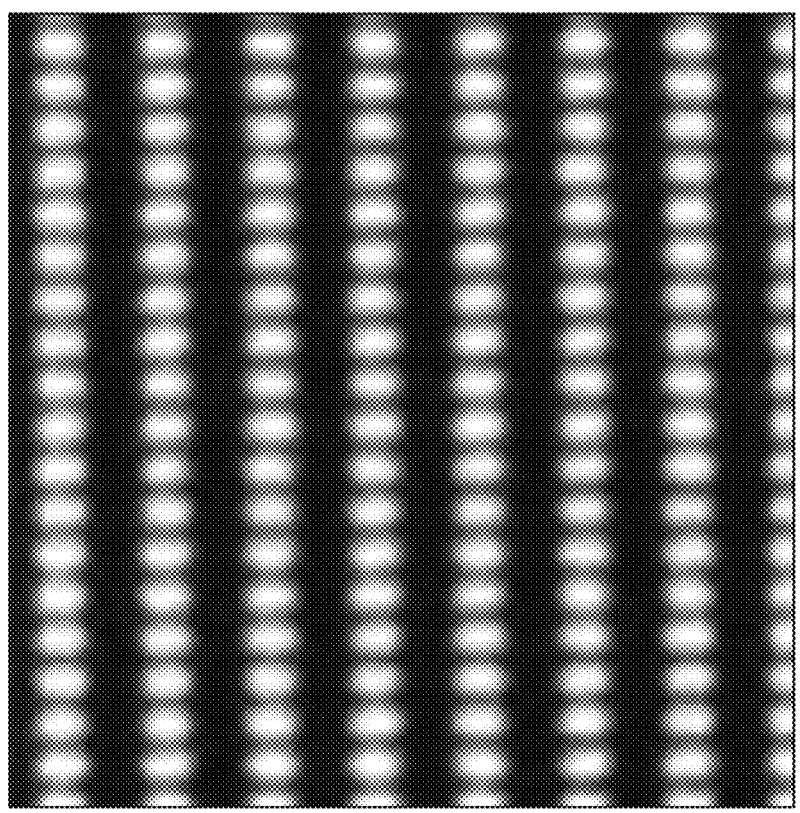
FIG. 21 is a confocal microscope image of a flow cell surface similar to that shown in FIG. 4G, where a metal film has been used to generate a functionalized layer in the depressions and not on interstitial regions.

The PAZAM layer was then plasma etched (150 W $O_2$ plasma for about 2 minutes) from the interstitial regions, and then the insoluble negative photoresist was lifted off using acetone followed by isopropyl alcohol sonication. A confocal microscope image of the surface of the flow cell was then taken, and is shown in FIG. 21. As depicted, the PAZAM layer was present in the depressions, but not on the interstitial regions.

These results illustrate the ability of the metal film with varying thicknesses to be used as a mask for patterning the functionalized layer (e.g., PAZAM) on a flow cell surface.

Example 3

Three flow cells were used in this example, each including a glass substrate and a resin layer nanoimprinted with depressions. A workflow similar to that shown in FIG. 12A through FIG. 12F was performed. The thickness of the resin layer at the interstitial regions was about 500 nm and the thickness of the resin layer at the bottom of each depression was about 150 nm.

Figure 22A:
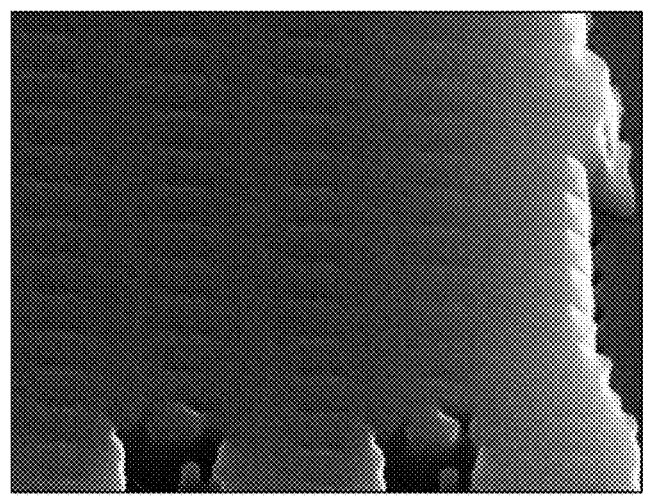
FIG. 22A, FIG. 22B, and FIG. 22C are top view SEM images of flow cells including resin layers with a thickness of 500 nm at the interstitial regions and 150 nm at the depressions after developing a negative photoresist with 22A) 260 mJ/cm$^2$ backside exposure, 22B) 90 mJ/cm$^2$ backside exposure, and 22C) 30 mJ/cm$^2$ backside exposure.

In a first test, a negative photoresist (NR9-1500PY from Futurrex) was deposited on the resin layer and ultraviolet light (365 nm) was directed through the flow cell substrate at a dosage of 260 mJ/cm$^2$. Any soluble portions of the negative photoresist were removed in a developer (RD6 (a tetramethylammonium hydroxide (TMAH) based developer) from Futurrex). A SEM image of a portion of the top of the flow cell was taken and is shown in FIG. 22A. As shown in FIG. 22A, the insoluble negative photoresist was generated across the flow cell surface. This indicates that the negative photoresist was exposed to the UV light at both the thicker portions and the thinner portions, and thus that the UV dosage was too high for the thicker portions.

Figure 22B:
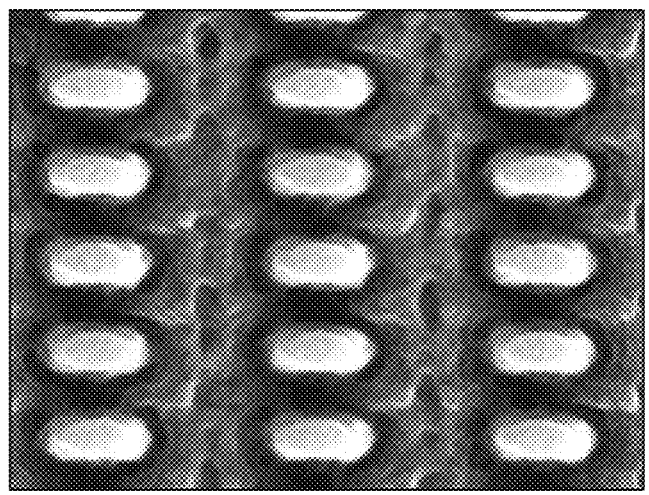

In a second test, the same negative photoresist was deposited on the resin layer and ultraviolet light (365 nm) was directed through the flow cell substrate at a dosage of 90 mJ/cm$^2$. Any soluble portions of the negative photoresist were removed in the same developer. A SEM image of a portion of the top of the flow cell was taken and is shown in FIG. 22B. As shown in FIG. 22B, the insoluble negative photoresist was present in both the depressions and on the interstitial regions, but was thicker in the depressions. This indicates that the negative photoresist in the depressions was exposed to more UV light, indicating that there was greater transmittance at the thinner portions than at the thicker portions. However, the presence of the insoluble negative photoresist on the interstitial regions also indicates that a small amount of UV light was transmitted through the thicker portions of the resin layer to the negative photoresist.

Figure 22C:
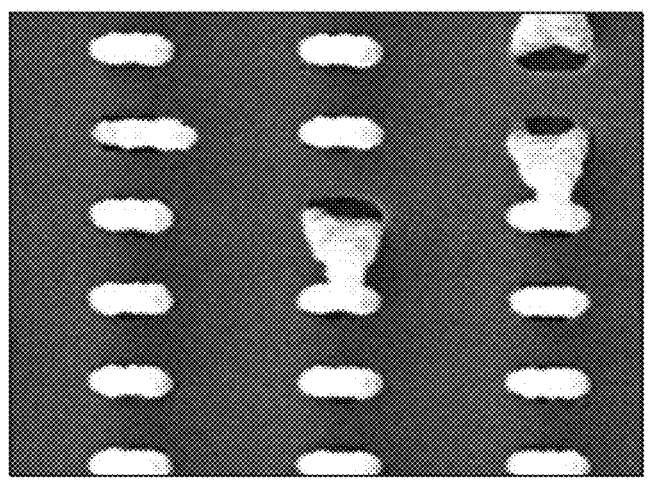

In a third test, the same negative photoresist was deposited on the resin layer and ultraviolet light (365 nm) was directed through the flow cell substrate at a dosage of 30 mJ/cm$^2$. Any soluble portions of the negative photoresist were removed in the same developer. A SEM image of a portion of the top of the flow cell was taken and is shown in FIG. 22C. As shown in FIG. 22C, the insoluble negative photoresist present in the depressions, but not on the interstitial regions. This indicates that the negative photoresist in the depressions was exposed to UV light, while the negative photoresist on the interstitial regions was not exposed to UV light. These results indicate that the thicker portions of the resin layer effectively absorbed the UV light at the lower dosage, but that the thinner portions of the resin layer effectively transmitted the UV light.

Additional Notes

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

While several examples have been described in detail, it is to be understood that the disclosed examples may be modified. Therefore, the foregoing description is to be considered non-limiting.

What is claimed is:

1. A method, comprising:
sputtering or thermally evaporating a metal material over a transparent substrate including depressions separated by interstitial regions, thereby forming a metal film having a first thickness over the interstitial regions and having a second thickness over the depressions, the second thickness being about 30 nm or less and being at least 10 nm thinner than the first thickness;
depositing a light sensitive material over the metal film;
utilizing the metal film to pattern the light sensitive material through the transparent substrate to define an altered light sensitive material at a first predetermined region over the transparent substrate; and
utilizing the altered light sensitive material to generate a functionalized layer at the first predetermined region or at a second predetermined region over the transparent substrate.

2. The method as defined in claim 1, wherein:
the light sensitive material is a positive photoresist;
the positive photoresist is deposited in direct contact with the metal film;
utilizing the metal film to pattern the light sensitive material involves exposing the positive photoresist to light through the transparent substrate, whereby portions of the positive photoresist overlying the depressions become soluble, and portions of the positive photoresist overlying the interstitial regions define an insoluble positive photoresist;
the insoluble positive photoresist is the altered light sensitive material;
the interstitial regions are the first predetermined region; and
the depressions are the second predetermined region.

3. The method as defined in claim 2, wherein utilizing the altered light sensitive material to generate the functionalized layer at the second predetermined region involves:
etching the metal film from the depressions;
depositing the functionalized layer over the insoluble positive photoresist and the depressions; and
removing the insoluble positive photoresist and the metal film.

4. The method as defined in claim 1, wherein prior to depositing the light sensitive material over the metal film, the method further comprises:
depositing a protective layer in direct contact with the metal film; and
depositing a gel material in direct contact with the protective layer.

5. The method as defined in claim 4, wherein:
the light sensitive material is a negative photoresist;
the negative photoresist is deposited in direct contact with the gel material;
utilizing the metal film to pattern the light sensitive material involves exposing the negative photoresist to light through the transparent substrate, whereby portions of the negative photoresist overlying the depressions define an insoluble negative photoresist, and portions of the negative photoresist overlying the interstitial regions become soluble;
the insoluble negative photoresist is the altered light sensitive material; and
the depressions are the first predetermined region.

6. The method as defined in claim 5, wherein utilizing the altered light sensitive material to generate the functionalized layer at the first predetermined region involves:
dry etching the gel material, the protective layer, and the metal film from the interstitial regions, whereby the gel material remaining in the depressions is the functionalized layer; and
removing the insoluble negative photoresist.

7. The method as defined in claim 4, wherein the protective layer is an inorganic material including surface groups to attach to the gel material.

8. The method as defined in claim 4, further comprising activating the protective layer by silanization or plasma ashing, thus introducing surface groups to attach to the gel material.

9. The method as defined in claim 1, wherein prior to depositing the light sensitive material over the metal film, the method further comprises depositing a transparent resin in direct contact with the metal film.

10. The method as defined in claim 9, wherein:
the light sensitive material is a positive photoresist;
the positive photoresist is deposited in direct contact with the transparent resin; and
utilizing the metal film to pattern the light sensitive material involves exposing the positive photoresist to light through the transparent substrate, whereby portions of the positive photoresist overlying the depressions becomes soluble, and portions of the positive photoresist overlying the interstitial regions define an insoluble positive photoresist;
the insoluble positive photoresist is the altered light sensitive material;
portions of the transparent resin overlying the interstitial regions are the first predetermined region; and
portions of the transparent resin overlying the depressions are the second predetermined region.

11. The method as defined in claim 10, wherein utilizing the altered light sensitive material to generate the functionalized layer at the second predetermined region involves:
depositing the functionalized layer over the insoluble positive photoresist and the second predetermined region; and
removing the insoluble positive photoresist.

12. The method as defined in claim 1, wherein prior to depositing the light sensitive material over the metal film, the method further comprises depositing a protective layer in direct contact with the metal film.

13. The method as defined in claim 12, wherein:
the light sensitive material is a light curable resin;
the light curable resin is deposited in direct contact with the protective layer;
utilizing the metal film to pattern the light sensitive material involves exposing the light curable resin to light through the transparent substrate, whereby portions of the light curable resin overlying the depressions are cured, and portions of the light curable resin overlying the interstitial regions remain uncured; and
the method further comprises removing the uncured portions of the light curable resin, thereby exposing the protective layer at the interstitial regions.

14. The method as defined in claim 13, wherein utilizing the altered light sensitive material to generate the functionalized layer at the first predetermined region involves depositing the functionalized layer, whereby the functionalized layer attaches to the cured portions of the light curable resin and does not attach to the protective layer at the interstitial regions.

15. The method as defined in claim 1, wherein:
each of the depressions is a multi-depth depression including a deep portion and a shallow portion adjacent to the deep portion;
the metal film is generated over the deep portion of each multi-depth depression and the shallow portion of each multi-depth depression;
the metal film over the deep portion of each multi-depth depression has the second thickness; and
the metal film over the shallow portion of each multi-depth depression has a third thickness that is less than the first thickness and greater than the second thickness.

16. The method as defined in claim 15, wherein:
the light sensitive material is a positive photoresist;
the positive photoresist is deposited in direct contact with the metal film;
utilizing the metal film to pattern the light sensitive material involves exposing the positive photoresist to light through the transparent substrate, whereby portions of the positive photoresist overlying the deep portion of each multi-depth depression become soluble, and portions of the positive photoresist overlying the shallow of each multi-depth depression and overlying the interstitial regions define an insoluble positive photoresist;
the insoluble positive photoresist is the altered light sensitive material;
the shallow portion of each multi-depth depression and the interstitial regions are the first predetermined region; and
the deep portion of each multi-depth depression is the second predetermined region.

17. The method as defined in claim 16, wherein utilizing the altered light sensitive material to generate the functionalized layer at the first predetermined region involves:
etching the metal film from the deep portion of each multi-depth depression; and
depositing the functionalized layer over the insoluble positive photoresist and the deep portion of each multi-depth depression.

18. The method as defined in claim 17, further comprising:
removing the insoluble positive photoresist, thereby exposing the metal film over the shallow portion of each multi-depth depression and over the interstitial regions;
patterning a negative photoresist to form an insoluble negative photoresist over the deep portion of each multi-depth depression;
wet etching the metal film from the shallow portion of each multi-depth depression and from the interstitial regions;
depositing a second functionalized layer over the insoluble negative photoresist, the shallow portion of each multi-depth depression, and the interstitial regions;
removing the insoluble negative photoresist, thereby exposing the functionalized layer; and
removing the second functionalized layer from the interstitial regions.

19. The method as defined in claim 17, further comprising:
removing the insoluble positive photoresist, thereby exposing the metal film over the shallow portion of each multi-depth depression and over the interstitial regions;
wet etching the metal film from the shallow portion of each multi-depth depression and from the interstitial regions;
depositing a second functionalized layer over the shallow portion of each multi-depth depression and over the interstitial regions; and
polishing the second functionalized layer from the interstitial regions.

20. The method as defined in claim 15, wherein:
the light sensitive material is a negative photoresist;
the negative photoresist is deposited in direct contact with the metal film;
utilizing the metal film to pattern the light sensitive material involves exposing the negative photoresist to light through the transparent substrate, whereby portions of the negative photoresist overlying the deep portion of each multi-depth depression define an insoluble negative photoresist, and portions of the negative photoresist overlying the shallow portion of each multi-depth depression and overlying the interstitial regions become soluble;
the insoluble negative photoresist is the altered light sensitive material;
the deep portion of each multi-depth depression is the first predetermined region; and
the shallow portion of each multi-depth depression is the second predetermined region.

* * * * *

SEQUENCE LISTING

<160> NUMBER OF SEQ ID NOS: 14

<210> SEQ ID NO 1
<211> LENGTH: 29
<212> TYPE: DNA
<213> ORGANISM: Artificial Sequence
<220> FEATURE:
<223> OTHER INFORMATION: Synthesized

<400> SEQUENCE: 1
aatgatacgg cgaccaccga gauctacac                              29

<210> SEQ ID NO 2
<211> LENGTH: 24
<212> TYPE: DNA
<213> ORGANISM: Artificial Sequence
<220> FEATURE:
<223> OTHER INFORMATION: Synthesized
<220> FEATURE:
<221> NAME/KEY: misc_feature
<222> LOCATION: (22)..(22)
<223> OTHER INFORMATION: 8-oxoguanine or uracil

<400> SEQUENCE: 2
caagcagaag acggcatacg anat                                   24

<210> SEQ ID NO 3
<211> LENGTH: 24
<212> TYPE: DNA
<213> ORGANISM: Artificial Sequence
<220> FEATURE:
<223> OTHER INFORMATION: Synthesized
<220> FEATURE:
<221> NAME/KEY: misc_feature
<222> LOCATION: (20)..(20)
<223> OTHER INFORMATION: 8-oxoguanine or uracil

<400> SEQUENCE: 3
caagcagaag acggcatacn agat                                   24

<210> SEQ ID NO 4
<211> LENGTH: 29
<212> TYPE: DNA
<213> ORGANISM: Artificial Sequence
<220> FEATURE:
<223> OTHER INFORMATION: Synthesized
<220> FEATURE:
<221> NAME/KEY: misc_feature
<222> LOCATION: (23)..(23)
<223> OTHER INFORMATION: allyl-T

<400> SEQUENCE: 4
aatgatacgg cgaccaccga ganctacac                              29

<210> SEQ ID NO 5
<211> LENGTH: 35
<212> TYPE: DNA
<213> ORGANISM: Artificial Sequence
<220> FEATURE:
<223> OTHER INFORMATION: Synthesized

<400> SEQUENCE: 5
gctggcacgt ccgaacgctt cgttaatccg ttgag                       35

<210> SEQ ID NO 6
<211> LENGTH: 35
<212> TYPE: DNA
<213> ORGANISM: Artificial Sequence
<220> FEATURE:
<223> OTHER INFORMATION: Synthesized

<400> SEQUENCE: 6
ctcaacggat taacgaagcg ttcggacgtg ccagc                       35

<210> SEQ ID NO 7

-continued

<211> LENGTH: 35
<212> TYPE: DNA
<213> ORGANISM: Artificial Sequence
<220> FEATURE:
<223> OTHER INFORMATION: Synthesized

<400> SEQUENCE: 7
cgtcgtctgc catggcgctt cggtggatat gaact                              35

<210> SEQ ID NO 8
<211> LENGTH: 35
<212> TYPE: DNA
<213> ORGANISM: Artificial Sequence
<220> FEATURE:
<223> OTHER INFORMATION: Synthesized

<400> SEQUENCE: 8
agttcatatc caccgaagcg ccatggcaga cgacg                              35

<210> SEQ ID NO 9
<211> LENGTH: 35
<212> TYPE: DNA
<213> ORGANISM: Artificial Sequence
<220> FEATURE:
<223> OTHER INFORMATION: Synthesized

<400> SEQUENCE: 9
acggccgcta atatcaacgc gtcgaatccg caact                              35

<210> SEQ ID NO 10
<211> LENGTH: 35
<212> TYPE: DNA
<213> ORGANISM: Artificial Sequence
<220> FEATURE:
<223> OTHER INFORMATION: Synthesized

<400> SEQUENCE: 10
agttgcggat tcgacgcgtt gatattagcg gccgt                              35

<210> SEQ ID NO 11
<211> LENGTH: 34
<212> TYPE: DNA
<213> ORGANISM: Artificial Sequence
<220> FEATURE:
<223> OTHER INFORMATION: Synthesized

<400> SEQUENCE: 11
gccgcgttac gttagccgga ctattcgatg cagc                               34

<210> SEQ ID NO 12
<211> LENGTH: 34
<212> TYPE: DNA
<213> ORGANISM: Artificial Sequence
<220> FEATURE:
<223> OTHER INFORMATION: Synthesized

<400> SEQUENCE: 12
gctgcatcga atagtccggc taacgtaacg cggc                               34

<210> SEQ ID NO 13
<211> LENGTH: 24
<212> TYPE: DNA
<213> ORGANISM: Artificial Sequence
<220> FEATURE:
<223> OTHER INFORMATION: Synthesized

<400> SEQUENCE: 13

```
aggaggagga ggaggaggag gagg                                              24

<210> SEQ ID NO 14
<211> LENGTH: 24
<212> TYPE: DNA
<213> ORGANISM: Artificial Sequence
<220> FEATURE:
<223> OTHER INFORMATION: Synthesized

<400> SEQUENCE: 14
cctcctcctc ctcctcctcc tcct                                              24
```